(12) United States Patent
Inabe et al.

(10) Patent No.: US 9,023,576 B2
(45) Date of Patent: May 5, 2015

(54) POSITIVE RESIST COMPOSITION FOR IMMERSION EXPOSURE AND PATTERN-FORMING METHOD USING THE SAME

(75) Inventors: Haruki Inabe, Shizuoka (JP); Shinichi Kanna, Shizuoka (JP); Hiromi Kanda, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 12/917,953

(22) Filed: Nov. 2, 2010

(65) Prior Publication Data

US 2011/0076622 A1 Mar. 31, 2011

Related U.S. Application Data

(63) Continuation of application No. 11/077,012, filed on Mar. 11, 2005, now Pat. No. 7,906,268.

(30) Foreign Application Priority Data

Mar. 18, 2004 (JP) .................................. 2004-078857
Aug. 12, 2004 (JP) .................................. 2004-235259

(51) Int. Cl.
*G03F 7/039* (2006.01)
*G03F 7/004* (2006.01)
*G03F 7/20* (2006.01)
*G03F 7/30* (2006.01)

(52) U.S. Cl.
CPC ............ *G03F 7/0046* (2013.01); *G03F 7/0045* (2013.01); *G03F 7/0048* (2013.01); *G03F 7/30* (2013.01); *G03F 7/0392* (2013.01); *G03F 7/0395* (2013.01); *G03F 7/0397* (2013.01); *G03F 7/2041* (2013.01); *Y10S 430/108* (2013.01)

(58) Field of Classification Search
None
See application file for complete search history.

(56) References Cited

U.S. PATENT DOCUMENTS

| | | | |
|---|---|---|---|
| 7,157,206 B2 | 1/2007 | Inabe et al. | |
| 2003/0044717 A1 | 3/2003 | Kodama | |
| 2003/0082479 A1* | 5/2003 | Hatakeyama et al. | 430/270.1 |
| 2003/0104312 A1 | 6/2003 | Miya et al. | |
| 2003/0203309 A1 | 10/2003 | Nishimura et al. | |
| 2003/0224283 A1 | 12/2003 | Allen et al. | |
| 2004/0005512 A1 | 1/2004 | Mizutani et al. | |
| 2004/0029037 A1 | 2/2004 | Kamabuchi et al. | |
| 2004/0063024 A1 | 4/2004 | Khojasteh et al. | |
| 2004/0152009 A1 | 8/2004 | Yamaguchi et al. | |
| 2004/0185373 A1* | 9/2004 | Kodama | 430/270.1 |
| 2005/0019690 A1 | 1/2005 | Kodama | |
| 2005/0026073 A1* | 2/2005 | Sasaki | 430/270.1 |
| 2005/0026074 A1 | 2/2005 | Inabe et al. | |
| 2005/0058935 A1 | 3/2005 | Kishimura et al. | |
| 2005/0074693 A1 | 4/2005 | Kishimura et al. | |
| 2005/0079440 A1 | 4/2005 | Hatakeyama et al. | |
| 2005/0079446 A1 | 4/2005 | Hatakeyama et al. | |
| 2005/0123852 A1 | 6/2005 | Allen et al. | |
| 2005/0147920 A1 | 7/2005 | Lin et al. | |
| 2005/0221221 A1* | 10/2005 | Hatakeyama et al. | 430/270.1 |
| 2006/0141400 A1 | 6/2006 | Hirayama et al. | |
| 2007/0166639 A1 | 7/2007 | Araki et al. | |
| 2008/0003517 A1 | 1/2008 | Komoriya et al. | |

FOREIGN PATENT DOCUMENTS

| | | |
|---|---|---|
| EP | 1 319 981 A2 | 6/2003 |
| EP | 1 341 038 A2 | 9/2003 |
| EP | 1 347 335 A1 | 9/2003 |
| EP | 1 367 440 A2 | 12/2003 |
| EP | 1 505 439 A2 | 2/2005 |
| EP | 1 515 186 A2 | 3/2005 |
| EP | 1 517 181 A1 | 3/2005 |
| JP | 57-153433 A | 9/1982 |
| JP | 7-220990 A | 8/1995 |
| JP | 10-303114 A | 11/1998 |
| JP | 2002-220416 | 8/2002 |
| JP | 2003-252928 A | 9/2003 |
| JP | 2003-255544 A | 9/2003 |
| JP | 2003-262952 A | 9/2003 |
| JP | 2003-280204 A | 10/2003 |
| JP | 2003-316005 A | 11/2003 |
| JP | 2004-046098 A | 2/2004 |
| JP | 2005-008754 A | 1/2005 |
| JP | 2005-023234 A | 1/2005 |
| JP | 2005-097595 A | 4/2005 |
| JP | 2005-126693 A | 5/2005 |
| JP | 2005-133065 A | 5/2005 |
| JP | 2005-133066 A | 5/2005 |
| JP | 2005-133067 A | 5/2005 |
| JP | 2005-232095 A | 9/2005 |
| JP | 2005-250511 A | 9/2005 |
| JP | 2006-133716 A | 5/2006 |

OTHER PUBLICATIONS

Machine assisted English translation of JP2002-220416 (Hatakeyama et al), as provided by JPO (2002).*
European Search Report for EP 05 00 5530 dated Dec. 12, 2007.
Hoffnagle et al, "Liquid immersion deep-ultraviolet interferometric lithography", J. Vac. Sci. Technol. B, 17(6):3306-3309 (1999).
Japanese Notification of Reasons for Refusal for JP 2005-045654 dated Sep. 16, 2009.
Kishimura et al., "Resis interaction in 193-/157-nm immersion lithography", Advances in Resist Technology and Processing XXI, 5376:44-45 (2004).

(Continued)

*Primary Examiner* — Sin Lee
(74) *Attorney, Agent, or Firm* — Sughrue Mion, PLLC

(57) ABSTRACT

A positive resist composition for immersion exposure comprises: (A) a resin containing at least one repeating unit having a fluorine atom and increasing a solubility of the resin in an alkali developer by an action of an acid; and (B) a compound capable of generating an acid upon irradiation with one of an actinic ray and radiation.

24 Claims, No Drawings

(56) References Cited

OTHER PUBLICATIONS

Machine-assisted English translation of JP2002-220416 provided by JPO (2002).

Machine-assisted English translation of JP2005-23234 provided by JPO (2005).

Partial European Search Report for EP 05 00 5530 dated Aug. 5, 2005.

Semiconductor Foundry, Lithography, and Partners, B.J. Lin, Micropatterning Division TSMC, Inc., SPIE Proc., 4688, 11:11-24 (2002).

Office Action dated Apr. 13, 2011 in European Application No. 05005530.0.

Office Action dated Jul. 11, 2011 in Taiwanese Patent Application No. 10020599000.

Switkes, M. et al, "Immersion lithography at 157 nm", J. Vac. Sci. Technol. B, vol. 19, No. 6, Nov./Dec. 2001, American Vacuum Society, pp. 2353-2356.

Mulkens, J. et al, "Benefits and Limitations of immersion litography", J. Microlith., Microfab., Microsyst. ("$JM^3$"), vol. 3, No. 1, Jan. 2004, pp. 104-114.

Office Action dated Jun. 20, 2011 in Korean Patent Application No. 10-2005-0020839.

Office Action issued Oct. 30, 2014 by the European Patent Office in counterpart European Application No. 05 005 530.0.

* cited by examiner

POSITIVE RESIST COMPOSITION FOR IMMERSION EXPOSURE AND PATTERN-FORMING METHOD USING THE SAME

CROSS-REFERENCE TO RELATED APPLICATIONS

This application is a Continuation of U.S. application Ser. No. 11/077,012 filed Mar. 11, 2005 (now allowed), which claims priority based on Japanese Patent Application No. P. 2004 078857, filed Mar. 18, 2004, and Japanese Patent Application No. P. 2004 235259, filed Aug. 12, 2004, the contents of all of which are incorporated herein by reference in their entirety.

BACKGROUND OF THE INVENTION

1. Field of the Invention

The present invention relates to a resist composition used in a manufacturing process of semiconductor devices, such as IC, manufacture of circuit substrates for liquid crystals, thermal heads and the like, and lithographic process of other photo-fabrication, and also the invention relates to a pattern-forming process using the resist composition. In particular, the invention relates to a resist composition suitable for exposure with an immersion projection exposure apparatus using far ultraviolet rays of 300 nm or less as the light source, and a pattern-forming process using the resist composition.

2. Description of the Related Art

With the progress of fining of semiconductor elements, shortening of the wavelengths of exposure light source and increasing of the numerical aperture of the projection lens have advanced, and now exposure apparatus of NA 0.84 using an ArF excimer laser having the wavelength of 193 nm as the light source have been developed. As generally known, these can be expressed by the following equations:

(Resolution)=$k_1 \cdot (\lambda/NA)$ (Depth of focus)=$\pm k_2 \cdot \lambda/NA^2$ wherein $\lambda$ is the wavelength of an exposure light source, NA is the numerical aperture of the projection lens, $k_1$ and $k_2$ are the coefficients concerning the process.

For further higher resolution by the shortening of the wavelengths, an exposure apparatus with an $F_2$ excimer laser having the wavelength of 157 nm as the light source has been studied, but the materials of lens for use in the exposure apparatus for shortening of the wavelengths and the materials of resist are extremely restricted, so that the realization of the reasonable manufacturing costs of the apparatus and materials and quality stabilization are very difficult, as a result, there are possibilities of missing an exposure apparatus and a resist having sufficient performances and stabilities within a required period of time.

As a technique for increasing resolution in optical microscope, a so-called immersion method of filling between an objection lens and a sample with a liquid of high refractive index (hereinafter also referred to as "immersion liquid") has been conventionally known.

As "the effect of immersion", the above resolution and depth of focus can be expressed by the following equations in the case of immersion, taking $\lambda_0$ as the wavelength of the exposure light in the air, n as the refractive index of immersion liquid to the air, and $NA_0$=$\sin \theta$ with $\theta$ as convergence half angle of the ray of light:

(Resolution)=$k_1 \cdot (\lambda_0/n)NA)_0$ (Depth of focus)=$\pm k_2 \cdot (\lambda_0/n)NA_0^2$ That is, the effect of immersion is equivalent to the case of using exposure wavelength of the wavelength of 1/n. In other words, in the case of the projection optical system of the same of NA, the depth of focus can be made n magnifications by immersion. This is effective for every pattern form, and can be combined with super resolution techniques such as a phase shift method and a deformation lighting method.

As the apparatus applying this effect to the transfer of micro-fine image pattern of semiconductor element, JP-A-57-153433 and JP-A-7-220990 are known, but resists suitable for immersion exposure techniques are not disclosed in these patents.

It is appointed in JP-A-10-303114 that the control of the refractive index of immersion liquid is important as the variation of the refractive index of immersion liquid causes the deterioration of a projected image due to the wave surface aberration of exposure apparatus, and controlling the temperature coefficient of the refractive index of an immersion liquid to a certain range, and water added with additives for reducing surface tension or increasing the degree of surface activity are disclosed as a preferred immersion liquid. However, the specific additives are not disclosed and resists suitable for the technique of immersion exposure are not also discussed.

The latest technical progress of immersion exposure is reported in *SPIE Proc.*, 4688, 11 (2002), and *J. Vac. Sci. Techol. B*, 17 (1999). When an ArF excimer laser is used as the light source, it is thought that pure water (refractive index at 193 nm: 1.44) is most promising in the light of the safety in handling, the transmittance and the refractive index at 193 nm. When an $F_2$ excimer laser is used as the light source, a solution containing fluorine is discussed from the balance of the transmittance and the refractive index at 157 nm, but a sufficiently satisfactory solution from the viewpoint of environmental safety has not been found yet. From the extent of the effect of immersion and the degree of completion of resist, it is thought that immersion exposure technique will be carried on an ArF exposure apparatus earliest.

From the advent of resist for KrF excimer laser (248 nm) on, an image-forming method called chemical amplification is used as the image-forming method of resist for compensating for the reduction of sensitivity by light absorption. To explain the image-forming method of positive chemical amplification by example, this is an image-forming method of exposing a resist to decompose an acid generator in the exposed area to thereby generate an acid, utilizing the generated acid as the reactive catalyst to change an alkali-insoluble group to an alkali-soluble group by the bake after exposure (PEB: Post Exposure Bake), and removing the exposed area by alkali development.

In immersion exposure, a resist film is exposed through a photomask, with an immersion liquid between the resist film and the optical lens, to transfer the pattern of the photomask to the resist film, but it is anticipated that the chemical reaction (acid catalyst type desorbing protection reaction, development reaction) caused inside the resist during or after exposure might be influenced by the immersion of the immersion liquid to the inner part of the resist film. However, the extent of the influence and the mechanism are not known yet.

When chemical amplification resist is applied to immersion exposure technique, the acid on the surface of the resist generated at exposure time migrates to the immersion liquid, and the acid concentration of the surface of the exposed area changes. This is supposed very similar to acid deactivation of the exposed area caused by basic contamination of a trace amount of several ppb level from the environment at the time of post exposure time delay (PED:Post Exposure time Delay)

between exposure and PEB, which became an issue at the beginning of the development of a chemical amplification positive resist, but the influence of immersion exposure on a resist and its mechanism are still unclear. When a chemical amplification resist that causes no lithographic problem in general dry exposure is subjected to immersion exposure, the deterioration in sensitivity is seen as compared with the time of general dry exposure and the improvement is required. Further, if a large amount of acid is eluted from the resist surface to the immersion liquid at the time of immersion exposure, the pollution of the object lens of an exposure apparatus is anticipated, therefore it is required to reduce the elution of generated acid to the least.

SUMMARY OF THE INVENTION

In view of the problems of conventional immersion exposure techniques as described above, an object of the invention is to provide a resist suitable for immersion exposure that is less in the deterioration in sensitivity as compared with dry exposure, and extremely low in elution of an acid to an immersion liquid.

The above object of the invention has been achieved by the positive resist composition for immersion exposure having the following constitution.

(1) A positive resist composition for immersion exposure comprising:
(A) a resin containing at least a repeating unit having a fluorine atom and increasing a solubility of the resin in an alkali developer by an action of an acid; and
(B) a compound capable of generating an acid upon irradiation with one of an actinic ray and radiation.

(2) The positive resist composition for immersion exposure as described in the above item (1), wherein a fluorine atom number contained in the repeating unit having a fluorine atom is 6 or more per one repeating unit.

(3) The positive resist composition for immersion exposure as described in the above item (1) or (2), wherein the repeating unit having a fluorine atom contained in resin (A) is at least one repeating unit selected from the group consisting of formulae (I), (II) and (III):

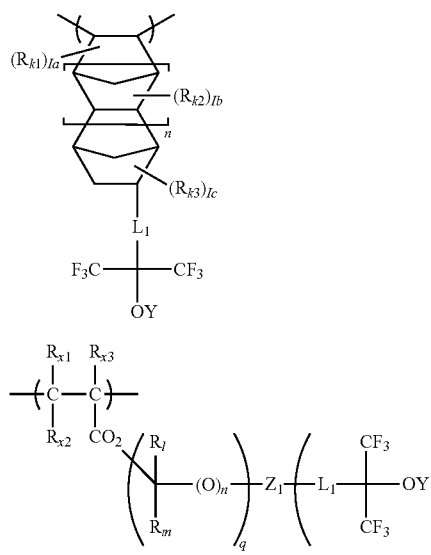

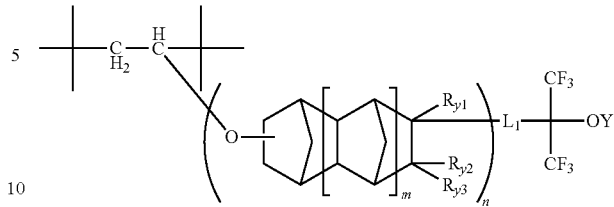

in formula (I), $R_{k1}$, $R_{k2}$ and $R_{k3}$ each independently represents a halogen atom, an alkyl group or an alkoxyl group; 1a represents an integer of from 0 to 2, 1b represents an integer of from 0 to 6, and 1c represents an integer of from 0 to 7; $L_1$ represents a single bond or a divalent linking group; n represents 0 or 1; and Y represents a hydrogen atom or an organic group; in formula (II), $R_{x1}$, $R_{x2}$ and $R_{x3}$ each independently represents a hydrogen atom, a fluorine atom, a chlorine atom, a cyano group, an alkyl group, or $-L_3-C(R_{f1})(R_{f2})Ra$; $R_{f1}$ and $R_{f2}$ each independently represents a hydrogen atom, a fluorine atom or an alkyl group, provided that at least one of $R_{f1}$ and $R_{f2}$ represents a fluorine atom or a fluoroalkyl group; Ra represents a hydrogen atom or a hydroxyl group; $L_3$ represents a single bond, an alkylene group, $-CH_2-O-$, or $-CH_2-COO-$; $R_l$ and $R_m$ each independently represents a hydrogen atom or an alkyl group; $Z_1$ represents a single bond, an alkylene group, a cycloalkylene group, or an arylene group; $L_1$ represents a single bond or a divalent linking group; n and q each independently represents 0 or 1; r represents an integer of from 1 to 6; and Y represents a hydrogen atom or an organic group;
in formula (III), $R_{y1}$, $R_{y2}$ and $R_{y3}$ each independently represents a hydrogen atom, a halogen atom, a hydroxyl group, a cyano group, an alkyl group, an aryl group, an alkoxyl group or an aralkyl group; $L_1$ represents a single bond or a divalent alkylene group; Y represents a hydrogen atom or an organic group; and m and n each independently represents 0 or 1.

(4) The positive resist composition for immersion exposure as described in the above item (1), (2) or (3), wherein the repeating unit having a fluorine atom contained in resin (A) is at least one repeating unit selected from the group consisting of formulae (IV), (V), (VI), (VII), (VIII) and (IX):

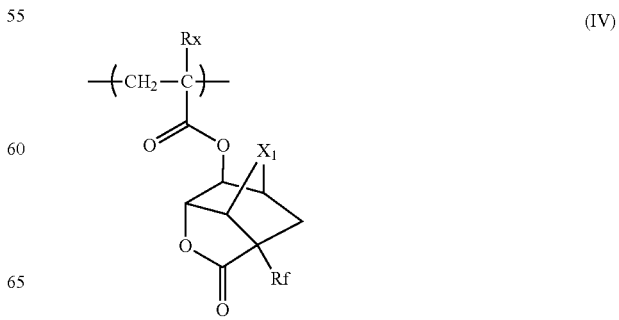

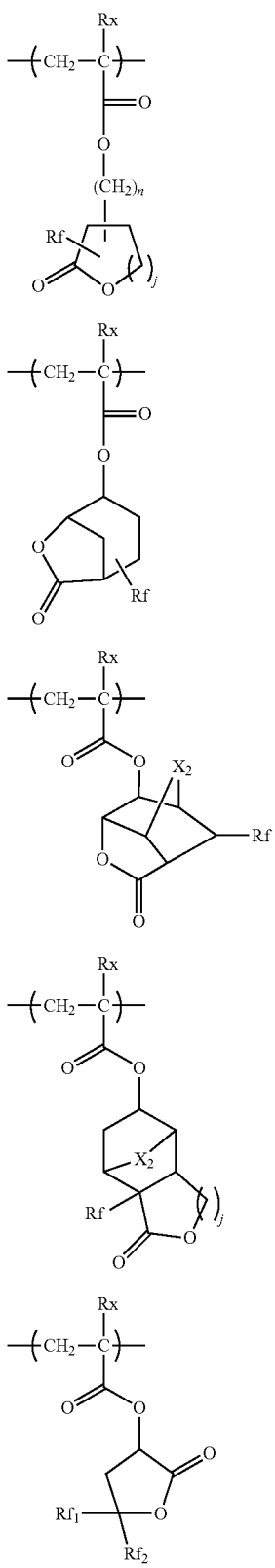

wherein $X_1$ represents an oxygen atom or a sulfur atom; $X_2$ represents a methylene group, an oxygen atom or a sulfur atom; Rx represents a hydrogen atom, a fluorine atom, a chlorine atom, a cyano group, an alkyl group, or $-L_3-CRa$; $L_3$ represents an alkylene group, $-CH_2O-$ or $-CH_2O(C=O)-$; Ra represents a hydroxyl group, a lactone group or a fluoroalkyl group; Rf, $Rf_1$ and $Rf_2$ each independently represents a group having at least one or more fluorine atoms, and $Rf_1$ and $Rf_2$ may be linked to each other to form a ring having $-(CF_2)n_1-$; $n_1$ represents an integer of 1 or higher; and j represents an integer of from 1 to 3.

(5) The positive resist composition for immersion exposure as described in any of the above items (1) to (4), wherein the repeating unit having a fluorine atom is contained in the resin (A) in an amount of 10 mol % to 30 mol %.

(6) A pattern-forming method comprising: forming a resist film with a resist composition as claimed in any of the above items (1) to (5); exposing the resist film by immersion exposure, so as to form an exposed resist film; and developing the exposed resist film.

DETAILED DESCRIPTION OF THE INVENTION

The compounds for use in the invention are described in detail below.

In the description of a group (an atomic group) in the specification of the invention, the description not referring to substitution or unsubstitution includes both a group not having a substituent and a group having a substituent. For example, "an alkyl group" includes not only an alkyl group having no substituent (an unsubstituted alkyl group) but also an alkyl group having a substituent (a substituted alkyl group). Further, $-C(R_1R_2R_3)$ or $-CR_1R_2R_3$ means a group in which groups represented by $R_1$, $R_2$ and $R_3$ respectively are bonded to the carbon atoms by a single bond.

(A) Resin having a Fluorine Atom and Increasing the Solubility in an Alkali Developer by the Action of an Acid:

A resist composition in the invention contains a resin containing at least one repeating unit having a fluorine atom and capable of increasing the solubility in an alkali developer by the action of an acid (hereinafter referred to as also a fluorine-containing resin). By using a fluorine-containing resin as the resin contained in the resist composition, the elution of an acid from the resist surface to the immersion liquid at the time of immersion exposure can be reduced, as a result the deterioration of sensitivity can be prevented.

The resins capable of increasing the solubility in an alkali developer by the action of an acid are resins having a group capable of decomposing by the action of an acid (hereinafter also referred to as "an acid-decomposable group") on the main chain or side chain, or both main chain and side chain. Of these resins, resins having a group capable of decomposing by the action of an acid on the side chain are more preferred. Preferred groups capable of decomposing by the action of an acid are groups obtained by substituting the hydrogen atom of a $-COOH$ group or $-OH$ group with a group capable of being desorbed by the action of an acid. In the invention, acetal groups and tertiary ester groups are used as the acid-decomposable groups.

As the repeating unit having a fluorine atom, it is preferred that the fluorine atoms contained per a repeating units are from 3 to 21, and more preferably from 6 to 18.

Further, the fluorine-containing resin contains at least one repeating unit having a fluorine atom, and it is preferred to have one alicyclic hydrocarbon structure in any repeating unit constituting the polymer. As the alicyclic hydrocarbon group, groups having a monocyclo, bicyclo, tricyclo or tetracyclo skeleton can be exemplified. The number of carbon atoms is preferably from 6 to 30, particularly preferably from 7 to 25.

Of the alicyclic hydrocarbon groups, the examples of the structures of the alicyclic part (alicyclic structure) are shown below.
(1)
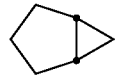
(2)
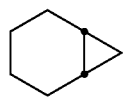
(3)
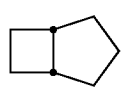
(4)
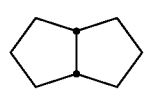
(5)
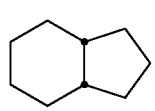
(6)
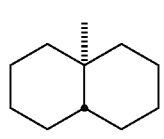
(7)
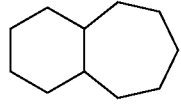
(8)
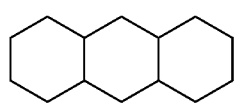
(9)
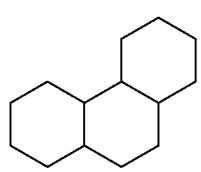
(10)
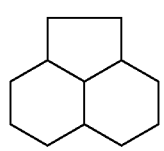
(11)
(12)
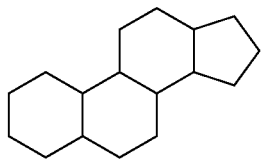
(13)
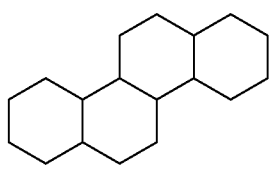
(14)
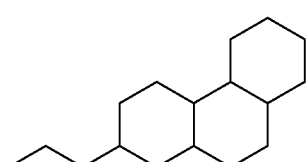
(15)
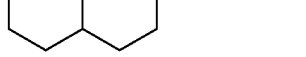
(16)
(17)
(18)
(19)
(20)
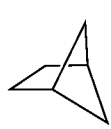
(21)
(22)
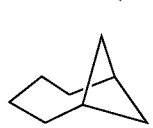
(23)
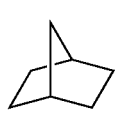
(24)
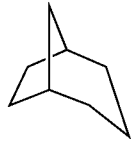

(25)
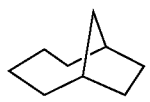
(26)
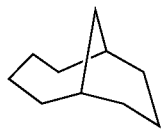
(27)
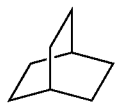
(28)
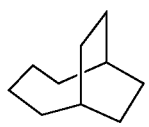
(29)
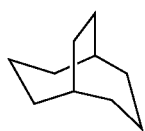
(30)
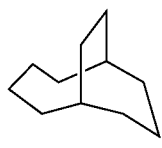
(31)
(32)
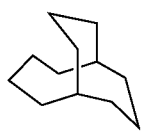
(33)
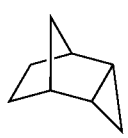
(34)
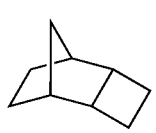
(35)
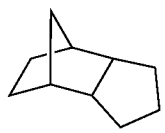
(36)
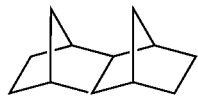
(37)
(38)
(39)
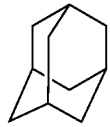
(40)
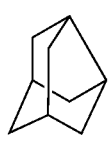
(41)
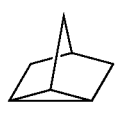
(42)
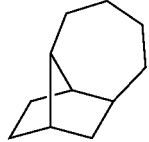
(43)
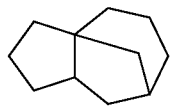
(44)
(45)
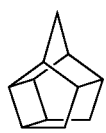
(46)
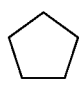
(47)
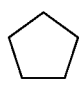
(48)

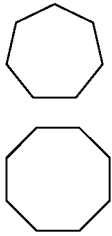

(49)

(50)

In the invention, as the preferred alicyclic parts, an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group, and a cyclododecanyl group can be exemplified. More preferred groups are an adamantyl group, a decalin residue, a norbornyl group, a cedrol group, a cyclohexyl group, a cycloheptyl group, a cyclooctyl group, a cyclodecanyl group, a cyclododecanyl group and a tricyclodecanyl group.

As the substituents of these alicyclic hydrocarbon groups, an alkyl group, a halogen atom, a hydroxyl group, an alkoxyl group, a carboxyl group and an alkoxycarbonyl group can be exemplified.

As the alkyl group, lower alkyl groups, e.g., a methyl group, an ethyl group, a propyl group, an isopropyl group and a butyl group are preferred, and more preferred are a methyl group, an ethyl group, a propyl group and an isopropyl group. As the alkoxyl group, alkoxyl groups having from 1 to 4 carbon atoms, e.g., a methoxy group, an ethoxy group, a propoxy group and a butoxy group can be exemplified.

These substituents may further be substituted with a hydroxyl group, a halogen atom or an alkoxyl group.

A fluorine atom may be directly substituted on the alicyclic hydrocarbon group, or may be substituted through a further substituent.

It is preferred that the repeating unit having a fluorine atom is at least selected from the following repeating unit represented by formula (I), (II) or (III):

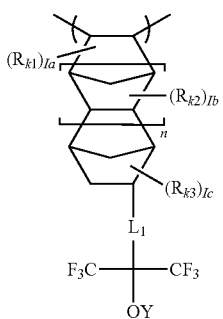

(I)

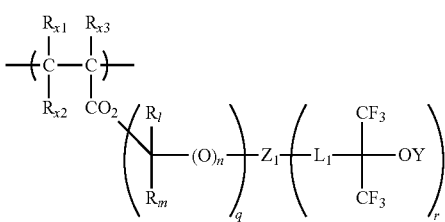

(II)

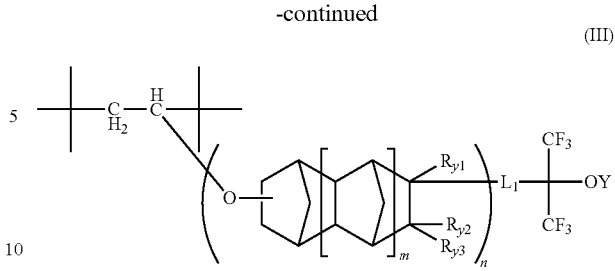

(III)

In formula (I), $R_{k1}$, $R_{k2}$ and $R_{k3}$ each independently represents a halogen atom, an alkyl group or an alkoxyl group; 1a represents an integer of from 0 to 2, 1b represents an integer of from 0 to 6, and 1c represents an integer of from 0 to 7; $L_1$ represents a single bond or a divalent linking group; n represents 0 or 1; and Y represents a hydrogen atom or an organic group; In formula (II), $R_{x1}$, $R_{x2}$ and $R_{x3}$ each independently represents a hydrogen atom, a fluorine atom, a chlorine atom, a cyano group, an alkyl group, or $-L_3-C(R_{f1})(R_{f2})Ra$; $R_{f1}$ and $R_{f2}$ each independently represents a hydrogen atom, a fluorine atom or an alkyl group, provided that at least one of $R_{f1}$ and $R_{f2}$ represents a fluorine atom or a fluoroalkyl group; Ra represents a hydrogen atom or a hydroxyl group; $L_3$ represents a single bond, an alkylene group, —$CH_2$—O—, or —$CH_2$—COO—; $R_l$ and $R_m$ each independently represents a hydrogen atom or an alkyl group; $Z_1$ represents a single bond, an alkylene group, a cycloalkylene group, or an arylene group; $L_1$ represents a single bond or a divalent linking group; n and q each independently represents 0 or 1; r represents an integer of from 1 to 6; and Y represents a hydrogen atom or an organic group;

In formula (III), $R_{y1}$, $R_{y2}$ and $R_{y3}$ each independently represents a hydrogen atom, a halogen atom, a hydroxyl group, a cyano group, an alkyl group, an aryl group, an alkoxyl group or an aralkyl group; $L_1$ represents a single bond or a divalent alkylene group; Y represents a hydrogen atom or an organic group; and m and n each independently represents 0 or 1.

In formula (I), as the halogen atom represented by $R_{k1}$, $R_{k2}$ and $R_{k3}$, a fluorine atom, a chlorine atom, a bromine atom and an iodine atom can be exemplified, and a fluorine atom is preferred.

The alkyl group represented by $R_{k1}$, $R_{k2}$ and $R_{k3}$ may have a substituent, and an alkyl group having from 1 to 8 carbon atoms is preferred, e.g., a methyl group, an ethyl group, a propyl group, an n-butyl group, a sec-butyl group and a t-butyl group can be exemplified. The alkyl group represented by $R_{k1}$, $R_{k2}$ and $R_{k3}$ is preferably an alkyl group substituted with a fluorine atom and having from 1 to 8 carbon atoms, preferably 1 or 2, and more preferably 1. A perfluoroalkyl group whose hydrogen atoms are all substituted with fluorine atoms is preferred.

The alkoxyl group represented by $R_{k1}$, $R_{k2}$ and $R_{k3}$ may have a substituent, and an alkoxyl group having from 1 to 8 carbon atoms is preferred, e.g., a methoxy group, an ethoxy group, a propoxy group, and an n-butoxy group can be exemplified.

As the substituents that the alkyl group and the alkoxyl group represented by $R_{k1}$, $R_{k2}$ and $R_{k3}$ may have, an alkoxyl group having from 1 to 4 carbon atoms, a halogen atom (e.g., a fluorine atom, a chlorine atom, a bromine atom, an iodine atom), an acyl group, an acyloxy group, a cyano group, a hydroxyl group, a carboxyl group, an alkoxycarbonyl group and a nitro group can be exemplified.

$R_{k1}$, $R_{k2}$ and $R_{k3}$ each preferably represents a halogen atom or a fluorine-substituted alkyl group, and particularly preferably represents a fluorine atom or a trifluoromethyl group.

1a represents an integer of from 0 to 2, 1b represents an integer of from 0 to 6, and 1c represents an integer of from 0 to 7, preferably 1a represents 0, 1b represents 0, and 1c represents an integer of from 0 to 3.

As the divalent linking group represented by $L_1$, e.g., an alkylene group, a cycloalkylene group, an alkenylene group, an arylene group, —O—, —S—, —O—$R_{22a}$—, —O—C(=O)—$R_{22b}$—, —C(=O)—O—$R_{22c}$—, and —C(=O)—N($R_{22d}$)—$R_{22e}$—, are exemplified. $R_{22a}$, $R_{22b}$, $R_{22c}$ and $R_{22e}$ each independently represents a divalent alkylene group, a cycloalkylene group, an alkenylene group or an arylene group each of which may have a single bond, an ether group, an ester group, an amido group, a urethane group, or a ureido group. $R_{22d}$ represents a hydrogen atom, an alkyl group (preferably having from 1 to 5 carbon atoms), a cycloalkyl group (preferably having from 3 to 10 carbon atoms), an aralkyl group (preferably having from 7 to 10 carbon atoms), or an aryl group (preferably having from 6 to 10 carbon atoms).

The alkylene group is preferably a straight chain or branched alkylene group having from 1 to 8 carbon atoms, e.g., a methylene group, an ethylene group, a propylene group, a butylene group, a hexylene group and an octylene group can be exemplified.

The cycloalkylene group is preferably a cycloalkylene group having from 5 to 12 carbon atoms, e.g., a residue of a monocyclic ring, e.g., a cyclopentylene group and a cyclohexylene group, and a residue of a polycyclic ring, e.g., a normornane skeleton and an adamantane skeleton can be exemplified.

The alkenylene group is preferably an alkenylene group having from 2 to 6 carbon atoms, e.g., an ethenylene group, a propenylene group and a butenylene group can be exemplified.

The arylene group is preferably an arylene group having from 6 to 15 carbon atoms, e.g., a phenylene group, a tolylene group and a naphthylene group can be exemplified.

As the substituents that the divalent linking group represented by $L_1$ may have, a halogen atom, e.g., a fluorine atom and a chlorine atom, and a cyano group can be exemplified, and a fluorine atom is preferred.

$L_1$ preferably represents a single bond, a methylene group or an —O— group.

The alkylene group represented by X is an alkylene group having from 1 to 8 carbon atoms, e.g., a methylene group, an ethylene group, a propylene group, a butylene group, a hexylene group and an octylene group can be exemplified.

The alkenylene group represented by X is an alkenylene group having from 2 to 6 carbon atoms, e.g., an ethenylene group, a propenylene group and a butenylene group can be exemplified.

The cycloalkylene group represented by X is a cycloalkylene group having from 5 to 8 carbon atoms, e.g., a cyclopentylene group and a cyclohexylene group can be exemplified.

The arylene group represented by X is an arylene group having from 6 to 15 carbon atoms, e.g., a phenylene group, a tolylene group and a naphthylene group can be exemplified.

The organic group represented by Y includes both an acid-decomposable organic group and an acid-undecomposable organic group, and the organic group preferably has from 1 to 30 carbon atoms. As the acid-decomposable organic groups represented by Y, e.g., —C($R_{11a}$)($R_{12a}$)($R_{13a}$), —($R_{14a}$)($R_{15a}$)($R_{16a}$) and —Xa-COO—C($R_{11a}$)($R_{12a}$)($R_{13a}$) can be exemplified.

$R_{11a}$, $R_{12a}$, $R_{13a}$ and $R_{16a}$ each independently represents an alkyl group, a cycloalkyl group, an alkenyl group, an aralkyl group or an aryl group.

$R_{14a}$ and $R_{15a}$ each independently represents a hydrogen atom or an alkyl group.

Further, two of $R_{11a}$, $R_{12a}$ and $R_{13a}$, and two of $R_{14a}$, $R_{15a}$ and $R_{16a}$ may be bonded to form a ring, respectively.

Xa represents a single bond, an alkylene group, a cycloalkylene group, an alkenylene group or an arylene group.

The alkyl group represented by $R_{11a}$, $R_{12a}$, $R_{13a}$, $R_{14a}$, $R_{15a}$ and $R_{16a}$ is an alkyl group having from 1 to 8 carbon atoms which may have a substituent, e.g., a methyl group, an ethyl group, a propyl group, an n-butyl group, a sec-butyl group, a hexyl group, a 2-ethylhexyl group, an octyl group, and a fluoroalkyl group (e.g., a monofluoromethyl group, a difluoromethyl group, a trifluoromethyl group, a pentafluoroethyl group) can be exemplified. Of the fluoroalkyl groups, a trifluoromethyl group is most preferred.

The cycloalkyl group represented by $R_{11a}$, $R_{12a}$, $R_{13a}$ and $R_{16a}$ may have a substituent, and may be monocyclic or polycyclic. As the monocyclic groups, a cycloalkyl group having from 3 to 8 carbon atoms is preferred, e.g., a cyclopropyl group, a cyclopentyl group, a cyclohexyl group, a cyclobutyl group and a cyclooctyl group can be exemplified. As the polycyclic groups, a cycloalkyl group having from 6 to 20 carbon atoms is preferred, e.g., an adamantyl group, a norbornyl group, an isoboronyl group, a camphanyl group, a dicyclopentyl group, an α-pinel group, a tricyclodecanyl group, a tetracyclododecyl group and an androstanyl group can be exemplified. Further, a part of the carbon atoms in the cycloalkyl group may be substituted with a hetero atom, e.g., an oxygen atom.

The aryl group represented by $R_{11a}$, $R_{12a}$, $R_{13a}$ and $R_{16a}$ may have a substituent, and an aryl group having from 6 to 10 carbon atoms is preferred, e.g., a phenyl group, a tolyl group, a dimethylphenyl group, a 2,4,6-trimethylphenyl group, a naphthyl group, an anthryl group, and a 9,10-dimethoxyanthryl group can be exemplified.

The aralkyl group represented by $R_{11a}$, $R_{12a}$, $R_{13a}$ and $R_{16a}$ may have a substituent, and an aralkyl group having from 7 to 12 carbon atoms is preferred, e.g., a benzyl group, a phenethyl group and a naphthylmethyl group can be exemplified.

The alkenyl group represented by $R_{11a}$, $R_{12a}$, $R_{13a}$ and $R_{16a}$ may have a substituent, and an alkenyl group having from 2 to 8 carbon atoms is preferred, e.g., a vinyl group, an allyl group, a butenyl group and a cyclohexenyl group can be exemplified.

As the substituents that $R_{11a}$, $R_{12a}$, $R_{13a}$, $R_{14a}$, $R_{15a}$ and $R_{16a}$ may have, an alkyl group, a cycloalkyl group, an aryl group, an amino group, an amido group, a ureido group, a urethane group, a hydroxyl group, a carboxyl group, a halogen atom, an alkoxyl group, a thioether group, an acyl group, an acyloxy group, an alkoxycarbonyl group, a cyano group and a nitro group can be exemplified.

As the specific examples of preferred acid-decomposable organic groups represented by Y, a tertiary alkyl group, e.g., a t-butyl group, a t-amyl group, a 1-alkyl-1-cyclohexyl group, a 2-alkyl-2-adamantyl group, a 2-adamantyl-2-propyl group, and a 2-(4-methylcyclohexyl)-2-propyl group, an acetal group, e.g., a 1-alkoxy-1-ethoxy group, a 1-alkoxy-1-methoxy group, and a tetrahydropyranyl group, a t-alkylcarbonyl group and a t-alkylcarbonylmethyl group can be preferably exemplified.

The acid-undecomposable organic group represented by Y is an organic group which does not decompose by the action of an acid, and an alkyl group, a cycloalkyl group, an aryl group, an aralkyl group, an alkoxyl group, an alkoxycarbonyl group, an amido group and a cyano group which do not decompose by the action of an acid can be exemplified. The alkyl group is preferably a straight chain or branched alkyl group having from 1 to 10 carbon atoms, e.g., a methyl group, an ethyl group, a propyl group, an n-butyl group, a sec-butyl group, a hexyl group, a 2-ethylhexyl group and an octyl group can be exemplified. The cycloalkyl group is preferably a cycloalkyl group having from 3 to 10 carbon atoms, e.g., a cyclopropyl group, a cyclobutyl group, a cyclohexyl group and an adamantyl group can be exemplified. The aryl group is preferably an aryl group having from 6 to 14 carbon atoms, e.g., a phenyl group, a naphthyl group and an anthracenyl group can be exemplified. The aralkyl group is preferably an aralkyl group having from 6 to 12 carbon atoms, e.g., a benzyl group, a phenethyl group and a cumyl group can be exemplified. The alkoxyl group in the alkoxyl group and the alkoxycarbonyl group is preferably an alkoxyl group having from 1 to 5 carbon atoms, e.g., a methoxy group, an ethoxy group, a propoxy group, an n-butoxy group and an isobutoxy group can be exemplified.

The specific examples of preferred repeating units represented by formula (I) are shown below, but the invention is not limited thereto.

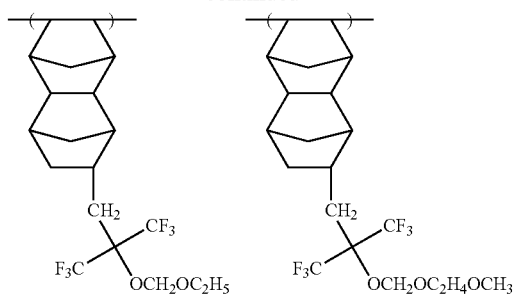

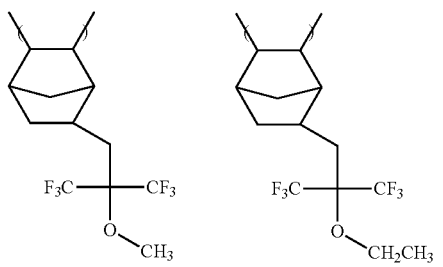

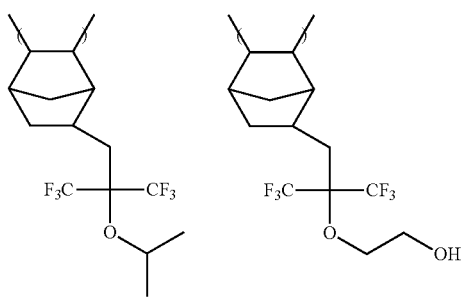

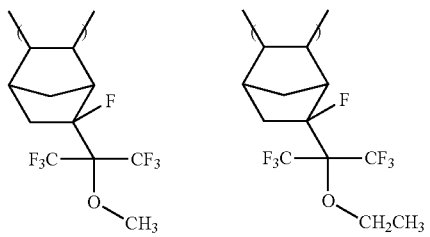

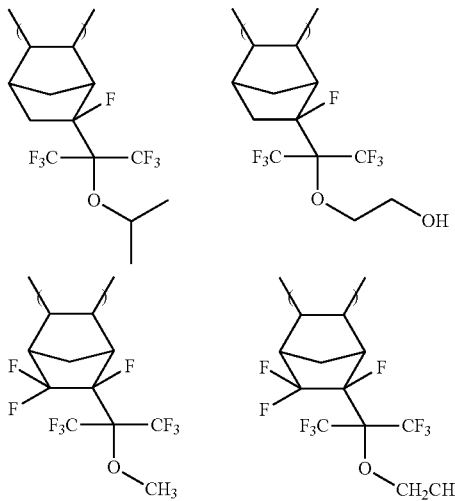

17
-continued
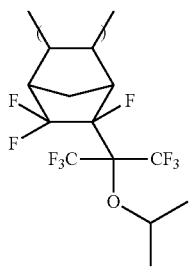
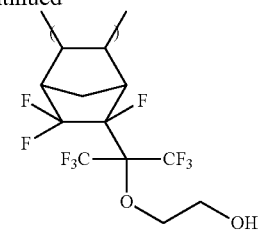
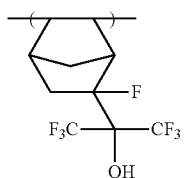
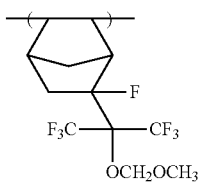
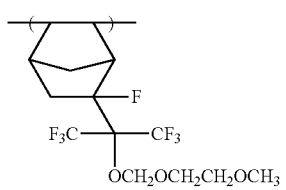
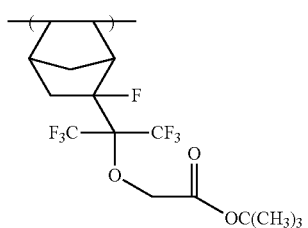
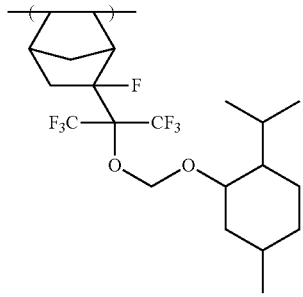
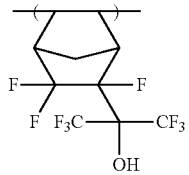
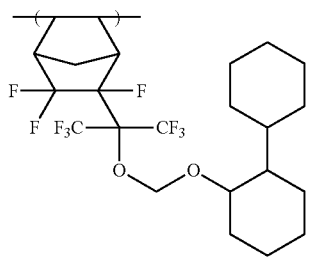
18
-continued
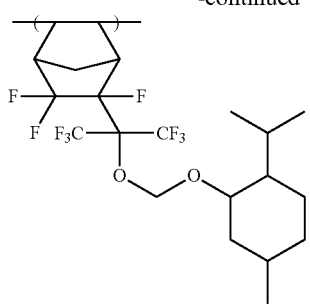
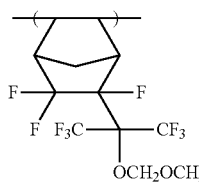
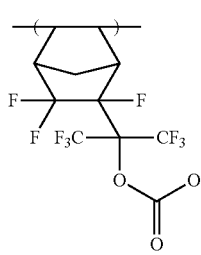
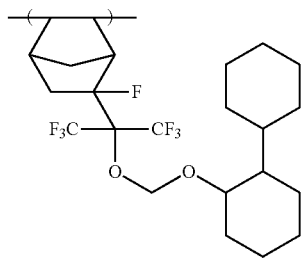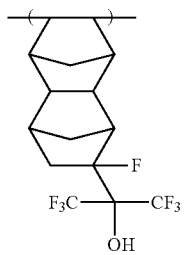
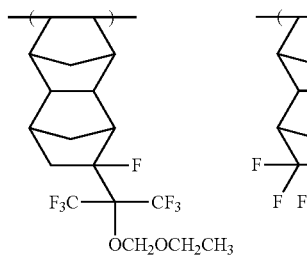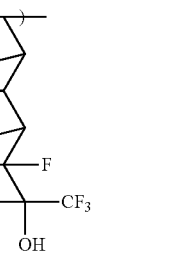
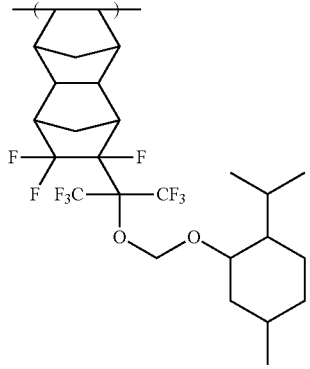

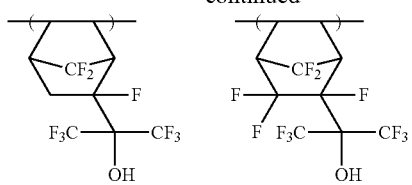
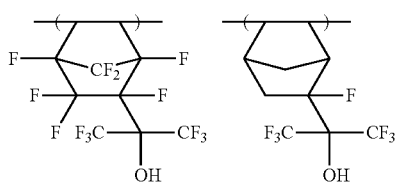
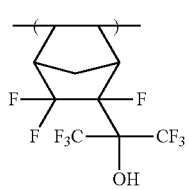
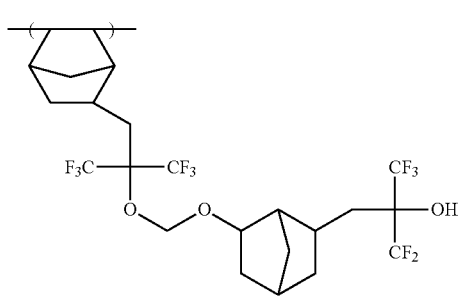
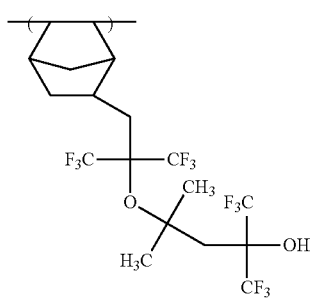
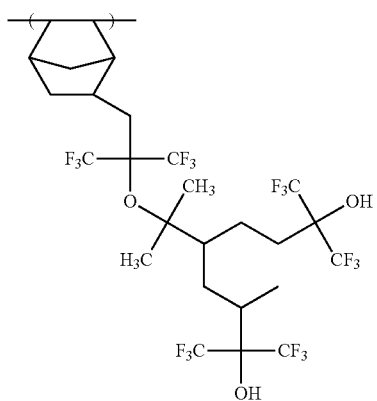
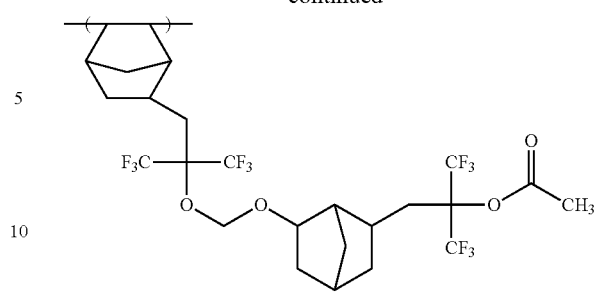
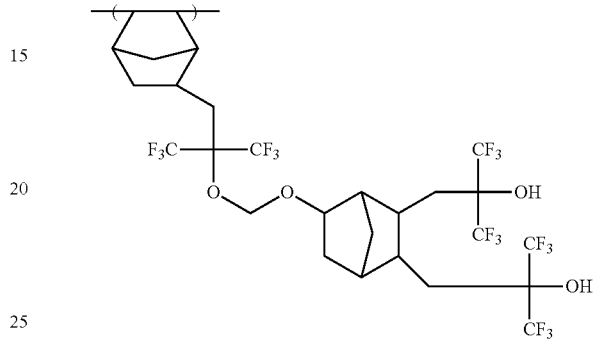
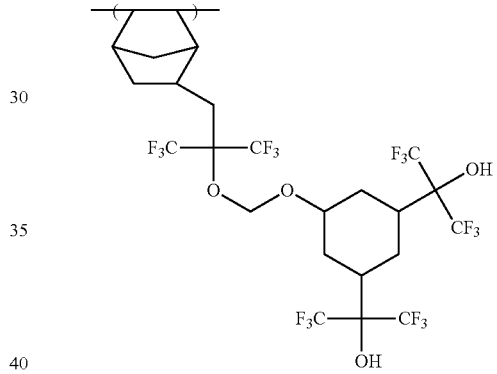
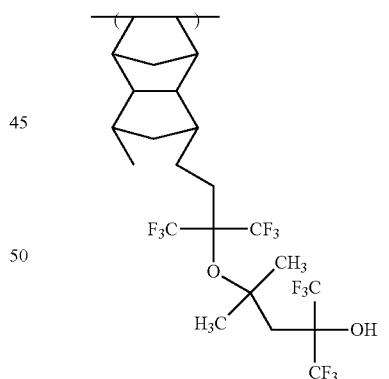
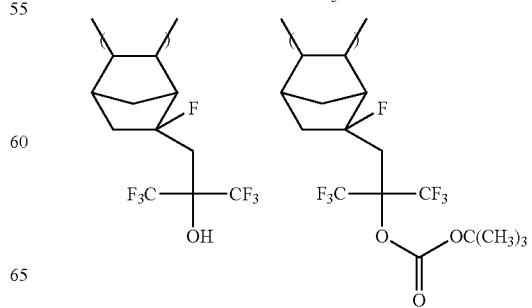

21
-continued
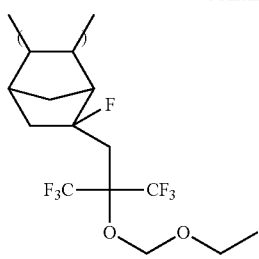
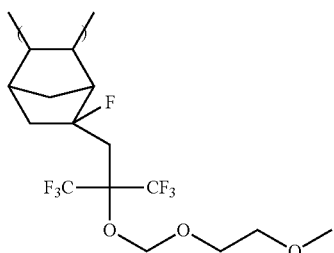
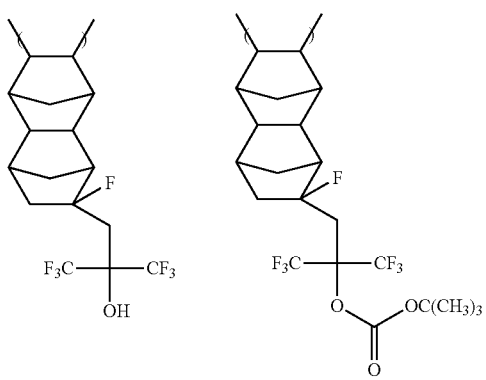
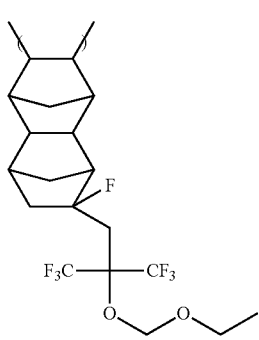
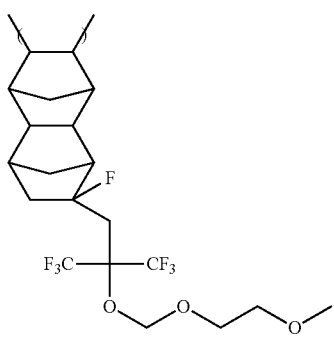
22
-continued
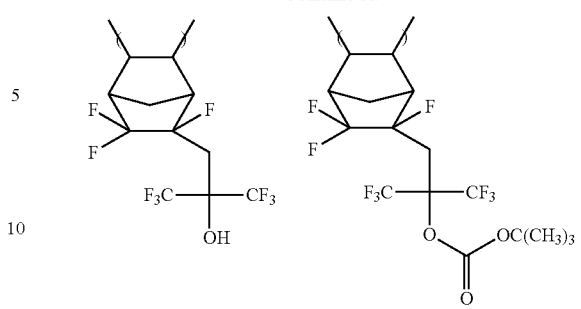
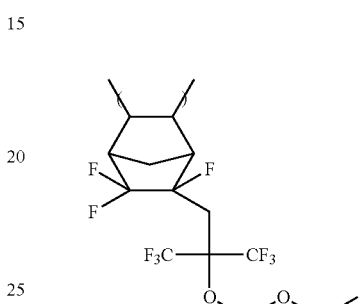
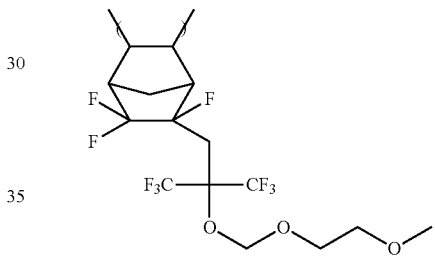
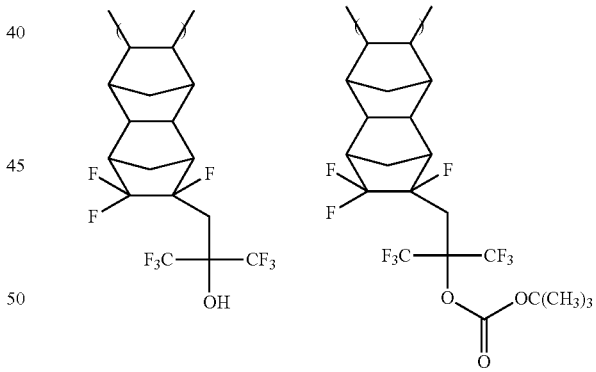
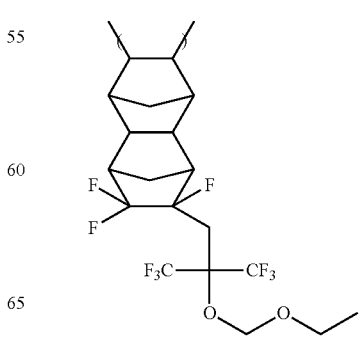

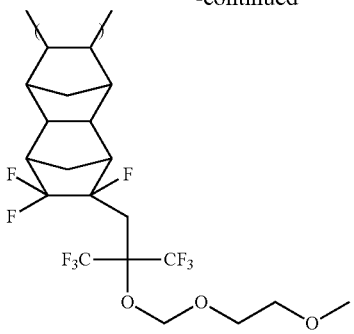

In formula (II), as the alkyl group represented by $R_{x1}$, $R_{x2}$ and $R_{x3}$, the same alkyl groups as represented by $Rk_1$ to $Rk_3$ in formula (I) can be exemplified.

When $R_{x1}$, $R_{x2}$ and $R_{x3}$ each independently represents -$L_3$-C($R_{f1}$)($R_{f2}$)Ra, as the alkyl groups represented by $Rf_1$ and $R_{f2}$, the same alkyl groups as represented by $Rk_1$ to $Rk_3$ in formula (I) can be exemplified.

As the alkylene groups represented by $L_3$, the same divalent alkylene groups as represented by $L_1$ in formula (I) can be exemplified.

As the alkyl group represented by $R_l$ and $R_m$, an alkyl group having from 1 to 3 carbon atoms is preferred, and specifically a methyl group, an ethyl group, a propyl group, an isopropyl group and a fluoroalkyl group are exemplified. Of the unsubstituted alkyl groups, a methyl group is most preferred. As the fluoroalkyl group, a fluoroalkyl group having from 1 to 4 carbon atoms is preferred, specifically a monofluoromethyl group, a difluoromethyl group, a trifluoromethyl group, a pentafluoroethyl group, a heptafluoropropyl group and a nonafluorobutyl group are exemplified, and a trifluoromethyl group is most preferred.

As the alkylene group represented by $Z_1$, the same divalent alkylene groups as represented by $L_1$ in formula (I) can be exemplified.

The cycloalkylene group represented by $Z_1$ may have a substituent, and the cycloalkylene group may be monocyclic or polycyclic. The examples of the substituents include, e.g., a hydroxyl group, an alkyl group, an alkoxyl group, a halogen atom and a cyano group. The monocyclic cycloalkylene group is a monocyclic cycloalkylene group preferably having from 3 to 8 carbon atoms, e.g., a cyclopropylene group, a cyclo-pentylene group, a cyclohexylene group, a cycloheptylene group and a cyclooctylene group can be preferably exemplified. The polycyclic cycloalkylene group is a polycyclic cycloalkylene group preferably having from 6 to 20 carbon atoms, e.g., an adamantyl residue, a norbornyl residue, an isoboronyl residue, a camphanyl residue, a dicyclopentyl residue, an α-pinel residue, a tricyclodecanyl residue, a tetracyclododecyl residue and an androstanyl residue can be exemplified as preferred examples. Further, the carbon atoms in the monocyclic or polycyclic cycloalkyl group may be substituted with a hetero atom, e.g., an oxygen atom. As the substituents of the cycloalkylene group, a fluorine atom is preferred, and as the cycloalkylene group substituted with a fluorine atom (the cycloalkylene group in which at least one hydrogen atom is substituted with a fluorine atom), e.g., a perfluoro-cyclopropylene group, a perfluorocyclopentylene group, a perfluorocyclohexylene group, a perfluorocycloheptylene group, and a perfluorocyclooctylene group can be exemplified.

As the arylene group represented by $Z_1$, an arylene group having from 4 to 20 carbon atoms is preferred, e.g., a phenylene group, a tolylene group and a naphthylene group can be exemplified.

As the divalent linking group represented by $L_1$, the same divalent linking groups as represented by $L_1$ in formula (I) can be exemplified.

As the organic group represented by Y, the same organic groups as represented by Y in formula (I) can be exemplified.

The specific examples of preferred repeating units represented by formula (II) are shown below, but the invention is not limited thereto.

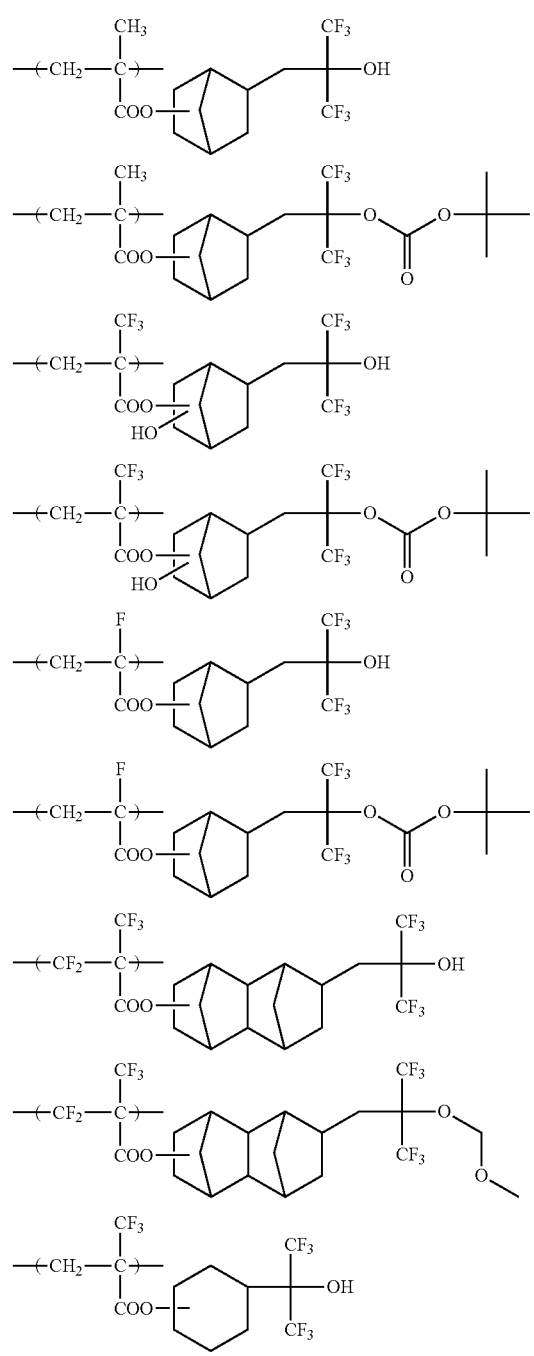

-continued
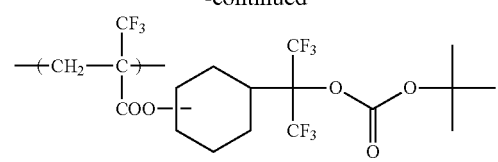
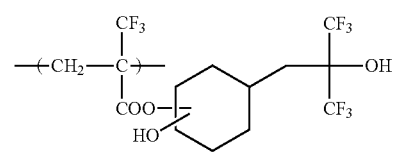
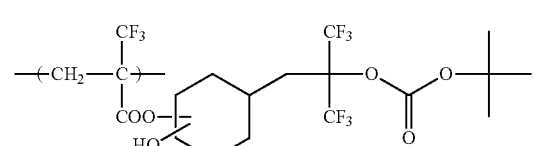
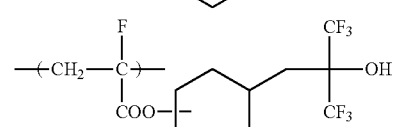
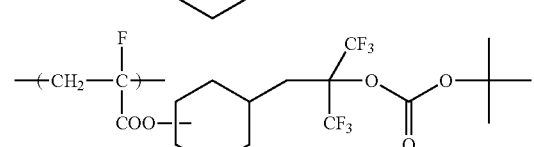
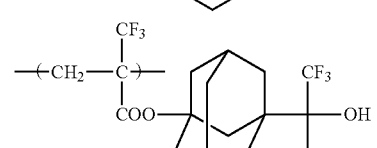
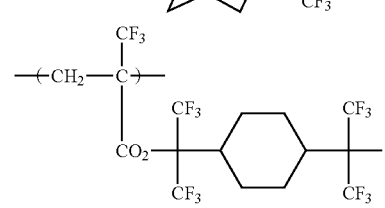
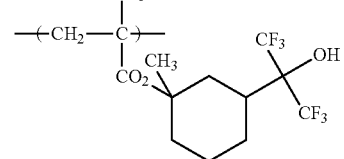
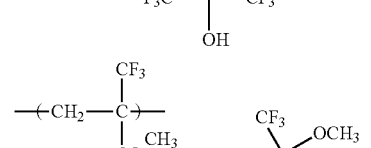
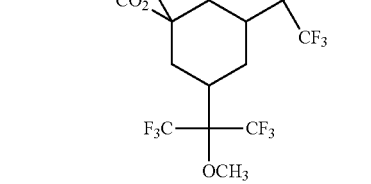
-continued
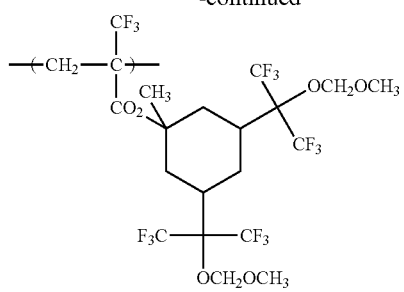
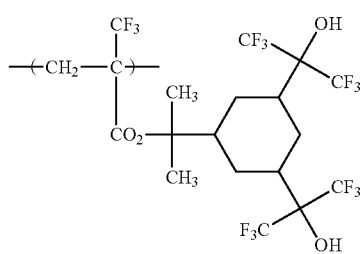
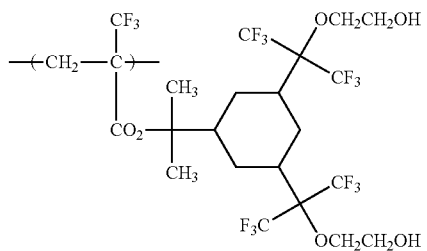
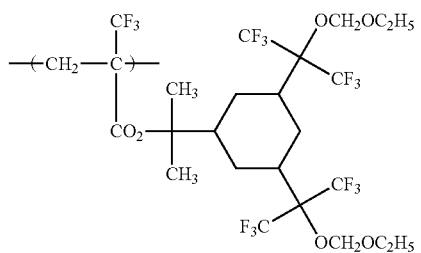
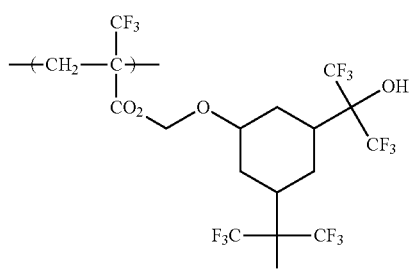
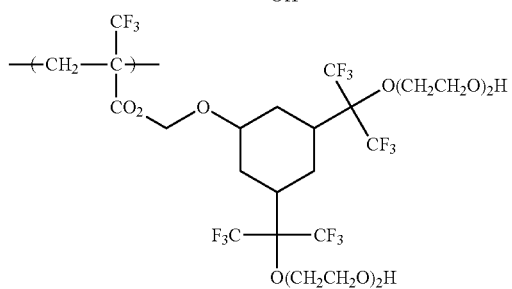

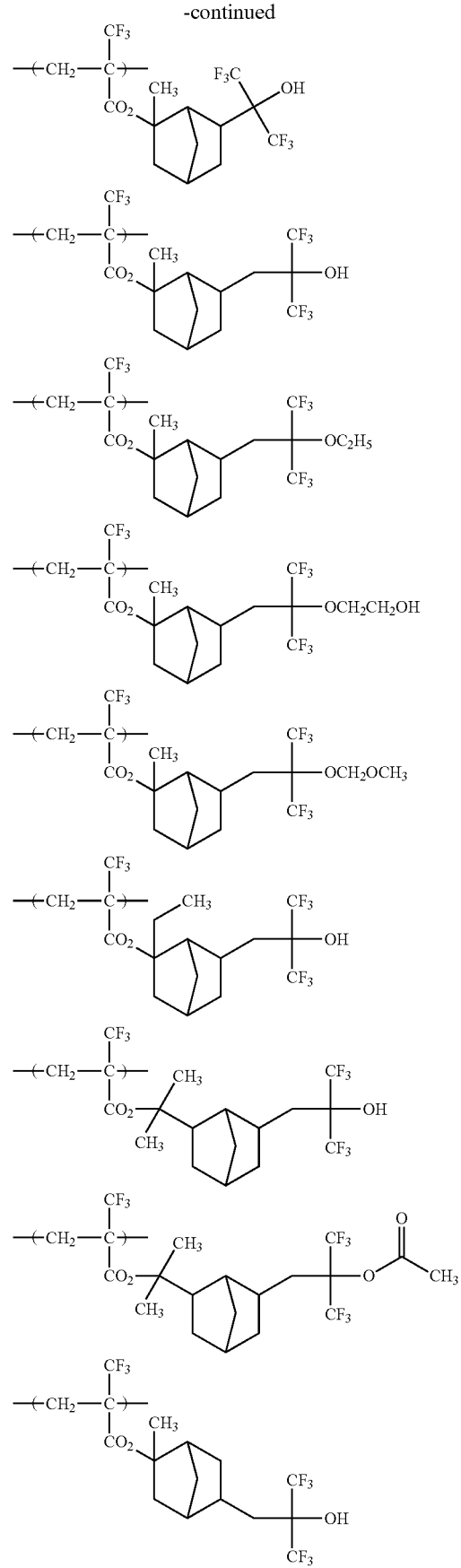
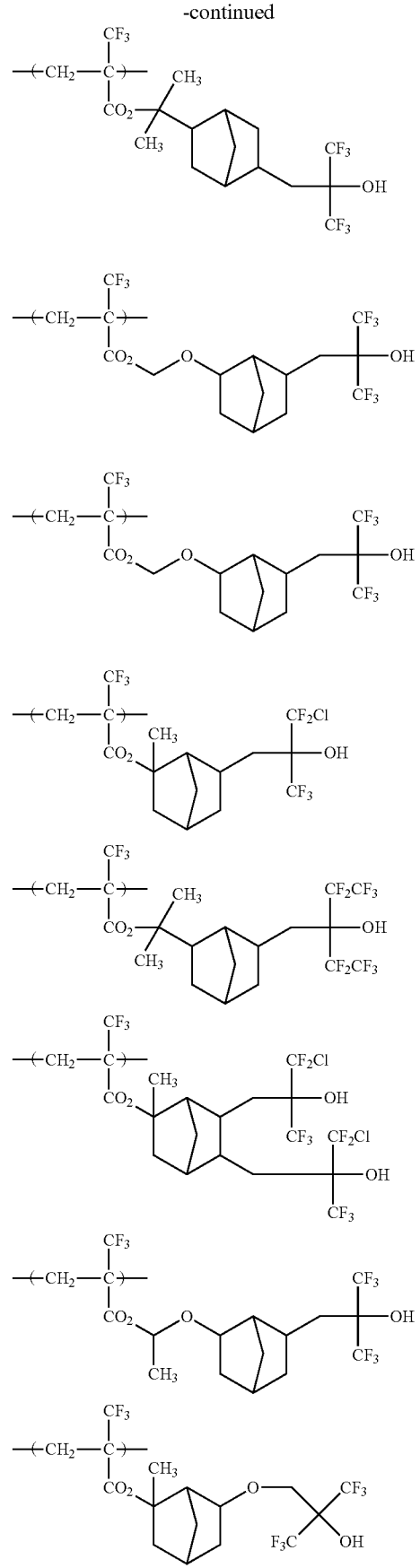

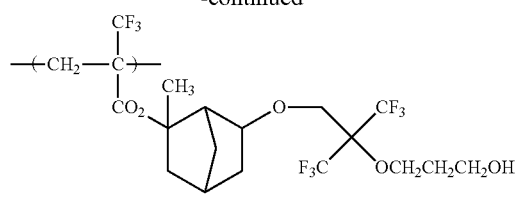
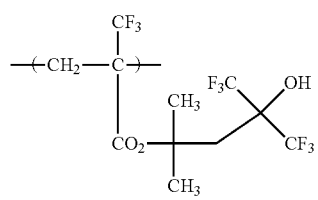
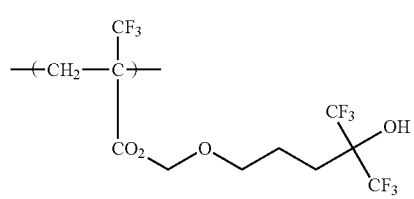
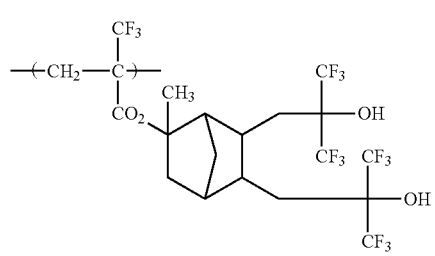
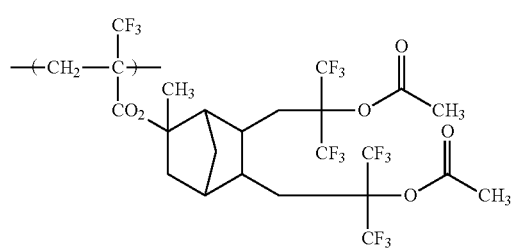
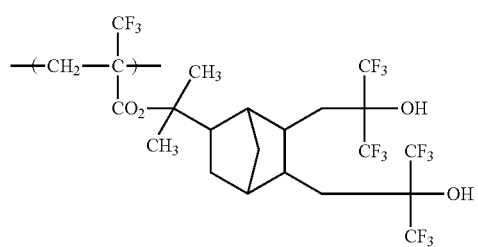
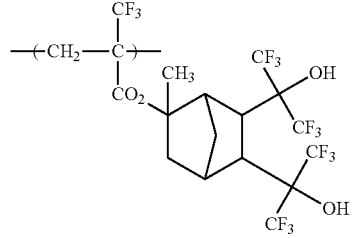
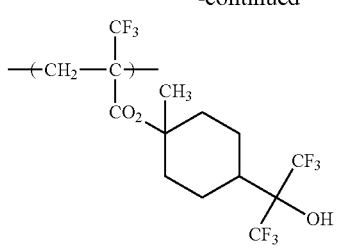
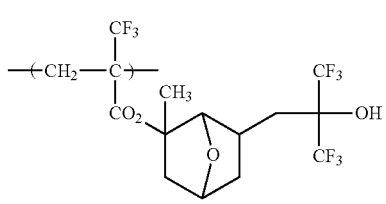
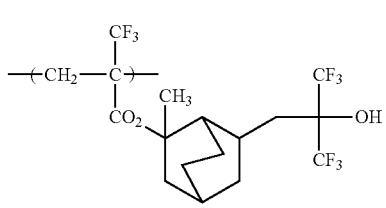
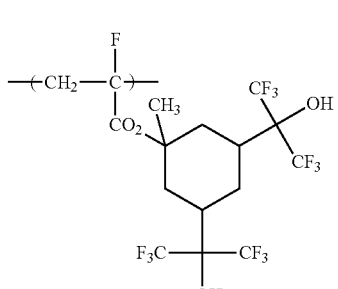
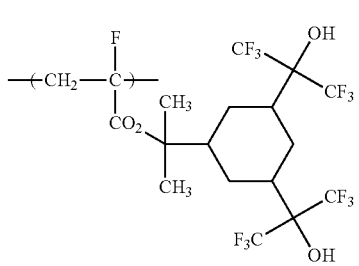
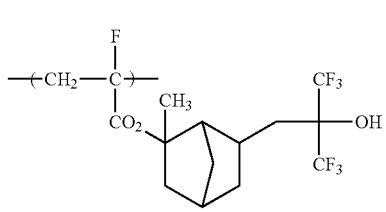
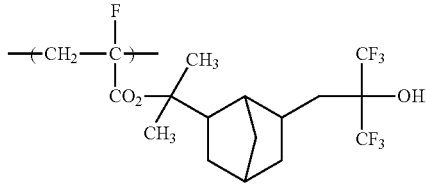

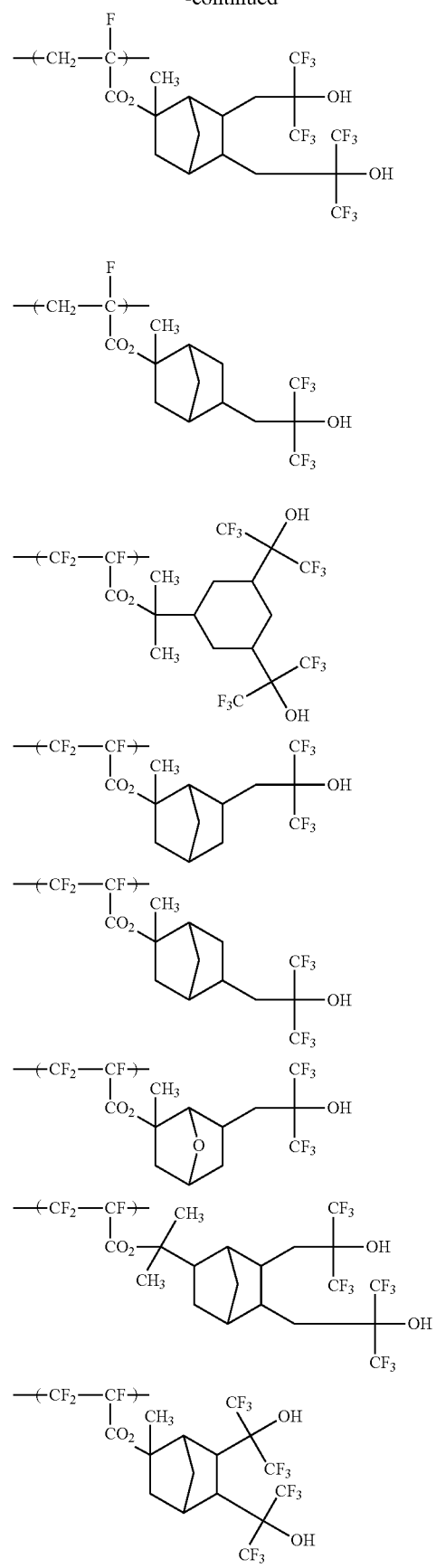
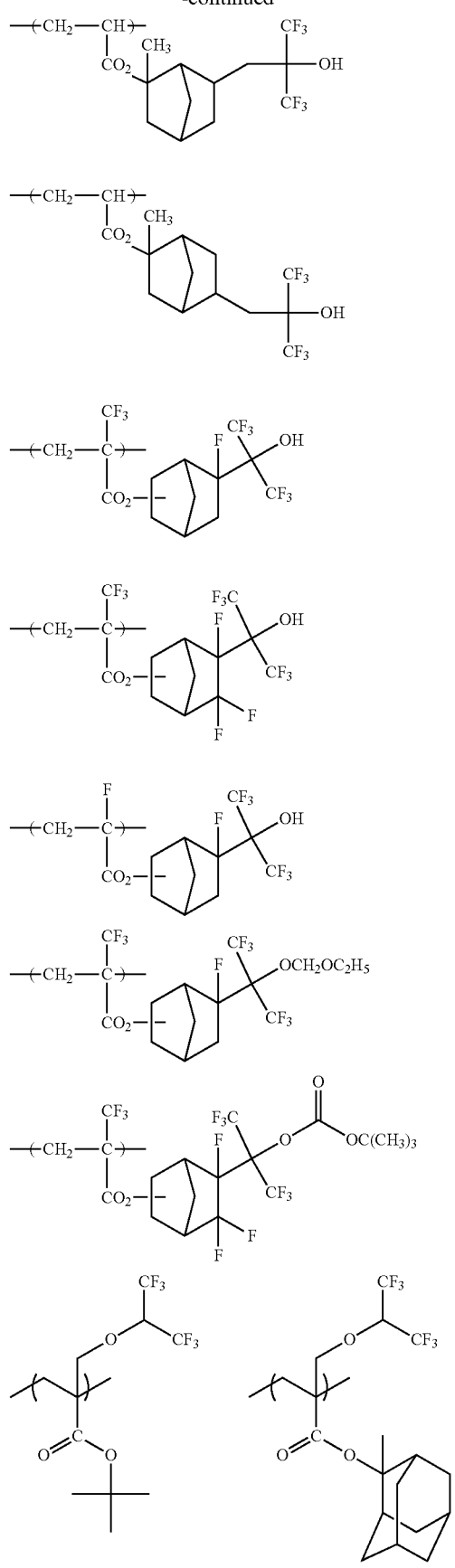

-continued
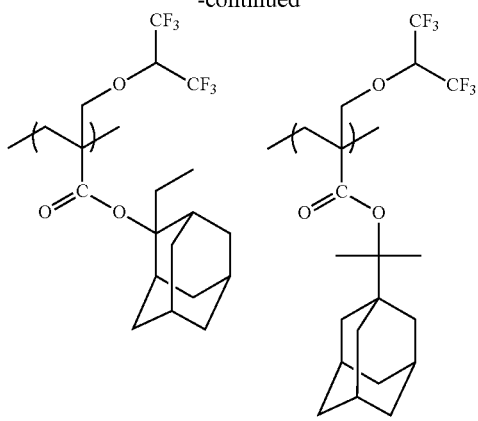
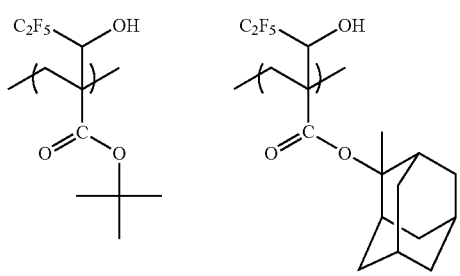
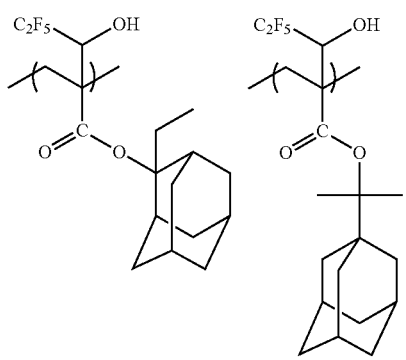
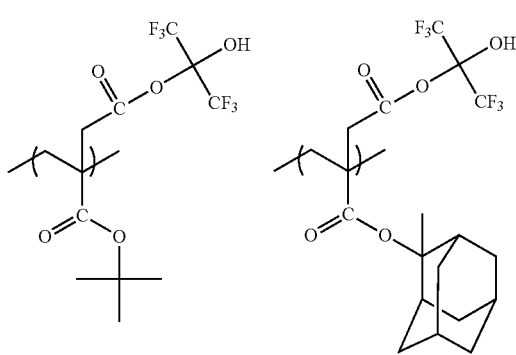
-continued
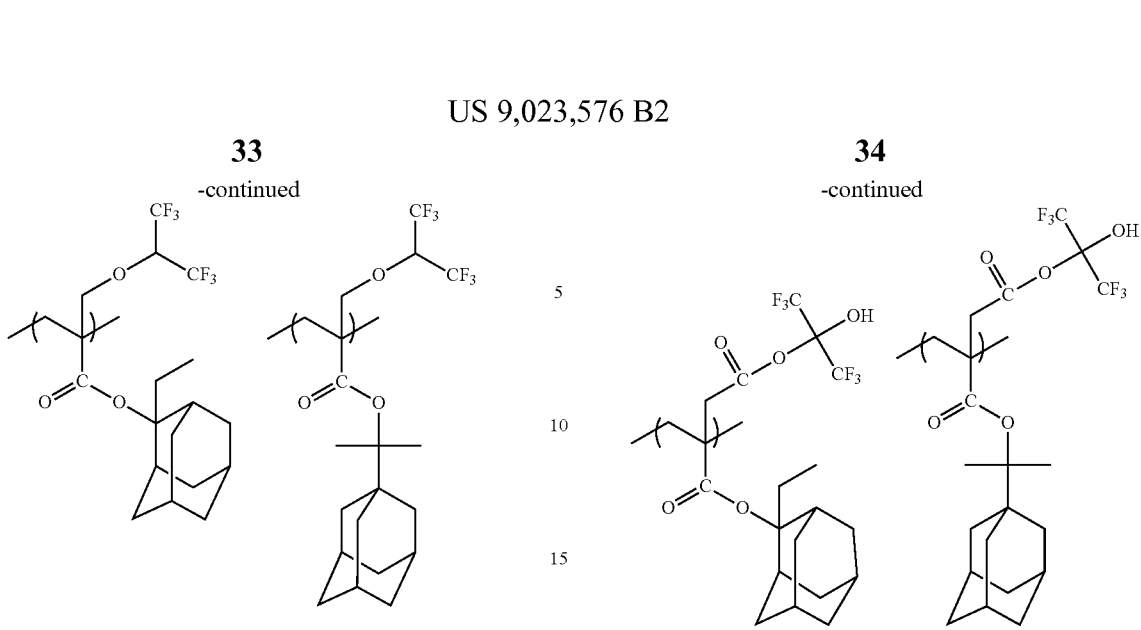
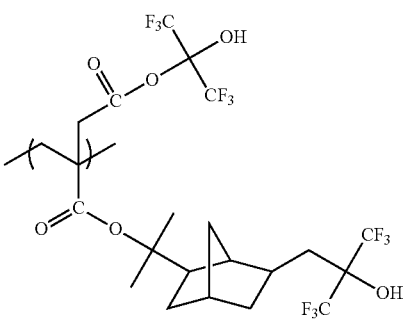
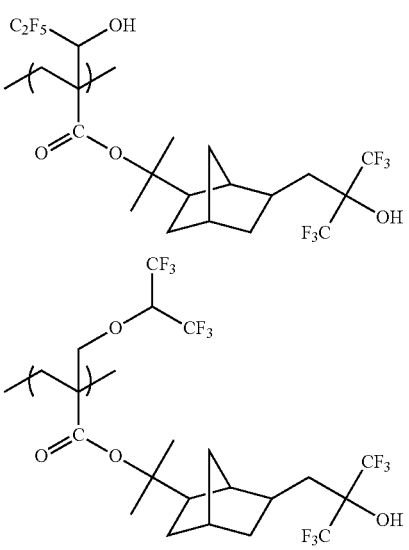
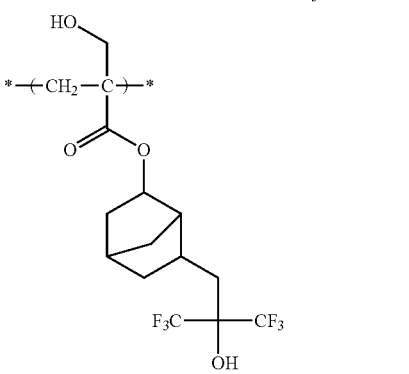

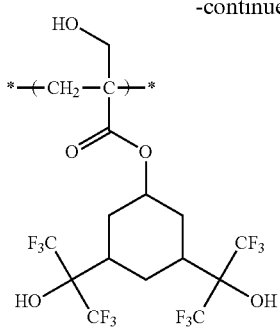

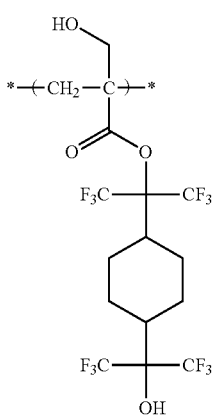

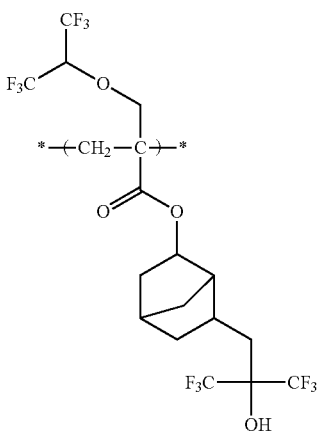

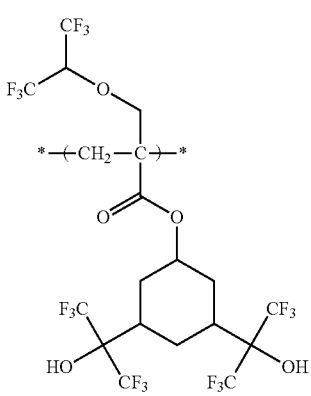

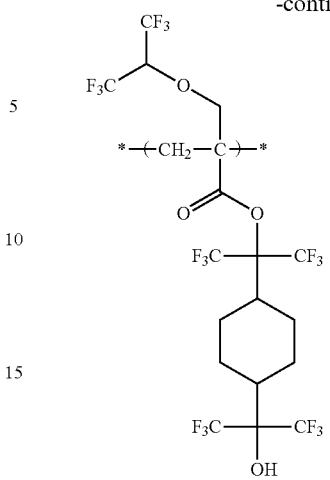

In formula (III), as the alkyl group represented by $R_{y1}$, $R_{y2}$ and $R_{y3}$, the same alkyl groups as represented by $R_{k1}$ in formula (I) can be exemplified.

As the aryl group represented by $R_{y1}$, $R_{y2}$ and $R_{y3}$, an aryl group having from 6 to 10 carbon atoms is preferred, e.g., a phenyl group, a tolyl group, a dimethylphenyl group, a 2,4,6-trimethylphenyl group, a naphthyl group, an anthryl group, and a 9,10-dimethoxyanthryl group can be exemplified.

As the alkoxyl group represented by $R_{y1}$, $R_{y2}$ and $R_{y3}$, the same alkoxyl groups as represented by $R_{k1}$ in formula (I) can be exemplified.

As the aralkyl group represented by $R_{y1}$, $R_{y2}$ and $R_{y3}$, an aralkyl group having from 7 to 12 carbon atoms is preferred, e.g., a benzyl group, a phenethyl group and a naphthylmethyl group can be exemplified.

As the divalent alkylene group represented by $L_1$, the same divalent alkylene groups represented by $L_1$ in formula (I) can be exemplified.

The organic group represented by Y, the same organic groups as represented by Y in formula (I) can be exemplified.

As the preferred specific examples of the repeating units represented by formula (III), the following compounds are exemplified.

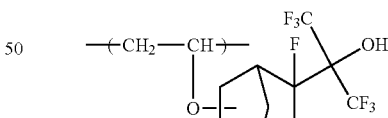

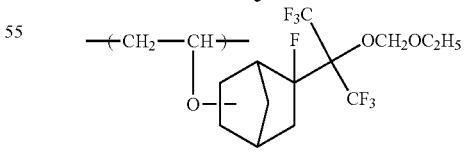

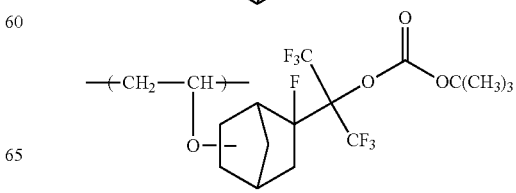

37
-continued
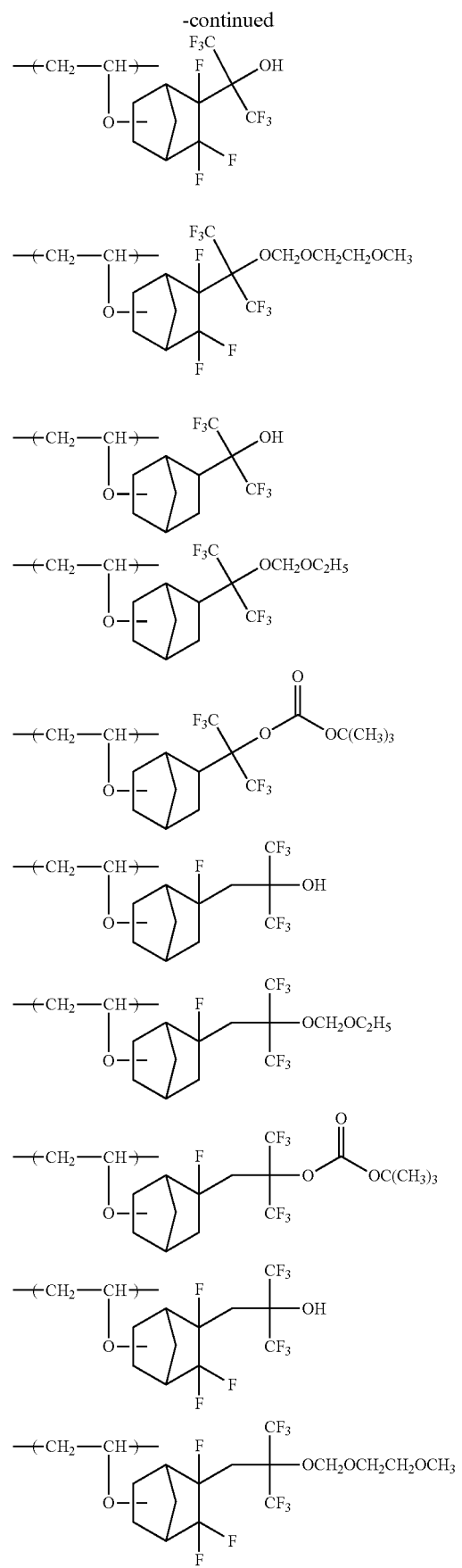
38
-continued
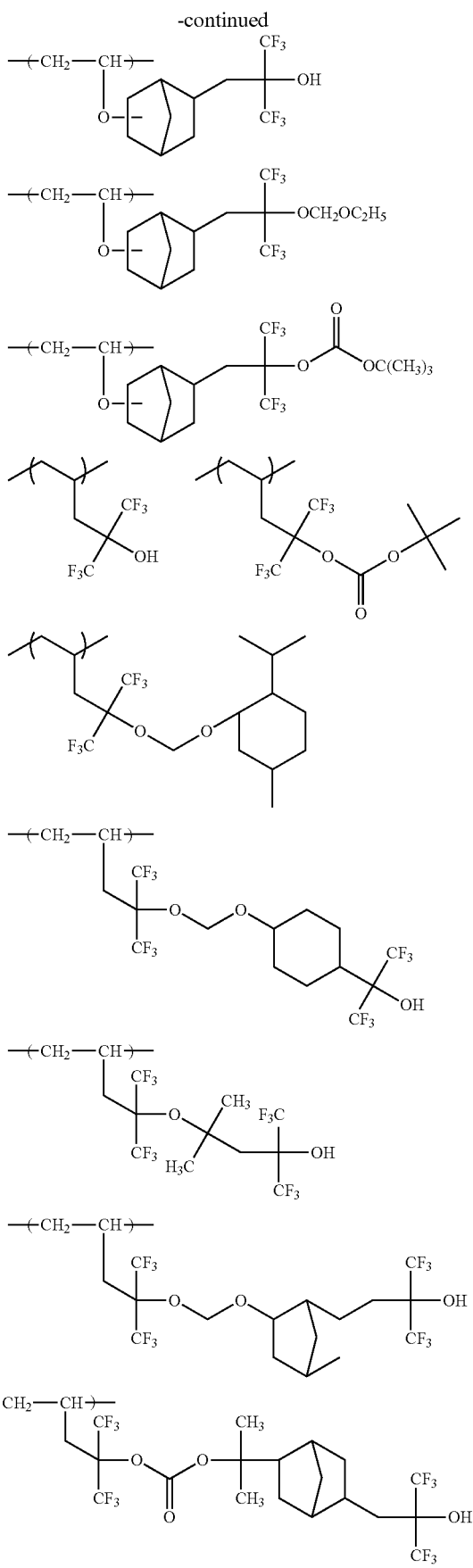

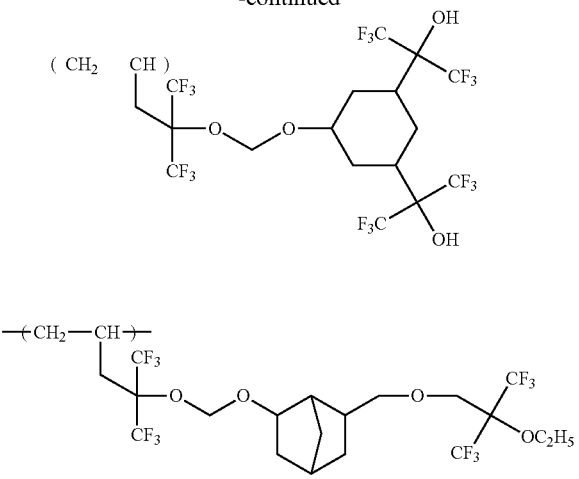

It is also preferred that the fluorine-containing repeating unit represented by the following formula (IV), (V), (VI), (VII), (VIII) or (IX) is contained in the fluorine-containing resin.

wherein $X_1$ represents an oxygen atom or a sulfur atom; $X_2$ represents a methylene group, an oxygen atom or a sulfur atom; Rx represents a hydrogen atom, a fluorine atom, a chlorine atom, a cyano group, an alkyl group, or -$L_3$-CRa; $L_3$ represents an alkylene group, —$CH_2O$— or —$CH_2O$(C=O)—; Ra represents a hydroxyl group, a lactone group or a fluoroalkyl group; Rf, $Rf_1$ and $Rf_2$ each independently represents a group having at least one or more fluorine atoms, and $Rf_1$ and $Rf_2$ may be linked to each other to form a ring having —$(CF_2)n_1$-; $n_1$ represents an integer of 1 or higher; and j represents an integer of from 1 to 3.

In formulae (IV) to (IX), as the alkyl group, the same alkyl groups represented by $R_{k1}$, $R_{k2}$ and $R_{k3}$ in formula (I) can be exemplified, and as the alkylene group, the same divalent alkylene groups represented by $L_1$ in formula (I) can be exemplified.

The lactone group preferably has the lactone structure represented by formula (Lc) or any of formulae (V-1), (V-2), (V-3), (V-4) and (V-5) shown below.

The fluoroalkyl group preferably has from 1 to 4 carbon atoms, and specifically a monofluoromethyl group, a difluoromethyl group, a trifluoromethyl group, a pentafluoroethyl group, a heptafluoropropyl group, a nonafluorobutyl group, a hexafluoroisopropyl group, a nonafluoro-t-butyl group and a trifluoroisopropyl group are exemplified.

$n_1$ is an integer of 1 or more, preferably from 3 to 6.

The specific examples of the repeating units represented by formula (IV) are shown below, but the invention is not limited thereto.

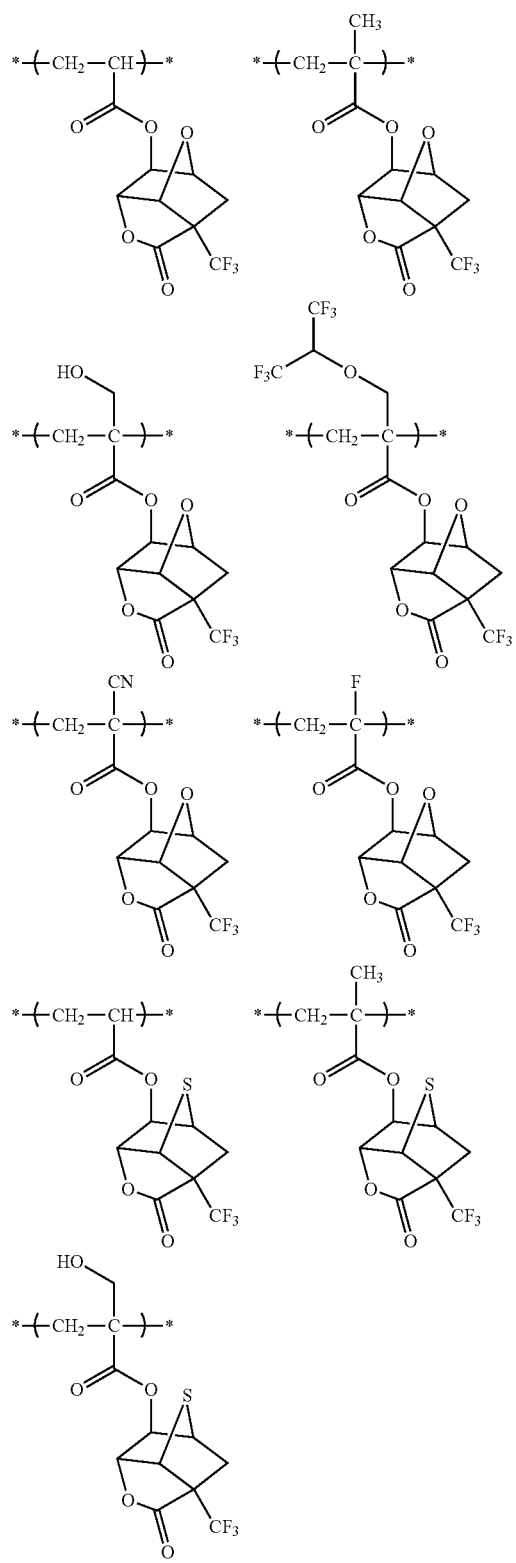
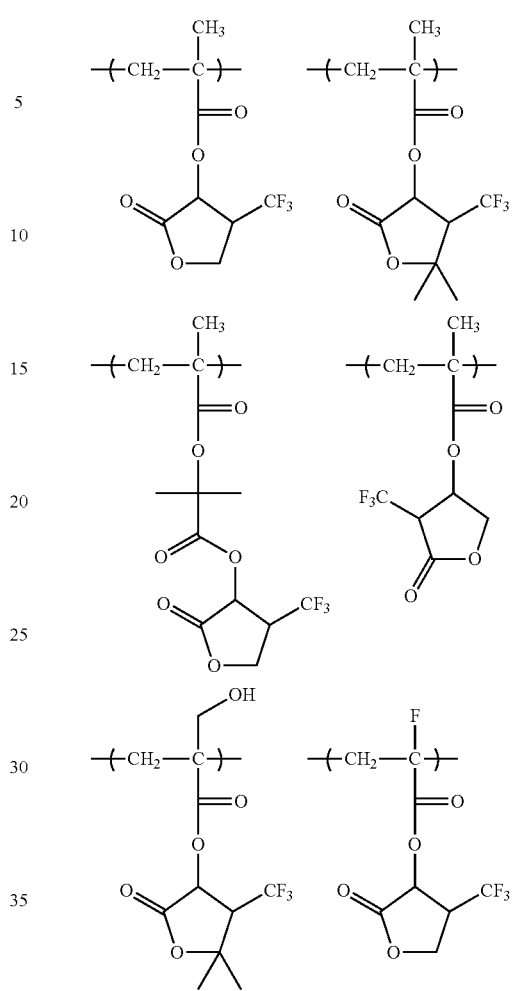
The specific examples of the repeating units represented by formula (VI) are shown below, but the invention is not limited thereto.
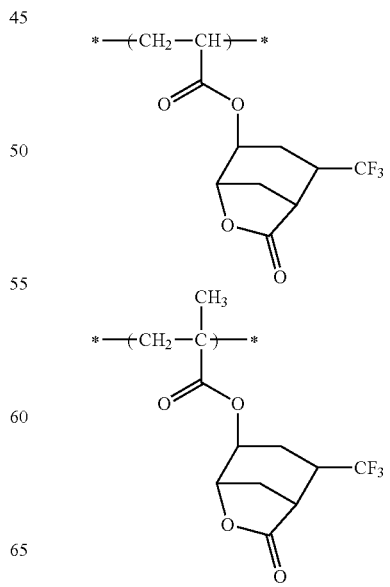
The specific examples of the repeating units represented by formula (V) are shown below, but the invention is not limited thereto.

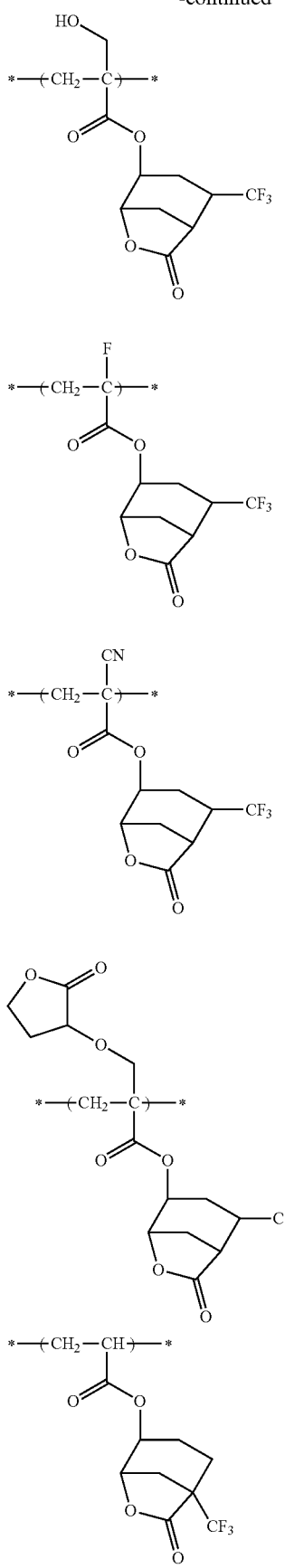
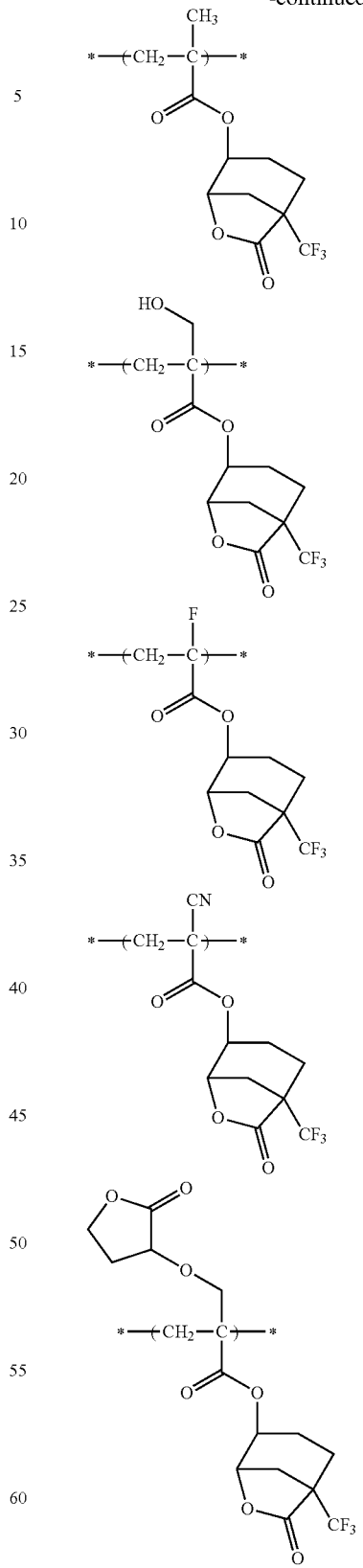
The specific examples of the repeating units represented by formula (VII) are shown below, but the invention is not limited thereto.

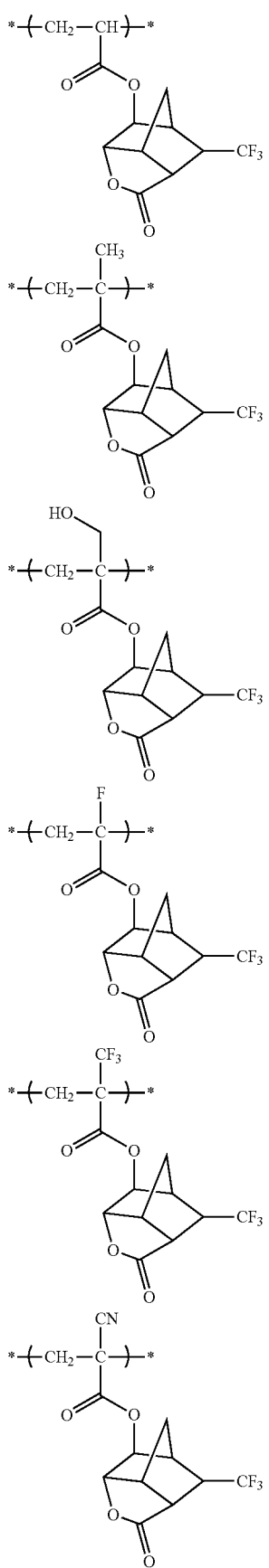
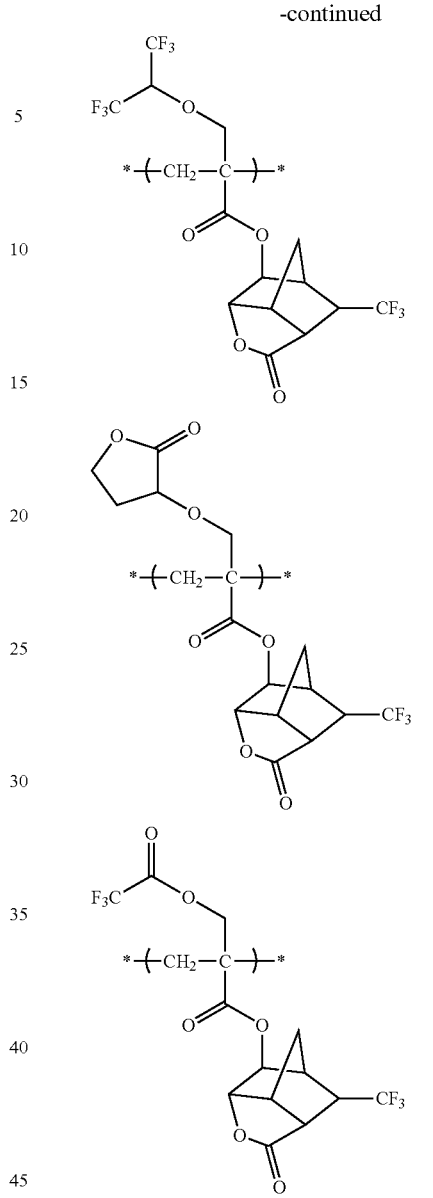
The specific examples of the repeating units represented by formula (VIII) are shown below, but the invention is not limited thereto.
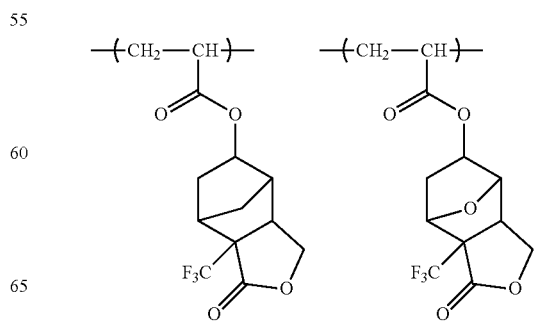

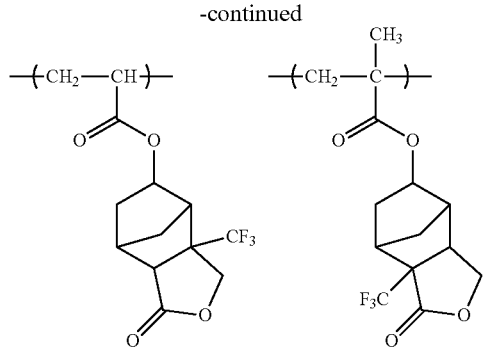
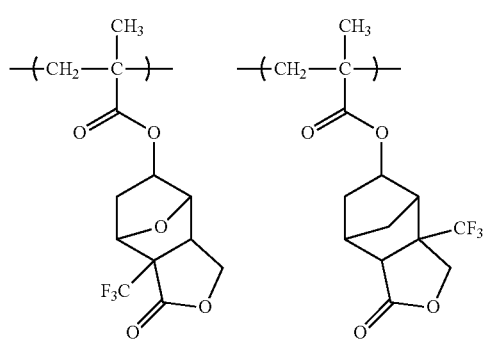
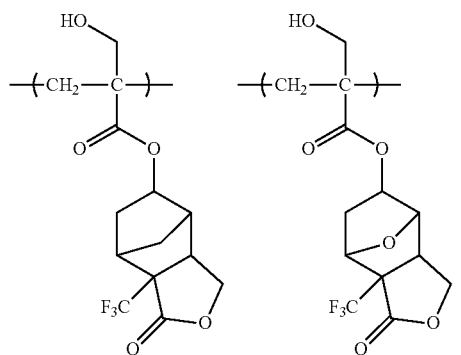
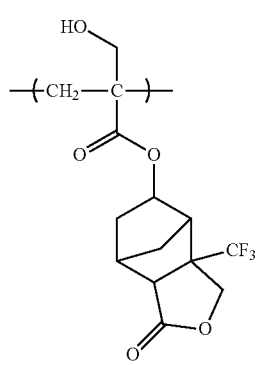

The specific examples of the repeating units represented by formula (IX) are shown below, but the invention is not limited thereto.

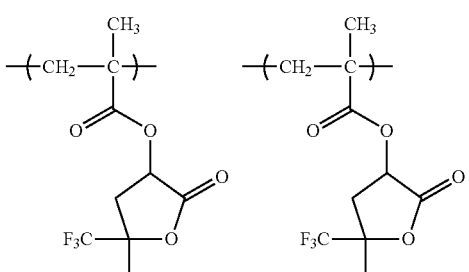

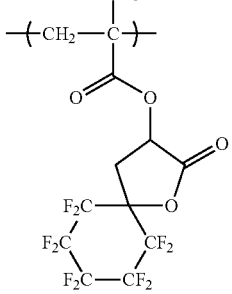

The fluorine-containing repeating unit represented by any of formulae (I) to (IX) is preferably used in the fluorine-containing resin in the invention, and the fluorine-containing repeating units represented by the following formulae (X) to (XV) may also be used.

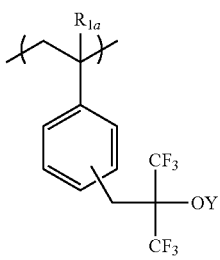
(X)

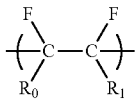
(XI)

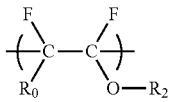
(XII)

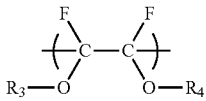
(XIII)

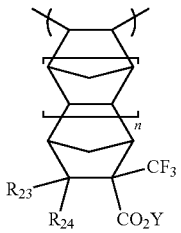
(XIV)

-continued

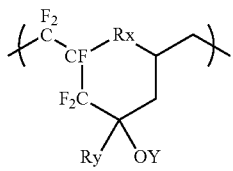

In formula (X), $R_{1a}$ represents a hydrogen atom, a fluorine atom, a hydrogen atom, a bromine atom, a cyano group or a trifluoromethyl group; Y represents a hydrogen atom or an organic group; na represents an integer of from 1 to 5, when na represents 2 or more, $R_{11}$ to $R_{16}$ and Y may be the same or different.

In formula (X), as the organic group represented by Y, the same organic groups as represented by Y in formula (I) can be exemplified.

The specific examples of the repeating units represented by formula (X) are shown below, but the invention is not limited thereto.

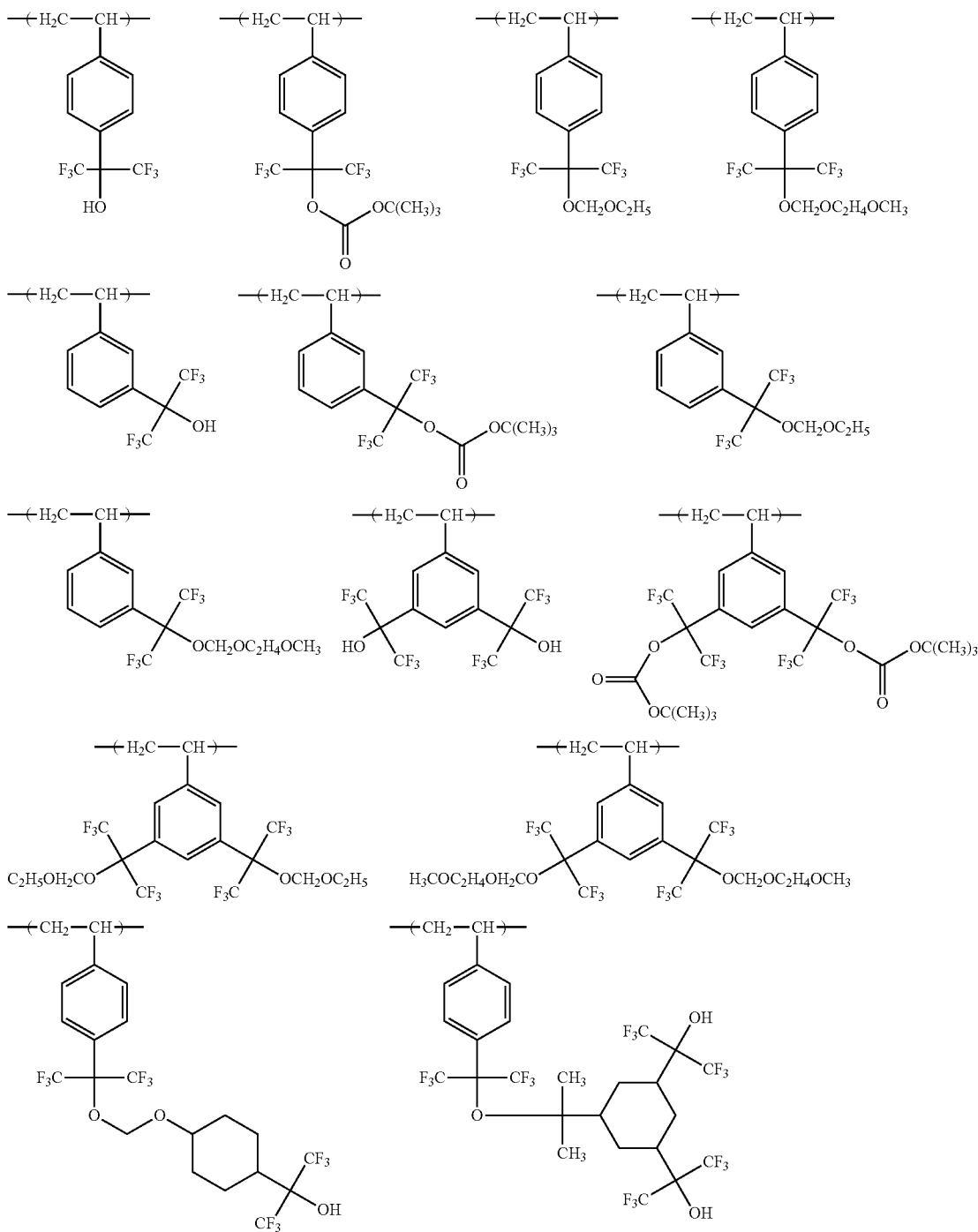

-continued
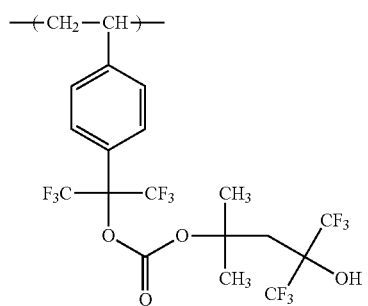
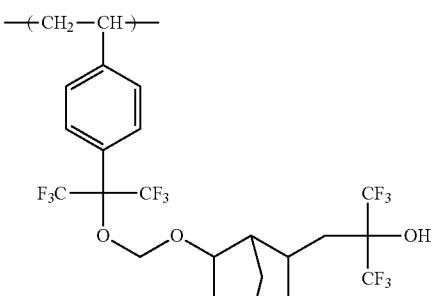
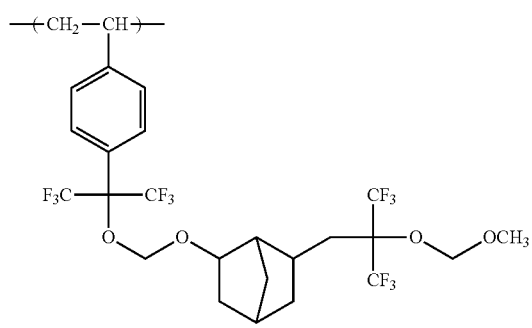
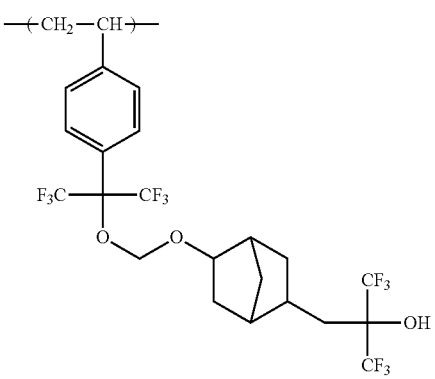
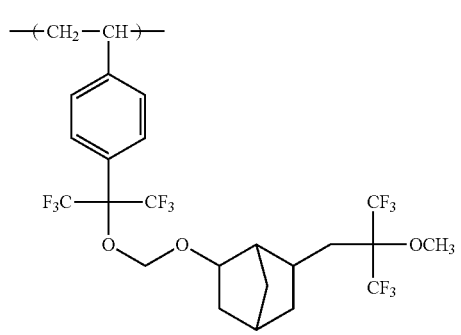
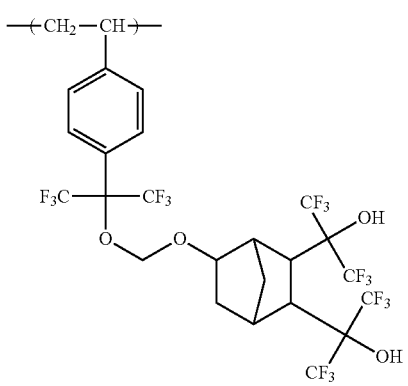
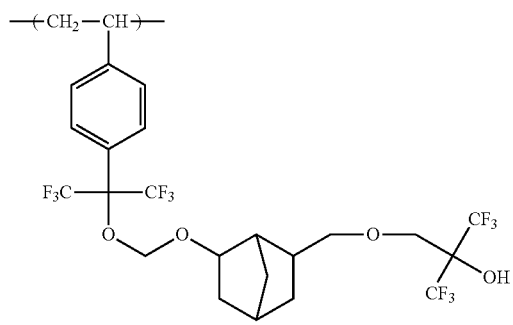
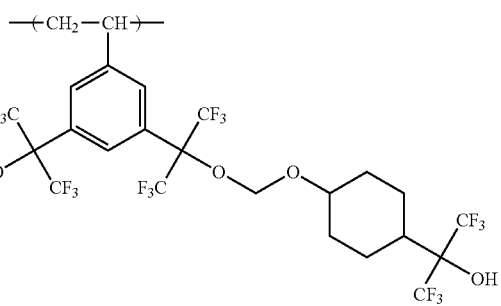

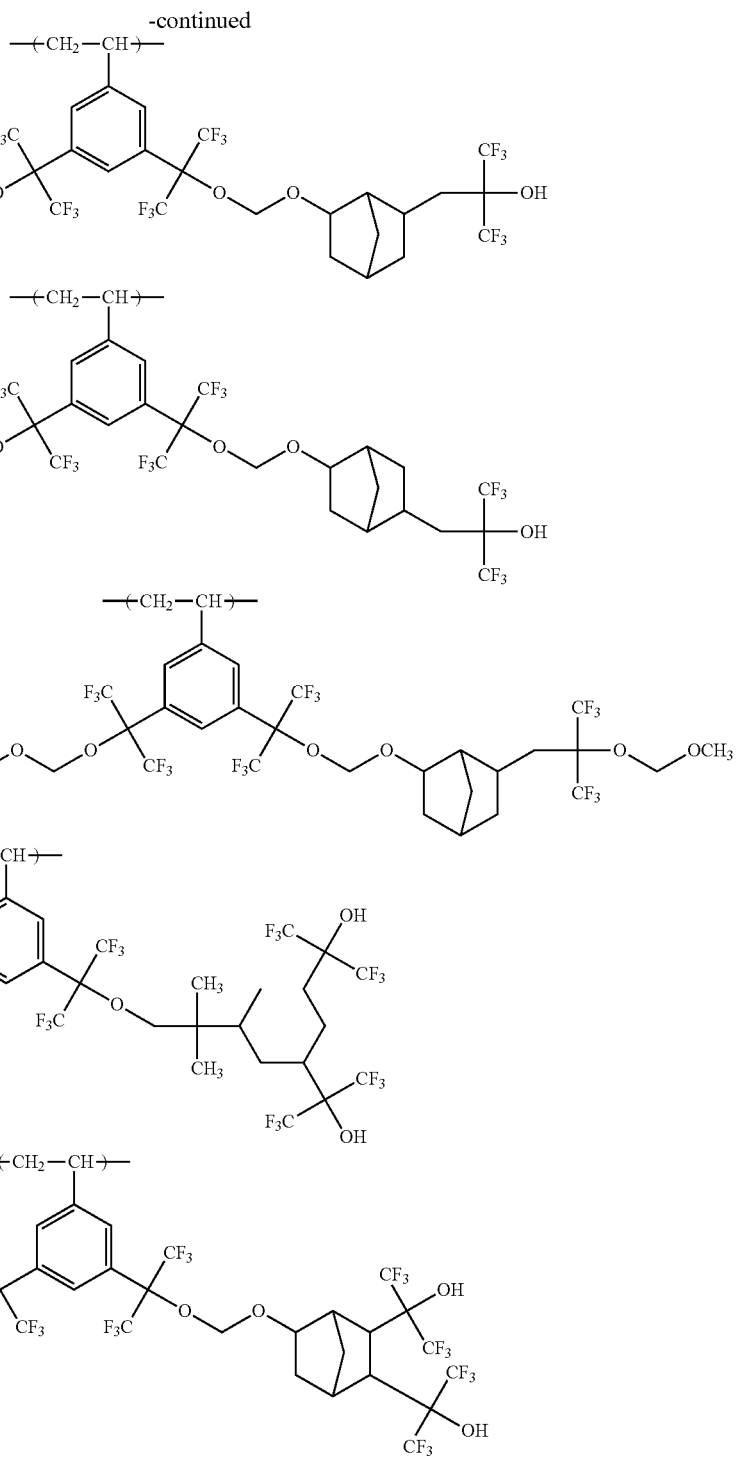

In formulae (XI) to (XIII), $R_0$ and $R_1$ each independently represents a hydrogen atom, a fluorine atom, or an alkyl group, a cycloalkyl group or an aryl group each of which may have a substituent.

$R_2$, $R_3$ and $R_4$ each independently represents an alkyl group, a cycloalkyl group or an aryl group each of which may have a substituent. Further, $R_0$ and $R_1$, $R_0$ and $R_2$, and $R_3$ and $R_4$ may be bonded to each other to form a ring.

As the alkyl group represented by $R_0$ to $R_4$, the same fluoroalkyl groups as represented by $R_{x1}$, $R_{x2}$ and $R_{x3}$ in formula (II) can be exemplified.

The cycloalkyl group represented by $R_0$ to $R_4$ may have a substituent, and may be monocyclic or polycyclic. As the monocyclic cycloalkyl group, a cycloalkyl group having from 3 to 8 carbon atoms is preferred, e.g., a cyclopropyl group, a cyclopentyl group, a cyclohexyl group, a cyclobutyl group and a cyclooctyl group can be exemplified. As the polycyclic cycloalkyl group, a cycloalkyl group having from 6 to 20 carbon atoms is preferred, e.g., an adamantyl group, a norbornyl group, an isoboronyl group, a camphanyl group, a dicyclopentyl group, an α-pinel group, a tricyclodecanyl group, a tetracyclododecyl group and an androstanyl group can be exemplified. Further, a part of the carbon atoms in the cycloalkyl group may be substituted with a hetero atom, e.g., an oxygen atom.

The aryl group represented by $R_0$ to $R_4$ may have a substituent, and an aryl group having from 6 to 10 carbon atoms is preferred, e.g., a phenyl group, a tolyl group, a dimethylphenyl group, a 2,4,6-trimethylphenyl group, a naphthyl group, an anthryl group, and a 9,10-dimethoxyanthryl group can be exemplified.

The specific examples of the repeating units represented by formulae (XI) to (XIII) are shown below, but the invention is not limited thereto.

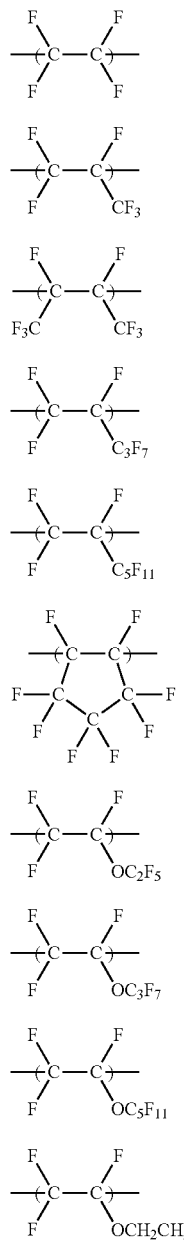

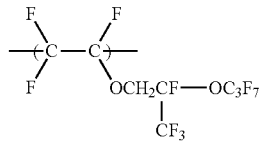

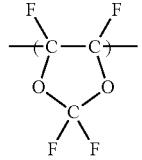

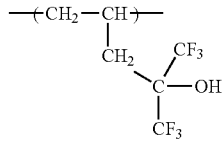

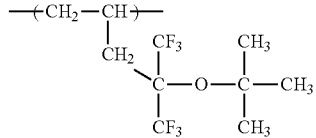

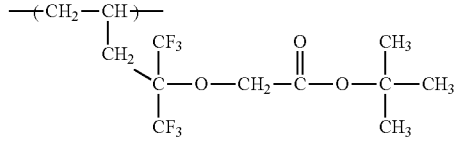

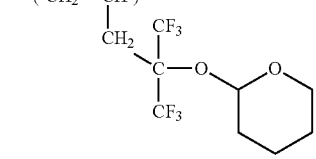

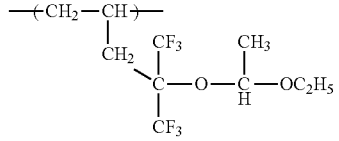

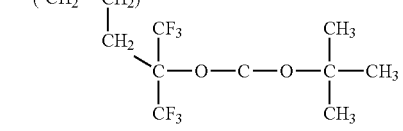

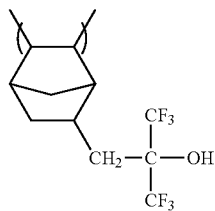

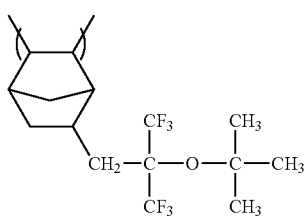
(F-20)

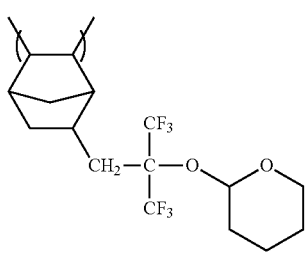
(F-21)

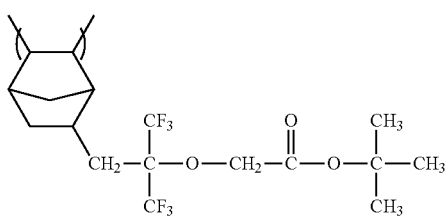
(F-22)

In formula (XIV), $R_{23}$ and $R_{24}$ may be the same or different, and each independently represents a hydrogen atom, a halogen atom, a cyano group, an alkyl group, a fluoroalkyl group or an alkoxyl group.

Y represents a hydrogen atom or an organic group.

As the alkyl group represented by $R_{23}$ and $R_{24}$, the same alkyl groups as represented by $R_{k1}$ in formula (I) can be exemplified.

As the alkoxyl group represented by $R_{23}$ and $R_{24}$, the same alkoxyl groups as represented by $R_{k1}$ in formula (I) can be exemplified.

As the organic group represented by Y, the same organic groups as represented by Y in formula (I) can be exemplified.

The specific examples of the repeating units represented by formula (XIV) are shown below, but the invention is not limited thereto.

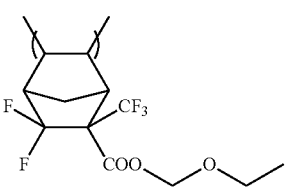

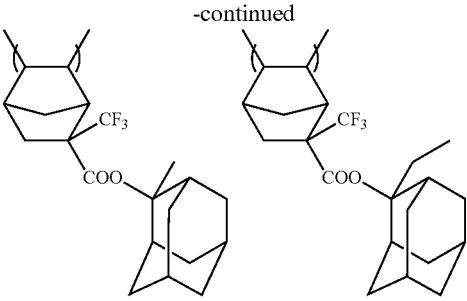

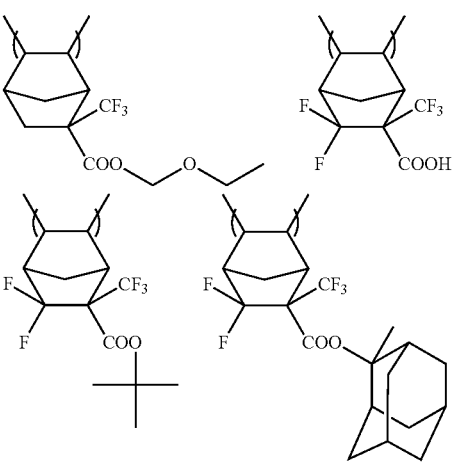

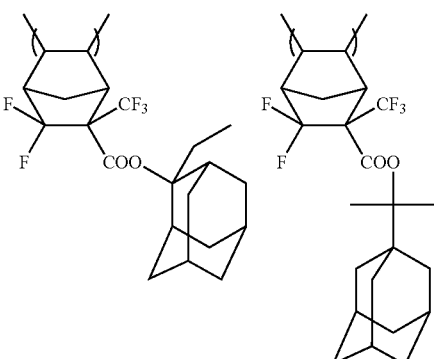

In formula (XIV), Rx represents a single bond or a divalent alkylene group; Ry represents a hydrogen tom, a fluorine atom or an alkyl group; and Y represents a hydrogen atom or an organic group.

In formula (XV), the divalent alkylene group represented by Rx preferably has from 1 to 6 carbon atoms, more preferably a methylene group, an ethylene group or a propylene group.

As the alkyl group represented by Ry, the same alkyl groups as represented by $R_{x1}$, $R_{x2}$ and $R_{x3}$ in formula (I) can be exemplified.

As the organic group represented by Y, the same organic groups as represented by Y in formula (I) can be exemplified.

The specific examples of the repeating units represented by formula (XV) are shown below, but the invention is not limited thereto.

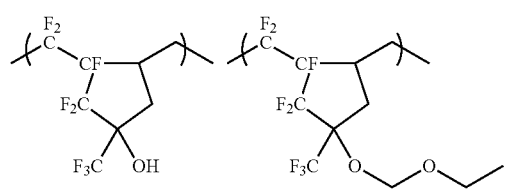

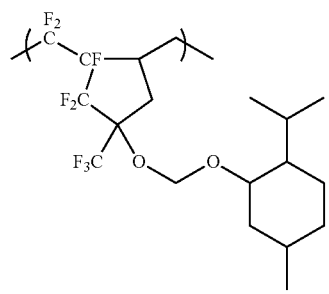

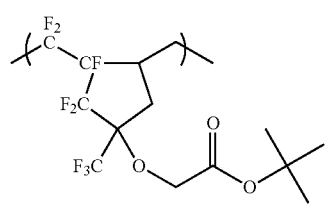

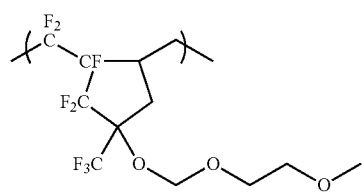

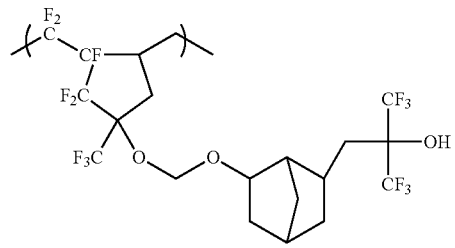

-continued

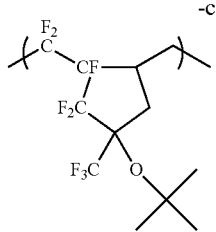

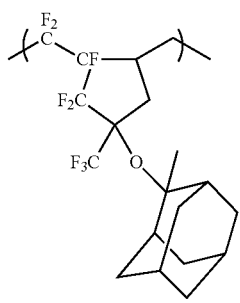

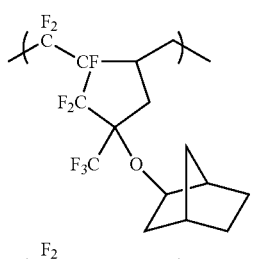

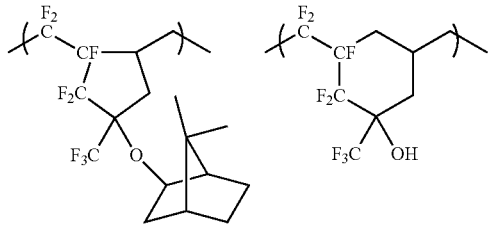

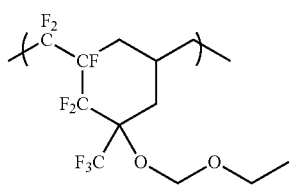

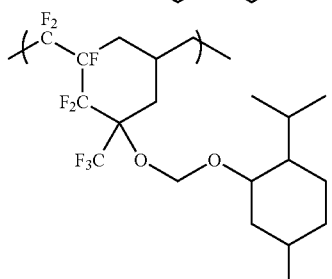

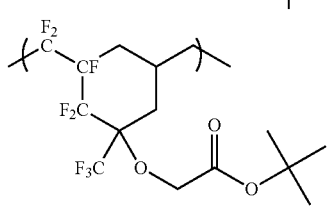

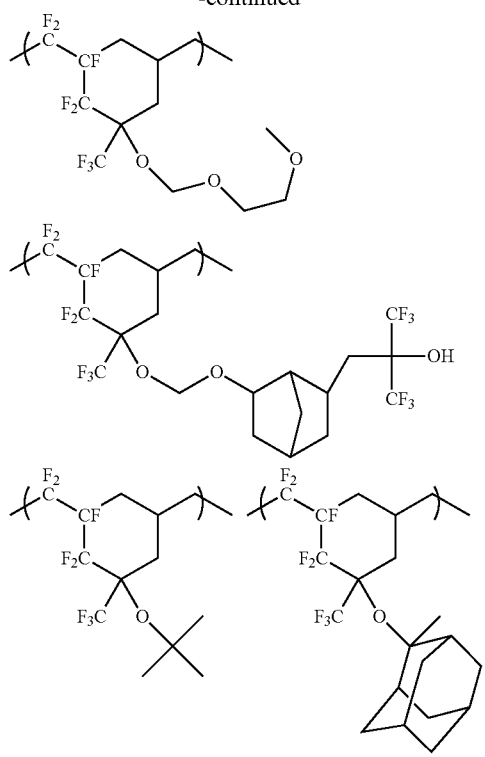

As these repeating units containing a fluorine atom, commercially available products can be used, or they can be synthesized by ordinary methods.

For example, the following monomer (IV-a) can be synthesized by the esterification of the following compound (a). Compound (a) can be synthesized from the following compound (b) which can be obtained by Diels-Alder reaction of furan and trifluoromethylacrylic acid.

(IV-a)

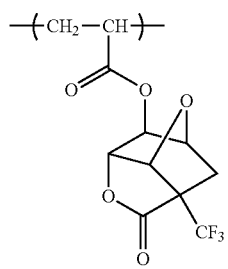

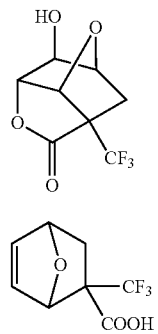

(a)

(b)

In the fluorine-containing resin in the invention, the proportion of the content of a repeating unit containing a fluorine atom in resin (A) is generally from 5 to 100 mol %, preferably from 7 to 80 mol %, more preferably from 10 to 30 mol %, still more preferably from 20 to 30 mol %, and most preferably from 25 to 30 mol %.

However, when the resist of the invention for immersion exposure is used for an ArF excimer laser, from the viewpoint of the transparency of the resin, when the repeating unit represented by formula (X) is copolymerized, the content is preferably from 1 to 15 mol %, more preferably from 2 to 7 mol %.

In addition to the above fluorine-containing repeating units, the resin of component (A) can be copolymerized with other optional repeating unit, and it is preferred to contain at least one repeating unit selected from the group consisting of a repeating unit having a partial structure containing alicyclic hydrocarbon represented by any of the following formulae (pI) to (pVI), and a repeating unit represented by the following formula (II-AB).

(pI)

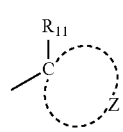

(pII)

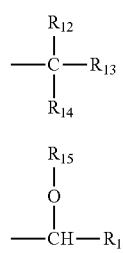

(pIII)

(pIV)

(pV)

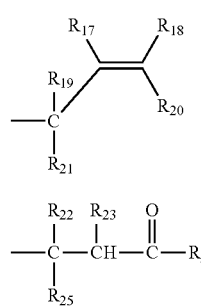

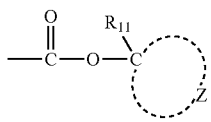 (pVI)

In formulae (pI) to (pVI), $R_{11}$ represents a methyl group, an ethyl group, an n-propyl group, an isopropyl group, an n-butyl group, an isobutyl group, or a sec-butyl group, and Z represents an atomic group necessary to form an alicyclic hydrocarbon group together with carbon atoms.

$R_{12}$, $R_{13}$, $R_{14}$, $R_{15}$ and $R_{16}$ each independently represents a straight chain or branched alkyl group having from 1 to 4 carbon atoms, or an alicyclic hydrocarbon group, provided that at least one of $R_{12}$ to $R_{14}$, or either $R_{15}$ or $R_{16}$ represents an alicyclic hydrocarbon group.

$R_{17}$, $R_{18}$, $R_{19}$, $R_{20}$ and $R_{21}$ each independently represents a hydrogen atom, a straight chain or branched alkyl group having from 1 to 4 carbon atoms or an alicyclic hydrocarbon group, provided that at least one of $R_{17}$ to $R_{21}$ represents an alicyclic hydrocarbon group, and either $R_{19}$ or $R_{21}$ represents a straight chain or branched alkyl group having from 1 to 4 carbon atoms or an alicyclic hydrocarbon.

$R_{22}$, $R_{23}$, $R_{24}$ and $R_{25}$ each independently represents a hydrogen atom, a straight chain or branched alkyl group having from 1 to 4 carbon atoms or an alicyclic hydrocarbon group, provided that at least one of $R_{22}$ to $R_{25}$ represents an alicyclic hydrocarbon group, and $R_{23}$ and $R_{24}$ may be bonded to each other to form a ring.

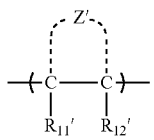 (II-AB)

In formula (II-AB), $R_{11}'$ and $R_{12}'$ each independently represents a hydrogen atom, a cyano group, a halogen atom or an alkyl group which may have a substituent; and Z' contains two bonded carbon atoms (C—C) and represents an atomic group to form an alicyclic structure which may have a substituent.

Formula (II-AB) is more preferably represented by the following formula (II-A) or (II-B).

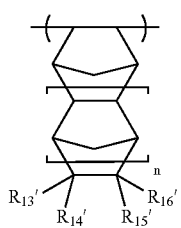 (II-A)

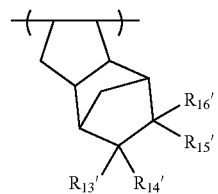 (II-B)

In formulae (II-A) and (II-B), $R_{13}'$, $R_{14}'$, $R_{15}'$ and $R_{16}'$ each independently represents a hydrogen atom, a halogen atom, a cyano group, —COOH, —COOR$_5$, a group decomposing by the action of an acid, —C(=O)—X-A'—R$_{17}'$, an alkyl group which may have a substituent, or an alicyclic hydrocarbon group; $R_5$ represents an alkyl group which may have a substituent, an alicyclic hydrocarbon group, or —Y group shown below; X represents an oxygen atom, a sulfur atom, —NH—, —NHSO$_2$— or —NHSO$_2$NH—; A' represents a single bond or a divalent linking group; at least two of $R_{13}'$ to $R_{16}'$ may be bonded to form a ring; n represents 0 or 1; $R_{17}'$ represents —COOH, —COOR$_5$, —CN, a hydroxyl group, an alkoxyl group which may have a substituent, —CO—NH—R$_6$, —CO—NH—SO$_2$—R$_6$, or —Y group shown below; and $R_6$ represents an alkyl group which may have a substituent or an alicyclic hydrocarbon group. —Y group;

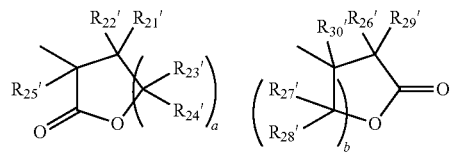

In —Y group, $R_{21}'$ to $R_{30}'$ each independently represents a hydrogen atom or an alkyl group which may have a substituent; and a and b each independently represents 1 or 2.

In formulae (pI) to (pVI), the alkyl group represented by $R_{12}$ to $R_{25}$ is a substituted or unsubstituted, straight chain or branched alkyl group having from 1 to 4 carbon atoms, e.g., a methyl group, an ethyl group, an n-propyl group, an isopropyl group, an n-butyl group, an isobutyl group, a sec-butyl group and a t-butyl group are exemplified.

As the examples of further substituents of the alkyl group, an alkoxyl group having from to 4 carbon atoms, a halogen atom (e.g., a fluorine atom, a chlorine atom, a bromine atom, an iodine atom), an acyl group, an acyloxy group, a cyano group, a hydroxyl group, a carboxyl group, an alkoxycarbonyl group and a nitro group can be exemplified.

The alicyclic hydrocarbon groups represented by $R_{11}$ to $R_{25}$ or the alicyclic hydrocarbon groups formed by Z and carbon atoms may be monocyclic or polycyclic. Specifically, groups having a monocyclic, bicyclic, tricyclic or tetracyclic structure having 5 or more carbon atoms can be exemplified. The carbon atom number is preferably from 6 to 30, and particularly preferably from 7 to 25. These alicyclic hydrocarbon groups may have a substituent.

As preferred alicyclic hydrocarbon groups, an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group, and a cyclododecanyl group can be exemplified. More preferred alicyclic hydrocarbon groups are an adamantyl group, a decalin residue, a norbornyl group, a cedrol group, a cyclohexyl group, a cycloheptyl group, a cyclooctyl group, a cyclodecanyl group and a cyclododecanyl group.

As the substituents of these alicyclic hydrocarbon groups, an alkyl group, a substituted alkyl group, a halogen atom, a hydroxyl group, an alkoxyl group, a carboxyl group and an alkoxycarbonyl group can be exemplified.

As the alkyl group, lower alkyl groups, e.g., a methyl group, an ethyl group, a propyl group, an isopropyl group and a butyl group are preferred, and more preferably the alkyl substituent is selected from the group consisting of a methyl group, an ethyl group, a propyl group and an isopropyl group. As the substituents of the substituted alkyl group, a hydroxyl group, a halogen atom and an alkoxyl group can be exemplified. As the alkoxyl group, alkoxyl groups having from 1 to 4 carbon atoms, e.g., a methoxy group, an ethoxy group, a propoxy group and a butoxy group can be exemplified.

The structures represented by formulae (pI) to (pVI) in the resin can be used for the protection of alkali-soluble groups. As the alkali-soluble groups, various groups well known in this technical field can be exemplified.

Specifically, as the alkali-soluble groups, a carboxylic acid group, a sulfonic acid group, a phenol group and a thiol group are exemplified, preferably a carboxylic acid group and a sulfonic acid group.

As the alkali-soluble groups protected with the structures represented by the above formulae (pI) to (pVI) in the above resins, the structure wherein the hydrogen atom of the carboxyl group is substituted with any of the structures represented by formulae (pI) to (pVI) is preferably exemplified.

In formula (II-AB), $R_{11}'$ and $R_{12}'$ each independently represents a hydrogen atom, a cyano group, a halogen atom or an alkyl group which may have a substituent; and Z' contains two bonded carbon atoms (C—C) and represents an atomic group to form an alicyclic structure which may have a substituent.

As the halogen atom represented by $R_{11}'$ and $R_{12}'$, a chlorine atom, a bromine atom, a fluorine atom and an iodine atom can be exemplified.

As the alkyl group represented by $R_{11}'$, $R_{12}'$, $R_{21}'$ to $R_{30}'$, a straight chain or branched alkyl group having from 1 to 10 carbon atoms is preferred, more preferably a straight chain or branched alkyl group having from 1 to 6 carbon atoms, and still more preferably a methyl group, an ethyl group, a propyl group, an isopropyl group, an n-butyl group, an isobutyl group, a sec-butyl group and a t-butyl group are exemplified.

As further substituents of the alkyl group, a hydroxyl group, a halogen atom, a carboxyl group, an alkoxyl group, an acyl group, a cyano group and an acyloxy group can be exemplified. As the halogen atom, a chlorine atom, a bromine atom, a fluorine atom and an iodine atom can be exemplified. As the alkoxyl group, an alkoxyl group having from 1 to 4 carbon atoms, e.g., a methoxy group, an ethoxy group, a propoxy group and a butoxy group can be exemplified. As the acyl group, a formyl group and an acetyl group can be exemplified, and as the acyloxy group, an acetoxy group can be exemplified.

The atomic group to form an alicyclic structure represented by Z' is an atomic group to form a repeating unit of alicyclic hydrocarbon which may have a substituent in the resin, and an atomic group to form a crosslinked alicyclic structure forming a repeating unit having crosslinked alicyclic hydrocarbon is particularly preferred.

As the skeleton of the alicyclic hydrocarbon to be formed, the same alicyclic hydrocarbon groups as represented by $R_{11}$ to $R_{25}$ in formulae (pI) to (pVI) can be exemplified.

The skeleton of the alicyclic hydrocarbon may have a substituent. As the substituents, the groups represented by $R_{13}'$ to $R_{16}'$ in formula (II-A) or (II-B) can be exemplified.

Of the repeating units having crosslinked alicyclic hydrocarbon, a repeating unit represented by formula (II-A) or (II-B) is more preferred.

Acid-decomposable groups contained in the resin of the invention may be contained in the above —C(=O)—X-A'-$R_{17}'$, or may be contained as the substituent of Z' in formula (II-AB).

The structure of acid-decomposable group is represented by —C(=O)—$X_1$—$R_0$.

In the formula, $R_0$ represents a tertiary alkyl group, e.g., a t-butyl group or a t-amyl group, an isoboronyl group, a 1-alkoxyethyl group, e.g., a 1-ethoxyethyl group, a 1-butoxyethyl group, a 1-isobutoxyethyl group or a 1-cyclohexyloxyethyl group, an alkoxymethyl group, e.g., a 1-methoxymethyl group or a 1-ethoxymethyl group, a 3-oxoalkyl group, a tetrahydropyranyl group, a tetrahydrofuranyl group, a trialkylsilyl ester group, a 3-oxocyclohexyl ester group, a 2-methyl-2-adamantyl group, or a mevalonic lactone residue. $X_1$ has the same meaning as X.

As the halogen atom represented by $R_{13}'$ to $R_{16}'$, a chlorine atom, a bromine atom, a fluorine atom and an iodine atom can be exemplified.

As the alkyl group represented by $R_5$, $R_6$, $R_{23}'$ to $R_{16}'$, a straight chain or branched alkyl group having from 1 to 10 carbon atoms is preferred, more preferably a straight chain or branched alkyl group having from 1 to 6 carbon atoms, and still more preferably a methyl group, an ethyl group, a propyl group, an isopropyl group, an n-butyl group, an isobutyl group, a sec-butyl group and a t-butyl group are exemplified.

The cyclic hydrocarbon group represented by $R_5$, $R_6$, $R_{13}'$ to $R_{16}'$ is a cyclic alkyl group or a crosslinked hydrocarbon, e.g., a cyclopropyl group, a cyclopentyl group, a cyclohexyl group, an adamantyl group, a 2-methyl-2-adamantyl group, a norbornyl group, a boronyl group, an isoboronyl group, a tricyclodecanyl group, a dicyclopentenyl group, a norbornanepoxy group, a menthyl group, an isomenthyl group, a neomenthyl group and a tetracyclododecanyl group can be exemplified.

As the ring formed by at least two of $R_{13}'$ to $R_{16}'$ by bonding, rings having from 5 to 12 carbon atoms, e.g., cyclopentene, cyclohexene, cycloheptane and cyclooctane can be exemplified.

As the alkoxyl group represented by $R_{17}'$, an alkoxyl group having from 1 to 4 carbon atoms, e.g., a methoxy group, an ethoxy group, a propoxy group and a butoxy group can be exemplified.

As the examples of further substituents of the alkyl group, cyclic hydrocarbon group and alkoxyl group, a hydroxyl group, a halogen atom, a carboxyl group, an alkoxyl group, an acyl group, a cyano group, an acyloxy group, an alkyl group and a cyclic hydrocarbon group can be exemplified. As the halogen atom, a chlorine atom, a bromine atom, a fluorine atom and an iodine atom can be exemplified. As the alkoxyl group, an alkoxyl group having from 1 to 4 carbon atoms, e.g., a methoxy group, an ethoxy group, a propoxy group and a butoxy group can be exemplified, as the acyl group, a formyl group and an acetyl group can be exemplified, and as the acyloxy group, an acetoxy group can be exemplified.

As the alkyl group and cyclic hydrocarbon group, those described above can be exemplified.

As the divalent linking group represented by A', a single group or a combination of two or more groups selected from the group consisting of an alkylene group, a substituted alkylene group, an ether group, a thioether group, a carbonyl group, an ester group, an amido group, a sulfonamido group, a urethane group and a urea group are exemplified.

In the resin in the invention, an acid-decomposable group can be contained in at least one repeating unit of a repeating unit having a partial structure containing alicyclic hydrocarbon represented by any of formulae (pI) to (pVI), a repeating unit represented by formula (II-AB), and a repeating unit of the later-described copolymerizable component.

Various substituents of $R_{13}'$ to $R_{16}'$ in formula (II-A) or (II-B) can also be used as the substituents of the atomic group to form an alicyclic structure in formula (II-AB), or atomic group Z to form a crosslinking alicyclic structure.

The specific examples of the repeating units represented by formula (II-A) or (II-B) are shown below, but the invention is not limited thereto.

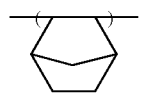

[II-1]

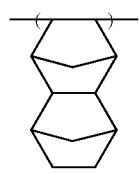

[II-2]

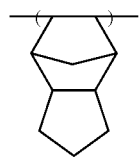

[II-3]

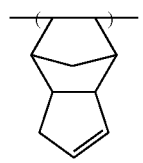

[II-4]

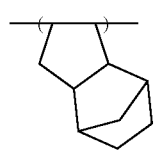

[II-5]

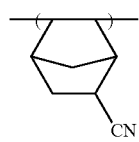

[II-6]

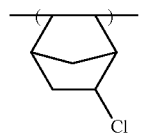

[II-7]

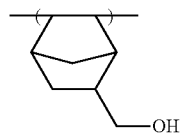

[II-8]

-continued

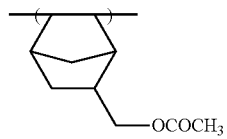

[II-9]

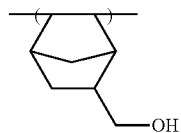

[II-10]

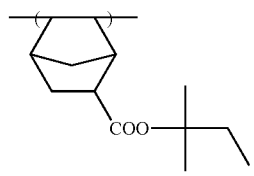

[II-11]

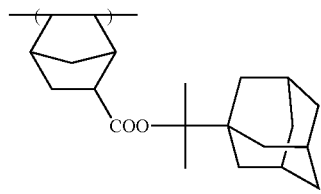

[II-12]

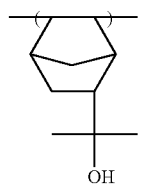

[II-13]

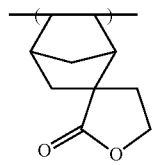

[II-14]

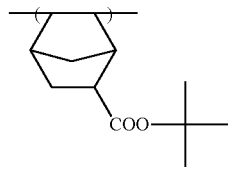

[II-15]

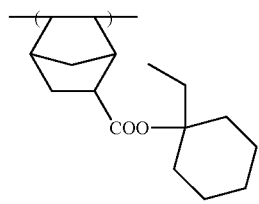

[II-16]

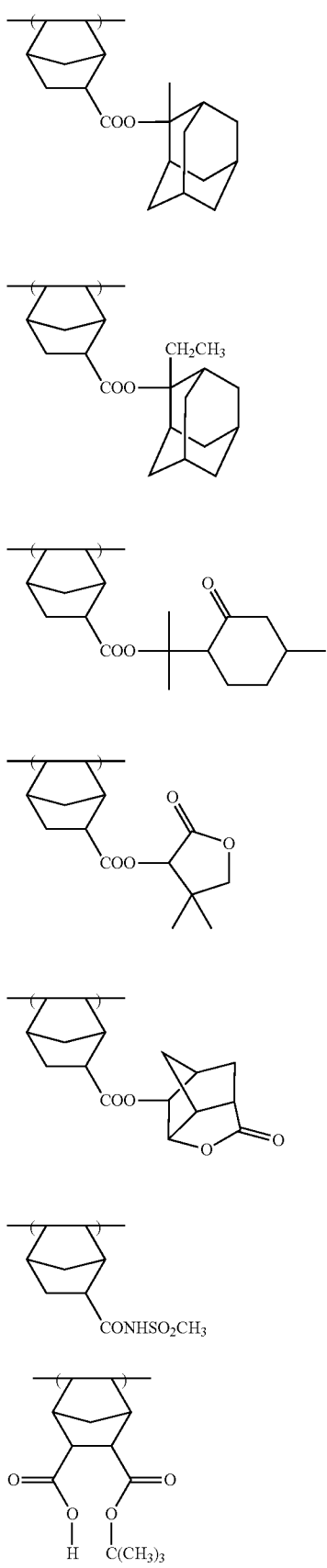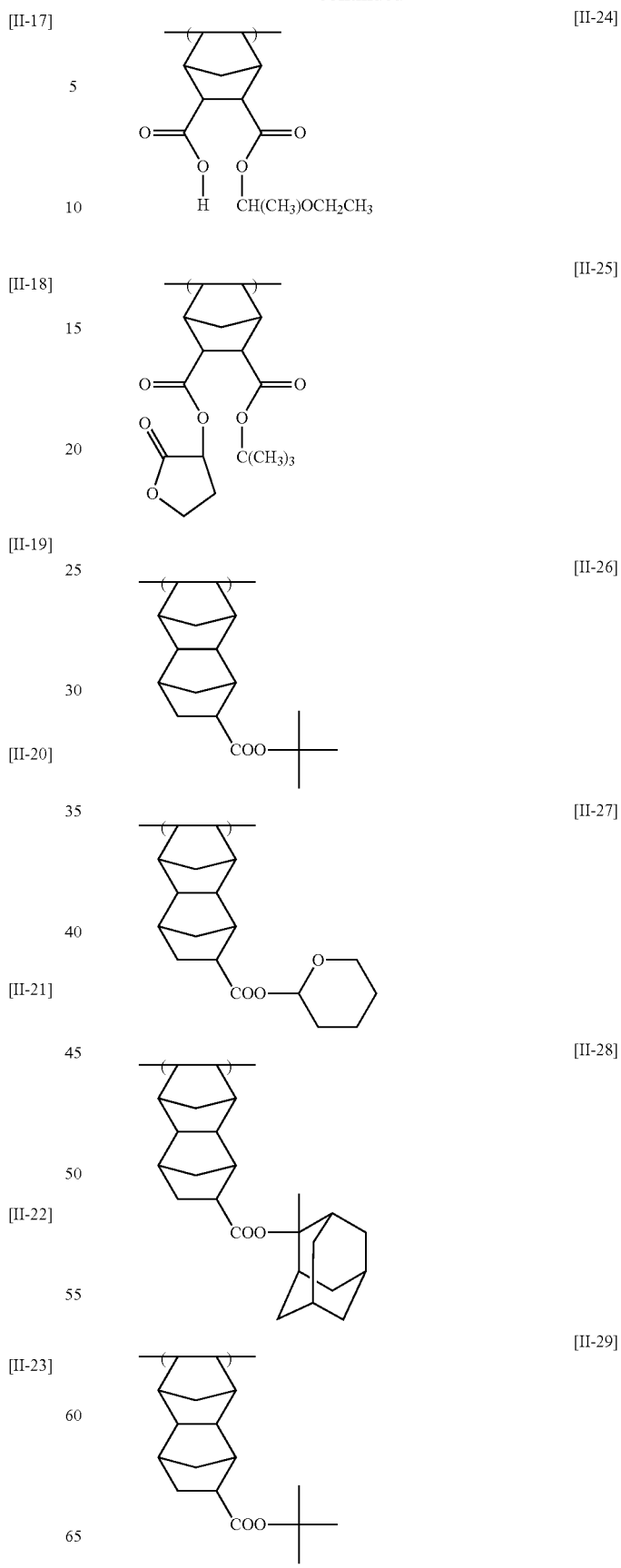

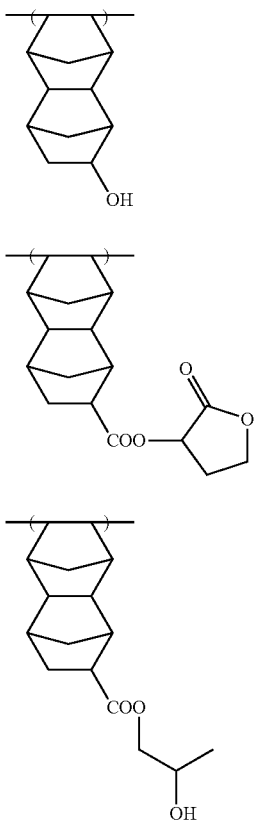

The resin in the invention preferably has a lactone group, more preferably has a repeating unit having a group having a lactone structure represented by the following formula (Lc) or any of formulae (V-1) to (V-5). Further, a group having a lactone structure may be directly bonded to the main chain.

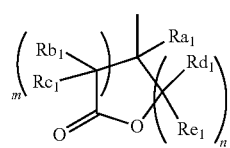
(Lc)

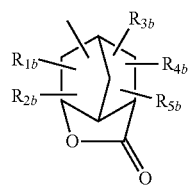
(V-1)

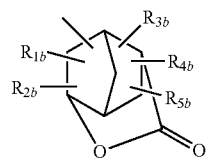
(V-2)

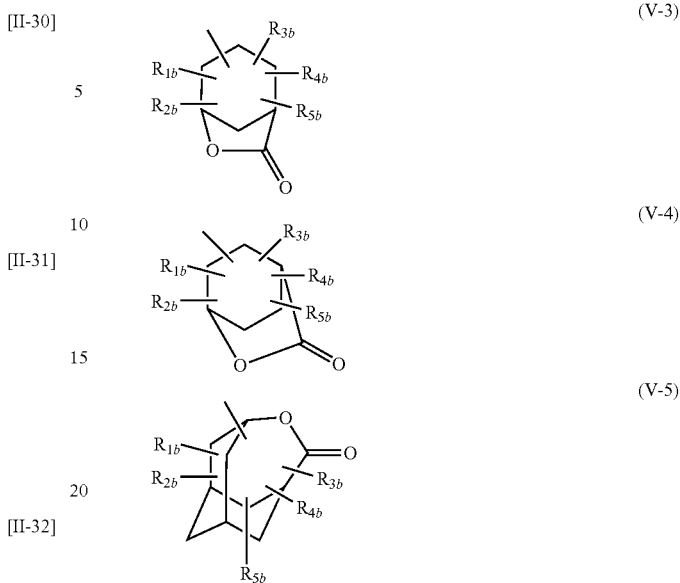

In formula (Lc), $Ra_1$, $Rb_1$, $Rc_1$, $Rd_1$ and $Re_1$ each independently represents a hydrogen atom or an alkyl group which may have a substituent; m and n each independently represents an integer of from 0 to 3, and m+n is from 2 to 6.

In formulae (V-1) to (V-5), $R_{1b}$, $R_{2b}$, $R_{3b}$, $R_{4b}$ and $R_{5b}$ each independently represents a hydrogen atom, an alkyl group, a cycloalkyl group, an alkoxyl group, an alkoxycarbonyl group, an alkylsulfonyl-imino group or an alkenyl group each of which may have a substituent. Two of $R_{1b}$ to $R_{5b}$ may be bonded to form a ring.

As the alkyl group represented by $Ra_1$ to $Re_1$ in formula (Lc), and as the alkyl group in the alkyl group, alkoxyl group, alkoxycarbonyl group and alkylsulfonylimino group represented by $R_{1b}$ to $R_{5b}$ in formulae (V-1) to (V-5), straight chain or branched alkyl groups are exemplified, and these alkyl groups may have a substituent.

As the repeating units having a group having a lactone structure represented by formula (Lc) or any of formulae (V-1) to (V-5), a repeating unit in which at least one of $R_{13}'$ to $R_{16}'$ in formula (II-A) or (II-B) has a group represented by formula (Lc) or any of formulae (V-1) to (V-5) (for example, $R_5$ in —$COOR_5$ represents a group represented by formula (Lc) or any of formulae (V-1) to (V-5)), or a repeating unit represented by the following formula (AI) can be exemplified.

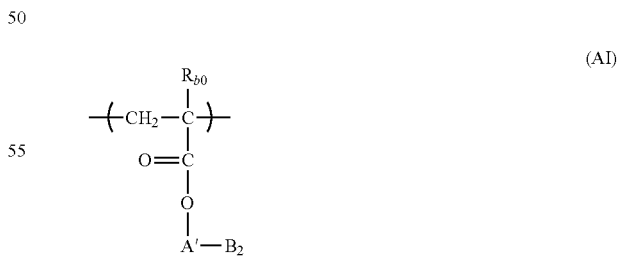
(AI)

In formula (AI), $R_{b0}$ represents a hydrogen atom, a halogen atom, or a substituted or unsubstituted alkyl group having from 1 to 4 carbon atoms. As the preferred substituents that the alkyl group represented by $R_{b0}$ may have, those described above as the preferred substituents that the alkyl group represented by $R_{1b}$ in formulae (V-1) to (V-5) may have can be exemplified.

As the halogen atom represented by $R_{b0}$, a fluorine atom, a chlorine atom, a bromine atom and an iodine atom can be exemplified. $R_{b0}$ preferably represents a hydrogen atom.

A' represents a single bond, an ether group, an ester group, a carbonyl group, an alkylene group, or a divalent linking group obtained by combining these groups.

$B_2$ represents a group represented by formula (Lc) or any of formulae (V-1) to (V-5).

The specific examples of the repeating units having a group having a lactone structure are shown below, but the invention is not limited thereto.

(In the formulae, Rx represents H, $CH_3$ or $CF_3$.)

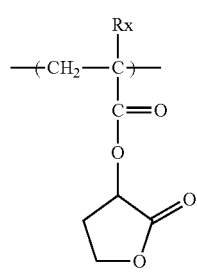

(IV-1)

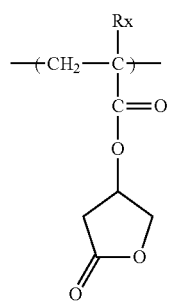

(IV-2)

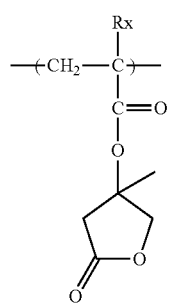

(IV-3)

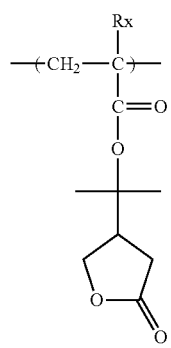

(IV-4)

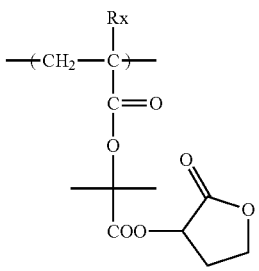

(IV-5)

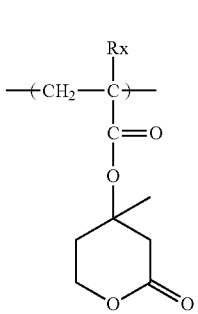

(IV-6)

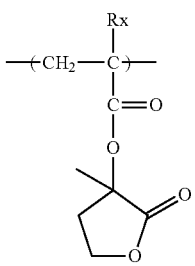

(IV-7)

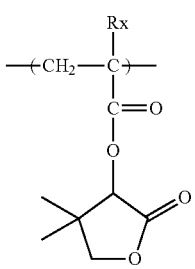

(IV-8)

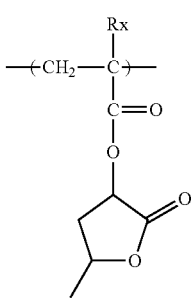

(IV-9)

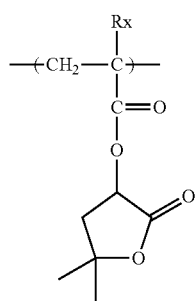 (IV-10)
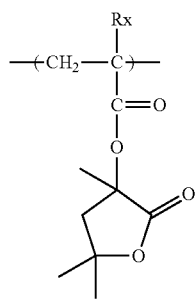 (IV-11)
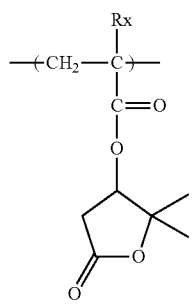 (IV-12)
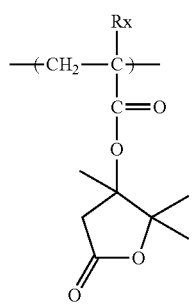 (IV-13)
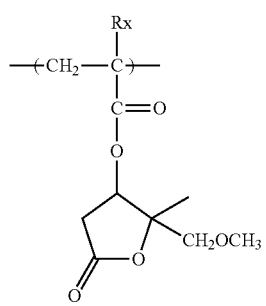 (IV-14)
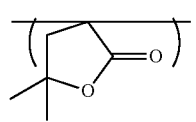 (IV-15)
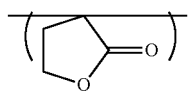 (IV-16)
(In the formulae, Rx represents H, CH₃ or CF₃.)
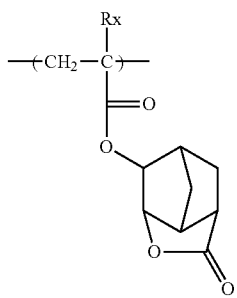 (Ib-1)
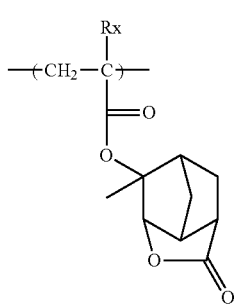 (Ib-2)
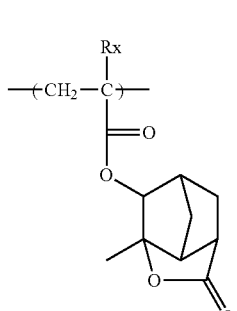 (Ib-3)
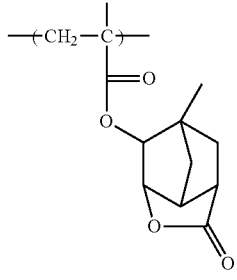 (Ib-4)

(Ib-5) 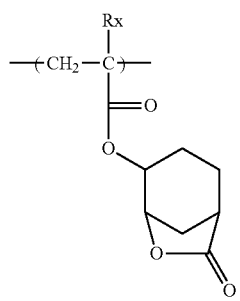
(Ib-6) 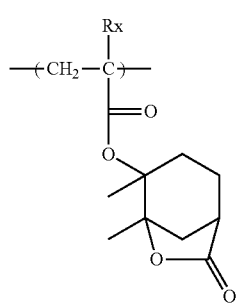
(Ib-7) 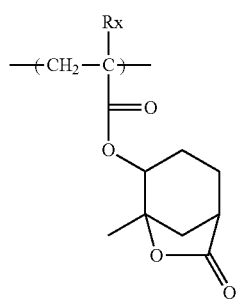
(Ib-8) 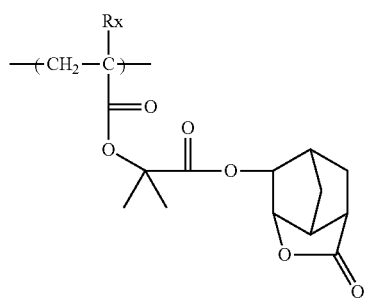
(Ib-9) 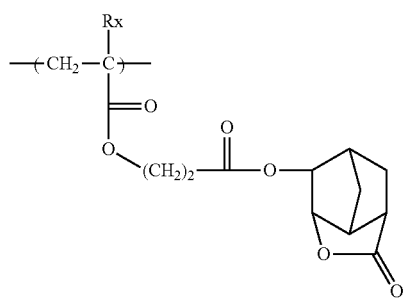
(Ib-10) 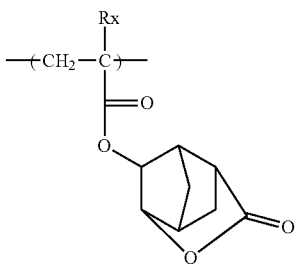
(Ib-11) 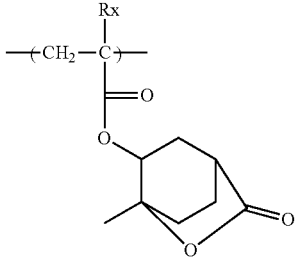
(In the formulae, Rx represents H, $CH_3$ or $CF_3$.)
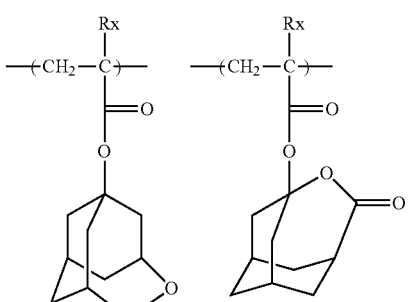
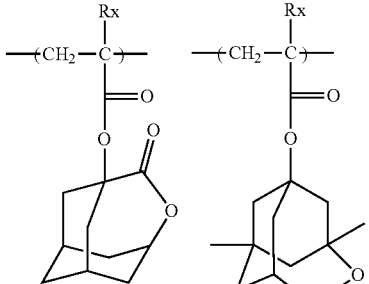
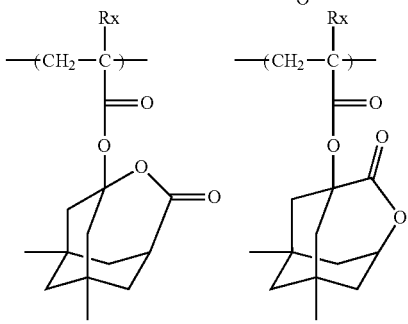

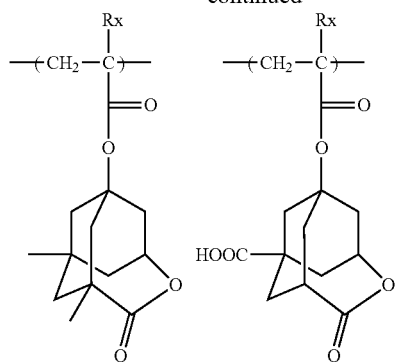

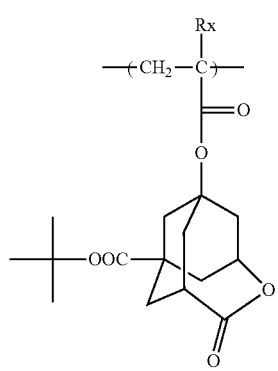

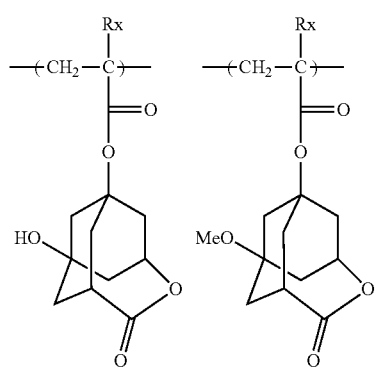

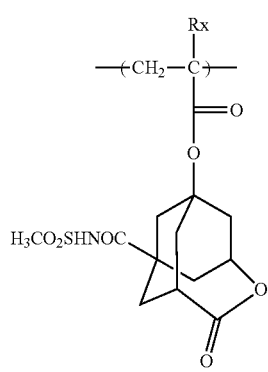

The resin in the invention may contain a repeating unit having a group represented by the following formula (VII).

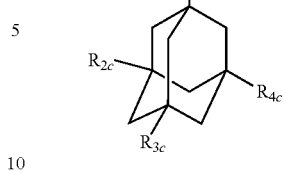

In formula (VII), $R_{2c}$, $R_{3c}$ and $R_{4c}$ each independently represents a hydrogen atom or a hydroxyl group, provided that at least one of $R_{2c}$, $R_{3c}$ and $R_{4c}$ represents a hydroxyl group.

The group represented by formula (VII) is preferably a dihydroxy body or a monohydroxy body, more preferably a dihydroxy body.

As the repeating unit having a group represented by formula (VII), a repeating unit in which at least one of $R_{13}'$ to $R_{16}'$ in formula (II-A) or (II-B) has a group represented by formula (VII) (for example, $R_5$ in —COOR$_5$ represents a group represented by formula (VII)), or a repeating unit represented by the following formula (AII) can be exemplified.

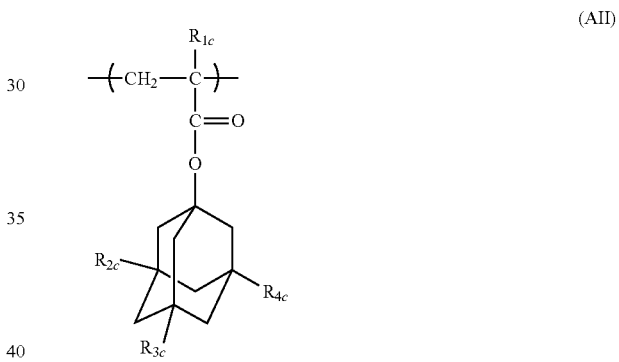

In formula (AII), $R_{1c}$ represents a hydrogen atom or a methyl group; and $R_{2c}$, $R_{3c}$ and $R_{4c}$ each independently represents a hydrogen atom or a hydroxyl group, provided that at least one of $R_{2c}$, $R_{3c}$ and $R_{4c}$ represents a hydroxyl group. It is preferred that two of $R_{2c}$, $R_{3c}$ and $R_{4c}$ represent a hydroxyl group.

The specific examples of the repeating units having a structure represented by formula (AII) are shown below, but the invention is not limited thereto.

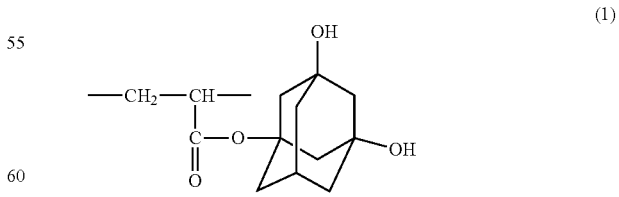

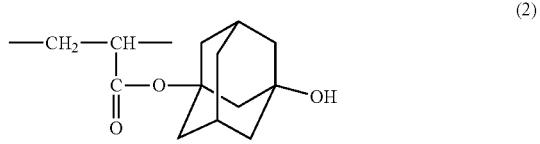

-continued

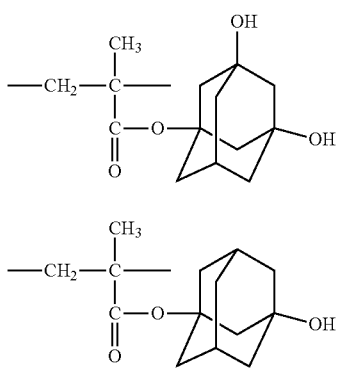

The resin in the invention may contain a repeating unit represented by the following formula (VIII).

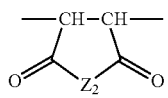

In formula (VIII), $Z_2$ represents —O— or —N($R_{41}$)—; $R_{41}$ represents a hydrogen atom, a hydroxyl group, an alkyl group or —OSO$_2$—$R_{42}$; and $R_{42}$ represents an alkyl group, a cycloalkyl group, or a camphor residue.

As the specific examples of the repeating units represented by formula (VIII), the following [I'-1] to [I'-7] can be exemplified, but the invention is not limited thereto.

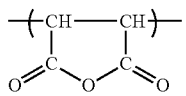

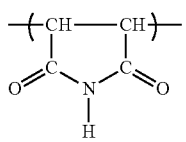

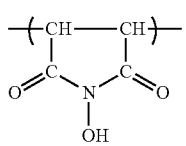

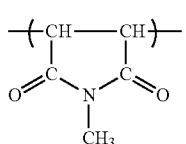

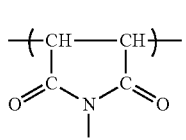

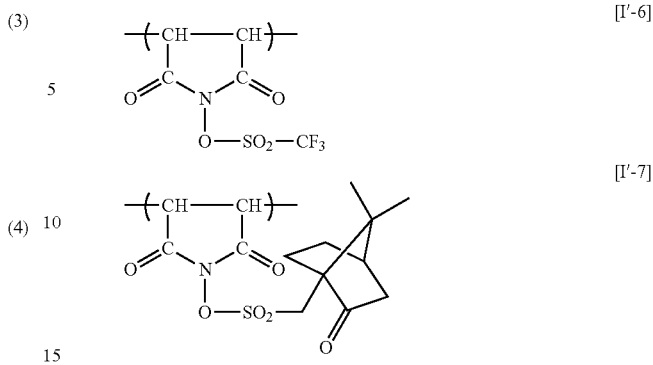

The resin in the invention can contain various repeating structural units besides the above repeating units for the purpose of adjusting dry etching resistance, standard developer aptitude, adhesion to a substrate, resist profile, and in addition to these, general requisite characteristics of resists, e.g., resolution, heat resistance and sensitivity.

As these repeating structural units, the repeating structural units corresponding to monomers shown below can be exemplified, but the invention is not limited thereto.

By containing various kinds of repeating structural units, fine adjustment of performances required of the resins, in particular fine adjustment of the following performances becomes possible, that is, (1) Solubility in a coating solvent,
(2) A film-forming property (a glass transition point),
(3) Alkali developability,
(4) Decrease of layer thickness (hydrophobic-hydrophilic property, selection of an alkali-soluble group),
(5) Adhesion of an unexposed area to a substrate, and
(6) Dry etching resistance.

The examples of such monomers include compounds having one addition polymerizable unsaturated bond selected from acrylic esters, methacrylic esters, acrylamides, methacryl-amides, allyl compounds, vinyl ethers and vinyl esters.

In addition to the aforementioned compounds, addition polymerizable unsaturated compounds copolymerizable with the monomers corresponding to the above various repeating structural units may be used for copolymerization.

In the resin of the invention, the molar ratio of the content of each repeating structural unit is arbitrarily selected to adjust dry etching resistance, standard developer aptitude, adhesion to the substrates of resists, and resist profile of the resist, in addition to these, to adjust general requisite characteristics of resists, e.g., resolution, heat resistance and sensitivity.

In the resin of the invention, the content of a repeating unit having a partial structure containing alicyclic hydrocarbon represented by any of formulae (pI) to (pVI) is preferably from 20 to 70 mol % in all the repeating structural units, more preferably from 24 to 65 mol %, and still more preferably from 28 to 60 mol %.

In the resin of the invention, the content of a repeating unit represented by formula (II-AB) is preferably from 10 to 60 mol % in all the repeating structural units, more preferably from 15 to 55 mol %, and still more preferably from 20 to 50 mol %.

The content of repeating structural units on the basis of the monomers of the further copolymer components in the resin can also be optionally set according to the desired resist performances, and the content is generally preferably 99 mol % or less based on the total mol number of a repeating structural unit having a partial structure containing alicyclic hydrocarbon represented by any of formulae (pI) to (pVI) and a repeating unit represented by formula (II-AB), more preferably 90 mol % or less, and still more preferably 80 mol % or less.

The fluorine-containing resins for use in the invention can be synthesized according to ordinary methods (e.g., radical polymerization). For example, as ordinary methods, a monomer seed is put in a reaction vessel at a time or in parts during the course of the reaction, and according to necessity the monomer is dissolved in a reaction solvent such as cyclic ethers, e.g., tetrahydrofuran or 1,4-dioxane, ketones, e.g., methyl ethyl ketone, methyl isobutyl ketone or cyclohexanone, or the later-described solvents capable of dissolving the composition of the invention, e.g., propylene glycol monomethyl ether acetate or propylene glycol monomethyl ether, to make the monomer homogeneous. The solution is then heated, if necessary, under the inert gas atmosphere such as nitrogen or argon, and polymerization is initiated with commercially available radical polymerization initiator (e.g., azo initiators, peroxide and the like). If necessary, the initiator is further added at a time or in parts, and after completion of the reaction, the reaction system is put into a solvent, and a desired polymer is recovered as powder or solid. The reaction concentration is 10 mass % or more, preferably 15 mass % or more, and more preferably 20 mass % or more. The reaction temperature is from 10 to 150° C., preferably from 30 to 130° C., and more preferably from 50 to 100° C. "mass %" means weight % in this specification.

The repeating structural unit in the above specific example may be used one kind alone, or a plurality of repeating units may be used as mixture.

Further, a resin may be used one kind alone, or a plurality of resins may be used in combination.

The weight average molecular weight of the resins in the invention is preferably from 1,000 to 200,000 as the polystyrene equivalent by the GPC method, more preferably from 3,000 to 20,000. The weight average molecular weight of the above range is preferred for the compromising the heat resistance and dry etching resistance with developability and film-forming property.

The molecular weight distribution is generally from 1 to 5, preferably from 1 to 4, and more preferably from 1 to 3. The molecular weight distribution being 5 or less is preferred from the aspects of resolution, resist configuration, the prevention of chapping of the sidewall of the resist pattern and roughness properties.

In the positive resist composition of the invention, the blending amount of all the resin in the entire composition is preferably from 40 to 99.99 mass % in all the solids content of the resist, more preferably from 50 to 99.97 mass %.

(B) Compound Capable of Generating an Acid upon Irradiation with an Actinic Ray or Radiation:

Compounds capable of generating an acid upon irradiation with an actinic ray or radiation (hereinafter referred to as "acid generator" in some cases) used in a resist composition for immersion exposure are described below.

The acid generators for use in the invention can be selected from the compounds generally used as acid generators.

That is, photopolymerization initiators of photo-cationic polymerization, photopolymerization initiators of photo-radical polymerization, photo-decoloring agents of dyes, photo-discoloring agents, well-known compounds capable of generating an acid upon irradiation with an actinic ray or a radiation that are used in the process of micro-resist and the like, and the mixtures of these compounds can be optionally used as acid generators.

For example, diazonium salt, phosphonium salt, sulfonium salt, iodonium salt, imidosulfonate, oximesulfonate, diazodisulfone, disulfone, and o-nitrobenzyl sulfonate are exemplified.

Further, compounds obtained by introducing a group or a compound capable of generating an acid upon irradiation with an actinic ray or a radiation to the main chain or the side chain of the polymers, e.g., the compounds disclosed in U.S. Pat. No. 3,849,137, German U.S. Pat. No. 3,914,407, JP-A-63-26653, JP-A-55-164824, JP-A-62-69263, JP-A-63-146038, JP-A-63-163452, JP-A-62-153853 and JP-A-63-146029 can be used.

The compounds generating an acid by the action of lights disclosed in U.S. Pat. No. 3,779,778, EP-126712 can also be used.

As preferred acid generators, compounds represented by the following formula (ZI), (ZII) or (ZIII) can be exemplified.

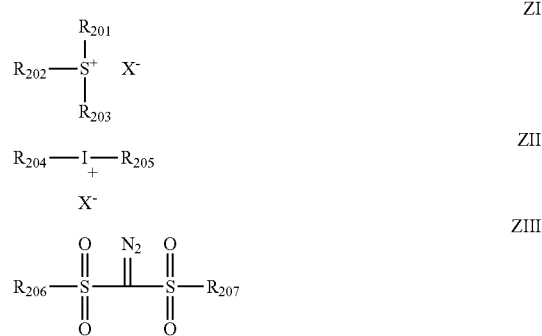

In formula (ZI), $R_{201}$, $R_{202}$ and $R_{203}$ each independently represents an organic group.

$X^-$ represents a non-nucleophilic anion.

The organic groups represented by $R_{201}$, $R_{202}$ and $R_{203}$ have generally from 1 to 30 carbon atoms, preferably from 1 to 20.

Two of $R_{201}$, $R_{202}$ and $R_{203}$ may be bonded to each other to form a cyclic structure, and an oxygen atom, a sulfur atom, an ester bond, an amido bond or a carbonyl group may be contained in the ring.

As the group formed by the bonding of two of $R_{201}$, $R_{202}$ and $R_{203}$, an alkylene group (e.g., a butylene group and a pentylene group) can be exemplified.

As the specific examples of the organic groups represented by $R_{201}$, $R_{202}$ and $R_{203}$, the corresponding groups in compounds (Z1-1), (Z1-2) and (Z1-3) described later can be exemplified.

A compound represented by formula (ZI) may be a compound having a plurality of structures represented by formula (ZI). For instance, compound (A) may be a compound having a structure that at least one of $R_{201}$, $R_{202}$ and $R_{203}$ of a compound represented by formula (ZI) is bonded to at least one of $R_{201}$, $R_{202}$ and $R_{203}$ of another compound represented by formula (ZI).

The following compounds (Z1-1), (Z1-2) and (Z1-3) can be exemplified as more preferred (ZI) components.

Compound (Z1-1) is an arylsulfonium compound wherein at least one of $R_{201}$, $R_{202}$ and $R_{203}$ in formula (ZI) represents an aryl group, that is, a compound having arylsulfonium as the cation.

All of $R_{201}$, $R_{202}$ and $R_{203}$ of the arylsulfonium compound may be aryl groups, or a part of $R_{201}$, $R_{202}$ and $R_{203}$ may be an aryl group and the remainder may be an alkyl group or a cycloalkyl group.

As the arylsulfonium compound, e.g., a triarylsulfonium compound, a diarylalkylsulfonium compound an aryldialkylsulfonium compound, a diarylcycloalkylsulfonium compound, and an aryldicycloalkylsulfonium compound are exemplified.

As the aryl group of the arylsulfonium compound, a phenyl group and a naphthyl group are preferred, and a phenyl group is more preferred. When the arylsulfonium compound has two or more aryl groups, these two or more aryl groups may be the same or different.

The alkyl group that the arylsulfonium compound has according to necessity is preferably a straight chain or branched alkyl group having from 1 to 15 carbon atoms e.g., a methyl group, an ethyl group, a propyl group, an n-butyl group, a sec-butyl group and a t-butyl group can be exemplified.

The cycloalkyl group that the arylsulfonium compound has according to necessity is preferably a cycloalkyl group having from 3 to 15 carbon atoms, e.g., a cyclopropyl group, a cyclobutyl group and a cyclohexyl group can be exemplified.

The aryl group, alkyl group and cycloalkyl group represented by $R_{201}$, $R_{202}$ and $R_{203}$ may have a substituent, e.g., an alkyl group (e.g., having from 1 to 15 carbon atoms), a cycloalkyl group (e.g., having from 3 to 15 carbon atoms), an aryl group (e.g., having from 6 to 14 carbon atoms), an alkoxyl group (e.g., having from 1 to 15 carbon atoms), a halogen atom, a hydroxyl group, and a phenylthio group are exemplified as the substituents. The preferred substituents are a straight chain or branched alkyl group having from 1 to 12 carbon atoms, a cycloalkyl group having from 3 to 12 carbon atoms, and an alkoxyl group having from 1 to 12 carbon atoms, and the most preferred substituents are an alkyl group having from 1 to 4 carbon atoms and an alkoxyl group having from 1 to 4 carbon atoms. The substituent may be substituted on any one of three of $R_{201}$, $R_{202}$ and $R_{203}$, or may be substituted on all of three. When $R_{201}$, $R_{202}$ and $R_{203}$ each independently represents an aryl group, it is preferred that the substituent be substituted on the p-position of the aryl group.

As the non-nucleophilic anions represented by $X^-$, e.g., a sulfonate anion, a carboxylate anion, a sulfonylimide anion, a bis(alkylsulfonyl)imide anion, and a tris(alkylsulfonyl)-methyl anion can be exemplified.

A non-nucleophilic anion is an anion which is extremely low in the property of bringing about a nucleophilic reaction, and capable of restraining the aging decomposition by an intramolecular nucleophilic reaction. The aging stability of the resist can be improved by a non-nucleophilic anion.

As the sulfonate anions, e.g., an aliphatic sulfonate anion, an aromatic sulfonate anion, and a camphorsulfonate anion can be exemplified.

As the carboxylate anions, e.g., an aliphatic carboxylate anion, an aromatic carboxylate anion, and an aralkylcarboxylate anion can be exemplified.

The aliphatic group in the aliphatic sulfonate anions is, e.g., an alkyl group having from 1 to 30 carbon atoms, specifically a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, and an eicosyl group, and a cycloalkyl group having from 3 to 30 carbon atoms, specifically a cyclopropyl group, a cyclopentyl group, a cyclohexyl group, an adamantyl group, a norbonyl group and a boronyl group can be exemplified.

As the aromatic group in the aromatic sulfonate anions, preferably an aryl group having from 6 to 14 carbon atoms, e.g., a phenyl group, a tolyl group and a naphthyl group can be exemplified.

The alkyl group, the cycloalkyl group and the aryl group in the aliphatic sulfonate anions and aromatic sulfonate anions may have a substituent.

As the substituents, e.g., a nitro group, a halogen atom (a fluorine atom, a chlorine atom, a bromine atom, an iodine atom), a carboxyl group, a hydroxyl group, an amino group, a cyano group, an alkoxyl group (preferably having from 1 to 5 carbon atoms), a cycloalkyl group (preferably having from 3 to 15 carbon atoms), an aryl group (preferably having from 6 to 14 carbon atoms), an alkoxycarbonyl group (preferably having from 2 to 7 carbon atoms), an acyl group (preferably having from 2 to 12 carbon atoms), and an alkoxycarbonyloxy group (preferably having from 2 to 7 carbon atoms), and an alkylthio group (preferably having from 1 to 15 carbon atoms) can be exemplified. As for the aryl group and the cyclic structure that each group has, an alkyl group (preferably having from 1 to 15 carbon atoms) can further be exemplified as the substituent.

As the aliphatic groups in the aliphatic carboxylate anions, the same aliphatic groups as in the aliphatic sulfonate anions can be exemplified.

As the aromatic groups in the aromatic carboxylate anions, the same aromatic groups as in the aromatic sulfonate anions can be exemplified.

As the aralkyl groups in the aralkylcarboxylate anions, an aralkyl group preferably having from 6 to 12 carbon atoms, e.g., a benzyl group, a phenethyl group, a naphthylmethyl group, a naphthylethyl group, and a naphthylmethyl group can be exemplified.

The aliphatic groups, the aromatic groups and the aralkyl groups in the aliphatic carboxylate anions, the aromatic carboxylate anions and the aralkylcarboxylate anions may each have a substituent. As the substituents, e.g., the same halogen atoms, alkyl groups, cycloalkyl groups, alkoxyl groups and alkylthio groups as in the aliphatic sulfonate anions can be exemplified.

As the sulfonylimide anion, e.g., a saccharin anion can be exemplified.

The alkyl group in the bis(alkylsulfonyl)imide anions and tris(alkylsulfonyl)methyl anions is preferably an alkyl group having from 1 to 5 carbon atoms, e.g., a methyl group, an ethyl group, a propyl group, an isopropyl group, an n-butyl group, an isobutyl group, a sec-butyl group, a pentyl group and a neopentyl group can be exemplified. These alkyl groups may have a substituent, e.g., a halogen atom, an alkyl group substituted with a halogen atom, an alkoxyl group and an alkylthio group can be exemplified, and an alkyl group substituted with a fluorine atom is preferred.

As other non-nucleophilic anions, e.g., fluorinated phosphorus, fluorinated boron and fluorinated antimony can be exemplified.

As the non-nucleophilic anions represented by $X^-$, an aliphatic sulfonate anion in which the α-position of the sulfonic acid is substituted with a fluorine atom, an aromatic sulfonate anion substituted with a fluorine atom or a group having a fluorine atom, bis(alkylsulfonyl)imide anion in which the alkyl group is substituted with a fluorine atom, and a tris (alkylsulfonyl)methide anion in which the alkyl group is substituted with a fluorine atom are preferred. Particularly preferred non-nucleophilic anions are an aliphatic perfluorosulfonate anion having from 4 to 8 carbon atoms and an aromatic sulfonate anion having a fluorine atom, and the most preferred non-nucleophilic anions are a nonafluorobutanesulfonate anion, a perfluorooctanesulfonate anion, a pentafluorobenzene-sulfonate anion and a 3,5-bis(trifluoromethyl)benzene-sulfonate anion.

Compound (Z1-2) is described below.

Compound (Z1-2) is a compound in the case where $R_{201}$, $R_{202}$ and $R_{203}$ in formula (ZI) each independently represents an organic group not having an aromatic ring. Here, an aromatic ring having a hetero atom is also included in the aromatic ring.

The organic groups not having an aromatic ring represented by $R_{201}$, $R_{202}$ and $R_{203}$ generally have from 1 to 30, preferably from 1 to 20, carbon atoms.

$R_{201}$, $R_{202}$ and $R_{203}$ each preferably represents an alkyl group, a cycloalkyl group, an allyl group or a vinyl group, more preferably a straight chain, branched or cyclic 2-oxoalkyl group, or an alkoxycarbonylmethyl group and most preferably a straight chain or branched 2-oxoalkyl group.

The alkyl group represented by $R_{201}$, $R_{202}$ and $R_{203}$ may be straight chain or branched, preferably a straight chain or branched alkyl group having from 1 to 10 carbon atoms, e.g., a methyl group, an ethyl group, a propyl group, a butyl group, and a pentyl group can be exemplified. As the alkyl group, more preferably a 2-(straight chain or branched)oxoalkyl group and an alkoxycarbonylmethyl group can be exemplified.

The cycloalkyl group represented by $R_{201}$, $R_{202}$ and $R_{203}$ is preferably a cycloalkyl group having from 3 to 10 carbon atoms, e.g., a cyclopentyl group, a cyclohexyl group and a norbonyl group can be exemplified. As the cycloalkyl group, more preferably a 2-oxocycloalkyl group can be exemplified.

The 2-oxoalkyl group may be straight chain, branched or cyclic, preferably a group having >C=O at the 2-position of the above alkyl group can be exemplified.

As the alkoxyl group in the alkoxycarbonylmethyl group, preferably an alkyl group having from 1 to 5 carbon atoms (e.g., a methyl group, an ethyl group, a propyl group, a butyl group, and a pentyl group) can be exemplified.

$R_{201}$, $R_{202}$ and $R_{203}$ may further be substituted with a halogen atom, an alkoxyl group (e.g., an alkoxyl group having from 1 to 5 carbon atoms), a hydroxyl group, a cyano group or a nitro group.

Two of $R_{201}$, $R_{202}$ and $R_{203}$ may be bonded to each other to form a cyclic structure, and an oxygen atom, a sulfur atom, an ester bond, an amido bond or a carbonyl group may be contained in the ring. As the group foamed by the bonding of two of $R_{201}$, $R_{202}$ and $R_{203}$, an alkylene group (e.g., a butylene group and a pentylene group) can be exemplified.

Compound (Z1-3) is a compound represented by the following formula (Z1-3), which compound has a phenacylsulfonium salt structure.

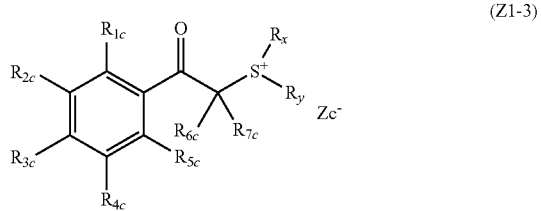

(Z1-3)

wherein $R_{1c}$, $R_{2c}$, $R_{3c}$, $R_{4c}$ and $R_{5c}$ each independently represents a hydrogen atom, an alkyl group, a cycloalkyl group, an alkoxyl group or a halogen atom; $R_{6c}$ and $R_{7c}$ each independently represents a hydrogen atom, an alkyl group or a cycloalkyl group; $R_x$ and $R_y$ each independently represents an alkyl group, a cycloalkyl group, an allyl group or a vinyl group.

Any two or more of $R_{1c}$ to $R_{5c}$, and $R_x$ and $R_y$ may be respectively bonded to form a cyclic structure, and an oxygen atom, a sulfur atom, an ester bond or an amido bond may be contained in these rings.

$Z_c^-$ represents a non-nucleophilic anion, and the same non-nucleophilic anions as $X^-$ in formula (ZI) can be exemplified.

The alkyl group represented by $R_{1c}$ to $R_{7c}$ is preferably a straight chain or branched alkyl group having from 1 to 20 carbon atoms, e.g., a methyl group, an ethyl group, a straight chain or branched propyl group, a straight chain or branched butyl group, and a straight chain or branched pentyl group can be exemplified.

The cycloalkyl group represented by $R_{1c}$ to $R_{7c}$ is preferably a cycloalkyl group having from 3 to 8 carbon atoms, e.g., a cyclopentyl group and a cyclohexyl group can be exemplified.

The alkoxyl group represented by $R_{1c}$ to $R_{5c}$ may be straight chain, branched or cyclic, e.g., an alkoxyl group having from 1 to 10 carbon atoms, preferably a straight chain or branched alkoxyl group having from 1 to 5 carbon atoms (e.g., a methoxy group, an ethoxy group, a straight chain or branched propoxy group, a straight chain or branched butoxy group and a straight chain or branched pentoxy group), a cycloalkoxyl group having from 3 to 8 carbon atoms (e.g., a cyclopentyloxy group and a cyclohexyloxy group) can be exemplified.

Preferably any of $R_{1c}$ to $R_{5c}$ represents a straight chain or branched alkyl group, a cycloalkyl group, or a straight chain, branched or cyclic alkoxyl group, and more preferably the sum total of the carbon atoms of $R_{1c}$ to $R_{5c}$ is from 2 to 15. By selecting such substituents, the solvent solubility is improved and the generation of particles in storing can be restrained.

As the alkyl group and the cycloalkyl group represented by $R_x$ and $R_y$, the same alkyl groups and cycloalkyl groups as in $R_{1c}$ to $R_{7c}$ can be exemplified, and a 2-oxoalkyl group, a 2-oxocycloalkyl group and an alkoxycarbonylmethyl group are more preferred.

As the 2-oxoalkyl group and the 2-oxocycloalkyl group, groups having >C=O at the 2-positions of the alkyl group and the cycloalkyl group represented by $R_{1c}$ to $R_{7c}$ can be exemplified.

As the alkoxyl groups in the alkoxycarbonylmethyl group, the same alkoxyl groups as in $R_{1c}$ to $R_{5c}$ can be exemplified.

As the groups formed by the bonding of $R_x$ and $R_y$, a butylene group and a pentylene group can be exemplified.

$R_x$ and $R_y$ each preferably represents an alkyl group having 4 or more carbon atoms, more preferably 6 or more, and still more preferably 8 or more, carbon atoms.

In formulae (ZII) and (ZIII), $R_{204}$, $R_{205}$, $R_{206}$ and $R_{207}$ each independently represents an aryl group, an alkyl group or a cycloalkyl group.

As the aryl group represented by $R_{204}$ to $R_{207}$, a phenyl group and a naphthyl group are preferred, and a phenyl group is more preferred.

As the alkyl group represented by $R_{204}$ to $R_{207}$, a straight chain or branched alkyl group having from 1 to 10 carbon atoms is preferred, e.g., a methyl group, an ethyl group, a propyl group, a butyl group, and a pentyl group can be exemplified.

As the cycloalkyl group represented by $R_{204}$ to $R_{207}$, a cycloalkyl group having from 3 to 10 carbon atoms is preferred, e.g., a cyclopentyl group, a cyclohexyl group and a norbonyl group can be exemplified.

As the substituents that $R_{204}$ to $R_{207}$ may have, an alkyl group (e.g., having from 1 to 15 carbon atoms), a cycloalkyl group (e.g., having from 3 to 15 carbon atoms), an aryl group (e.g., having from 6 to 15 carbon atoms), an alkoxyl group (e.g., having from 1 to 15 carbon atoms), a halogen atom, a hydroxyl group and a phenylthio group can be exemplified.

$X^-$ represents a non-nucleophilic anion, and the same non-nucleophilic anions as $X^-$ in formula (ZI) can be exemplified.

As preferred acid generators, the compound represented by the following formula (ZIV), (ZV) or (ZVI) can further be exemplified.

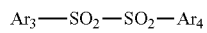  ZIV

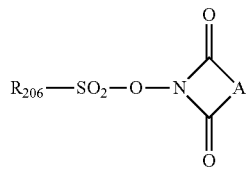  ZV

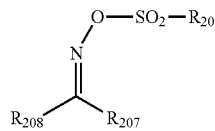  ZVI

In formulae (ZIV) to (ZVI), $Ar_3$ and $Ar_4$ each independently represents an aryl group.

$R_{206}$, $R_{207}$ and $R_{208}$ each independently represents an alkyl group, a cycloalkyl group or an aryl group, and these groups have the same meaning as the alkyl group, the cycloalkyl group or the aryl group represented by $R_{204}$ to $R_{207}$.

A represents an alkylene group, an alkenylene group or an arylene group.

Of the acid generators, a compound represented by formula (ZI), (ZII) or (ZIII) is more preferred.

A particularly preferred acid generator for use in the invention is an acid generator represented by the following formula (I):

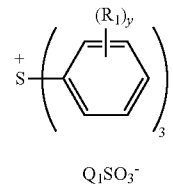

In formula (I), $R_1$ represents an alkyl group, an alicyclic hydrocarbon group, a hydroxyl group, a carboxyl group, an alkoxyl group or a halogen atom; y represents 0 or an integer of 1 to 5, when y is an integer of 2 or higher, two or more $R_1$'s may be the same or different; and $Q_1$ represents an alkyl group substituted with a fluorine atom, a cycloalkyl group substituted with a fluorine atom, an aryl group substituted with a fluorine atom, or an aryl group substituted with a fluorinated alkyl group.

The alkyl group represented by $R_1$ is preferably a straight chain or branched alkyl group having from 1 to 15 carbon atoms, e.g., a methyl group, an ethyl group, a propyl group, an n-butyl group, a sec-butyl group and a t-butyl group can be exemplified.

As the alicyclic hydrocarbon group represented by $R_1$, e.g., a cyclopropyl group, a cyclobutyl group, a cyclopentyl group, a cyclohexyl group, a norbornyl group and an adamantyl group can be exemplified.

As the alkyl group substituted with a fluorine atom represented by $Q_1$, e.g., $-CF_3$, $-C_2F_5$, $-n-C_3F_7$, $-CF(CF_3)_2$, $-CH(CF_3)_2$, $-CF_2(CH_2)_3CH_3$, $-(CF_2)_2OCF_2CF_3$, $-(CF_2)_2-O-(CH_2)_3CH_3$, $-(CF_2)_2-O-(CH_2)_{13}CH_3$, $-n-C_4F_9$, $-t-C_4F_9$, $-CF[(CF_2)_3CF_3]_2$, $-C[(CF_2)_3CF_3]_3$, $-(CF_2)_4-O-(CH_2)_{17}CH_3$, $-n-C_8F_{17}$, $-n-C_{11}F_{23}$ and $-(CF_2)_2O(CF_2)_2(CH_2)_3CH_3$ can be exemplified.

As the aryl group substituted with a fluorine atom represented by $Q_1$, e.g., a 2,3,4,5,6-pentafluorophenyl group, a 2,3,4-trifluorophenyl group, a 2,4-difluorophenyl group, a 4-fluorophenyl group, and a 4-undecanyloxy-2,3,5,6-tetrafluorophenyl group can be exemplified.

As the aryl group substituted with a fluorinated alkyl group represented by $Q_1$, e.g., a 3-trifluoromethylphenyl group, a 3,5-bis(trifluoromethyl)phenyl group, a 4-trifluoromethylphenyl group and a 4-n-nonafluorobutylphenyl group can be exemplified.

Of the compounds capable of generating an acid upon irradiation with an actinic ray or radiation, the examples of particularly preferred compounds are shown below.

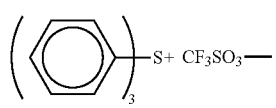 (z1)

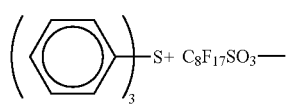 (z3)

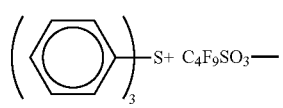 (z2)

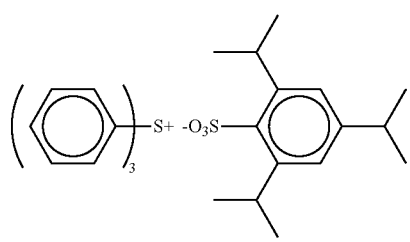 (z4)

-continued
(z5)
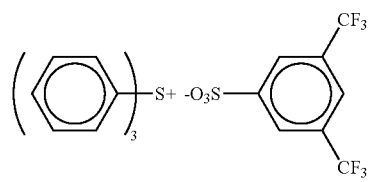
(z6)
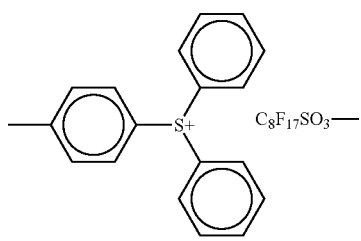
(z7)
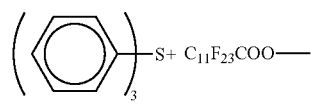
(z8)
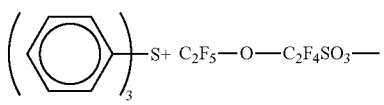
(z9)
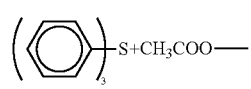
(z10)
(z11)
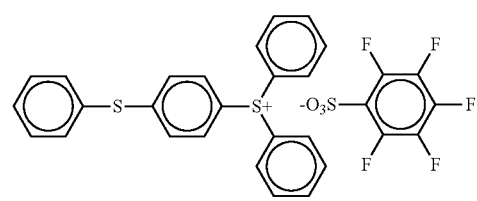
(z12)
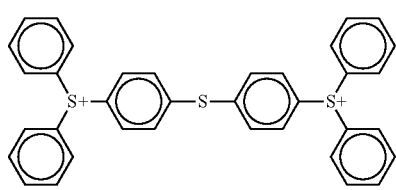
(z13)
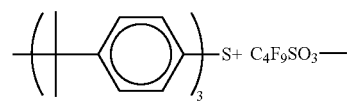
(z14)
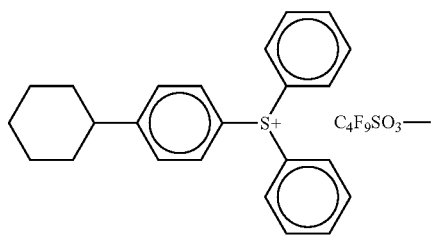
(z15)
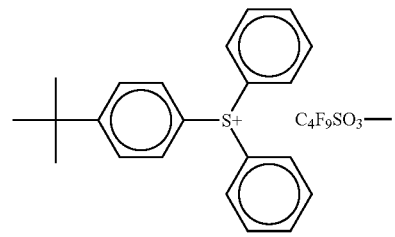
(z16)
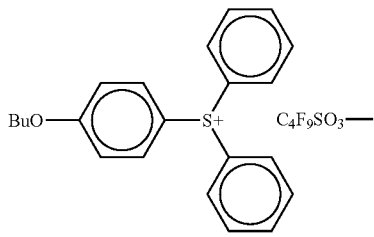
(z17)
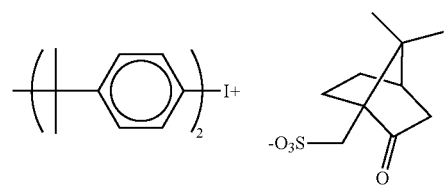
(z18)
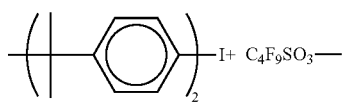
(z19)
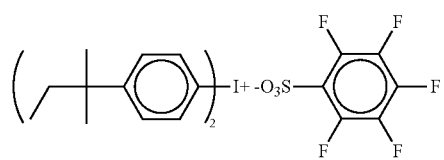
(z20)
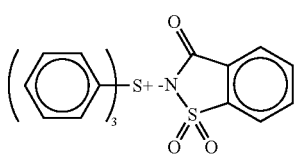

-continued
(z21) 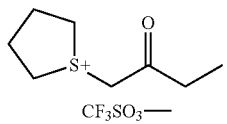
(z22) 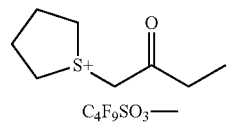
(z23) 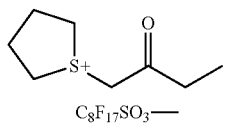
(z24) 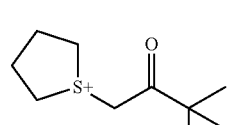
(z25) 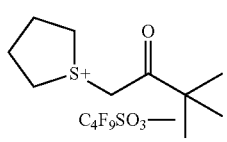
(z26) 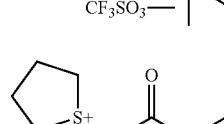
(z27) 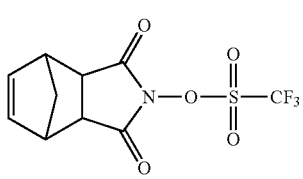
(z28) 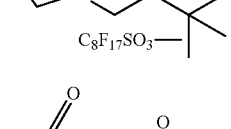
(z29) 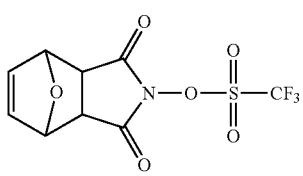
(z30) 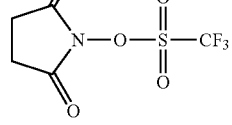
(z31) 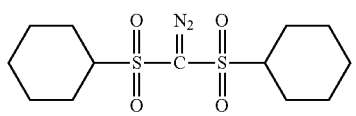
(z32) 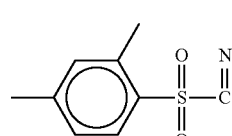
(z33) 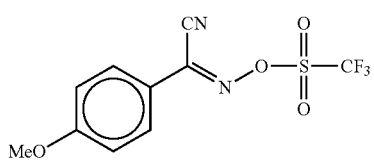
(z34) 
(z35) 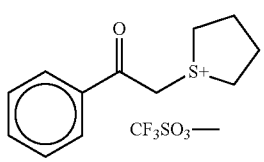
(z36) 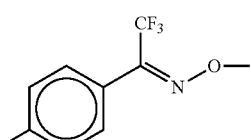
(z37) 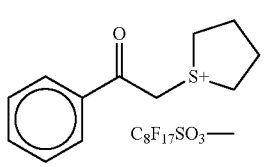
(z38) 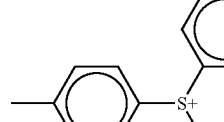

-continued
(z39) 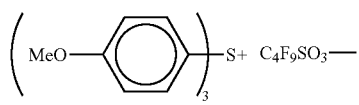
(z40) 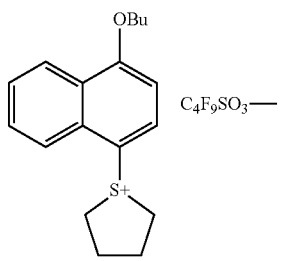
(z41) 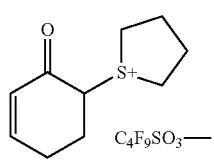
(z42) 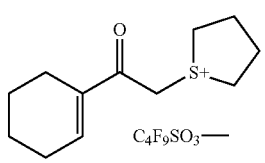
(z43) 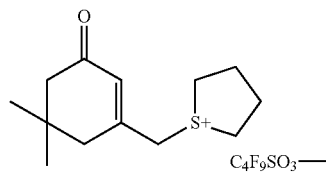
(z44) 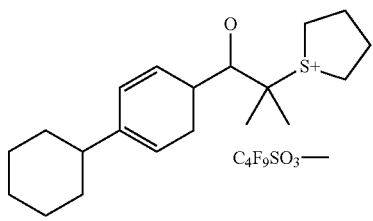
(z45) 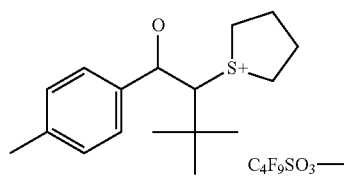
(z46) 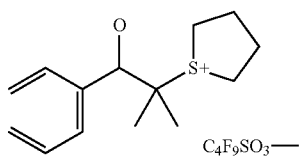
(z47) 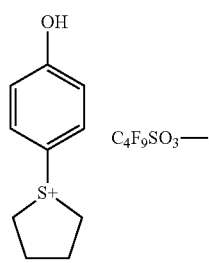
(z48) 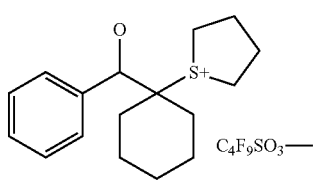
(z49) 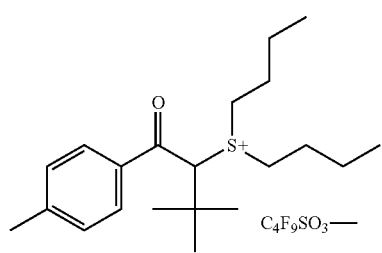
(z50) 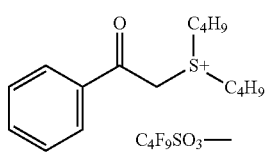
(z51) 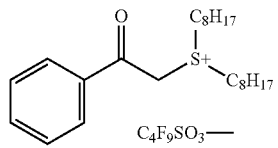
(z52) 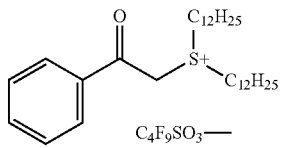

-continued
(z53)
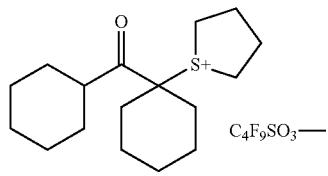
(z54)
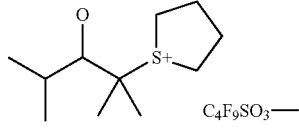
(z55)
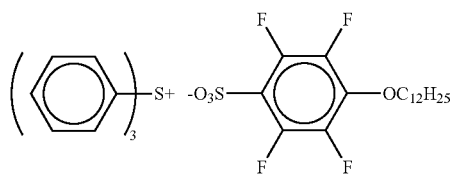
(z56)
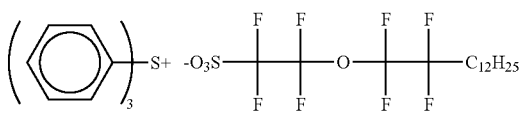
(z57)
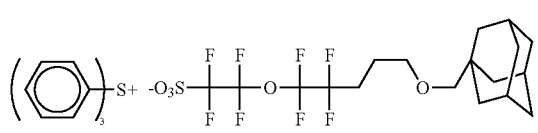
(z58)
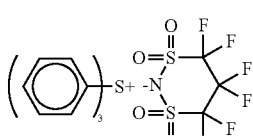
(z59)
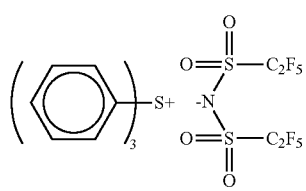
Ba-1
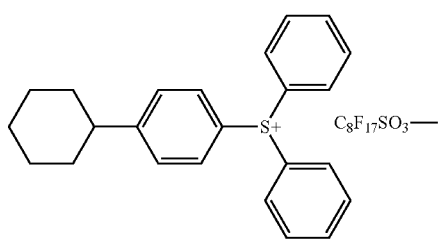
Ba-2
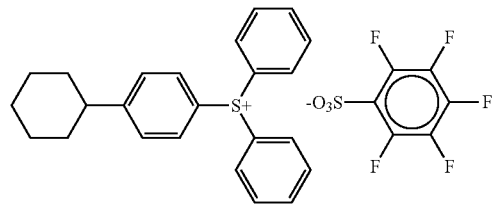
Ba-3
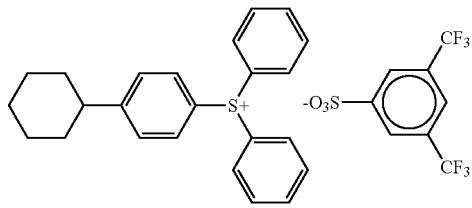
Ba-4
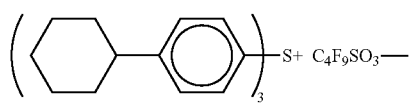
Ba-5
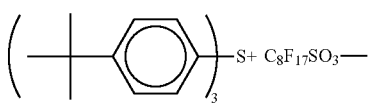
Ba-6
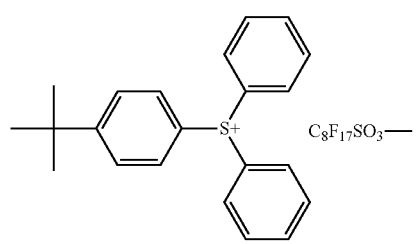
Ba-7
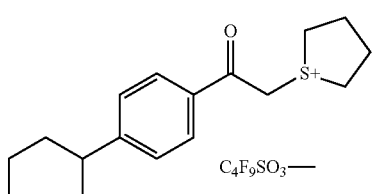
Ba-8
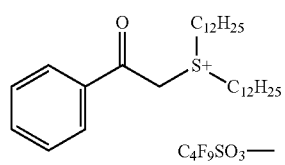
Ba-9
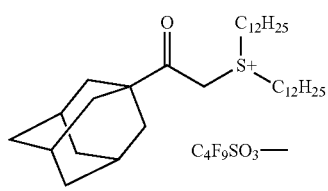

-continued
Ba-10
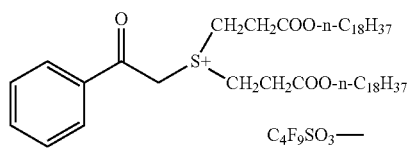
Ba-11
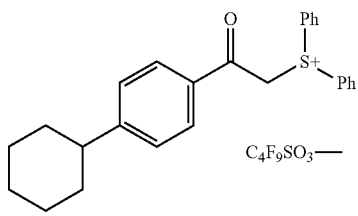
Ba-12
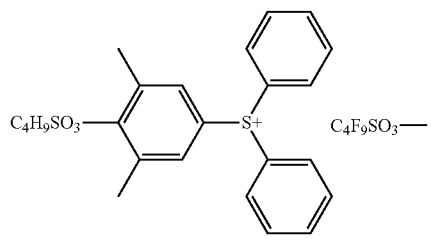
Ba-13
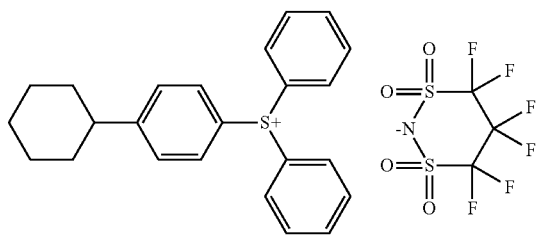
Ba-14
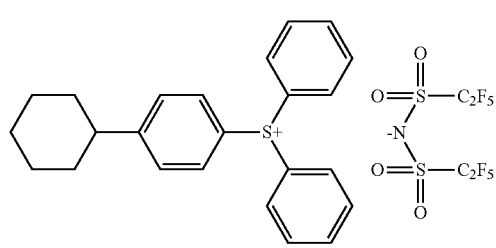
Bb-1
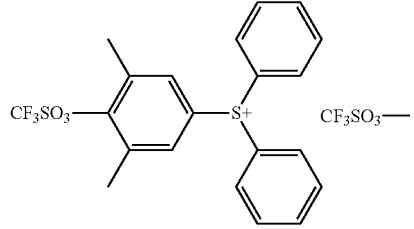
Bb-2
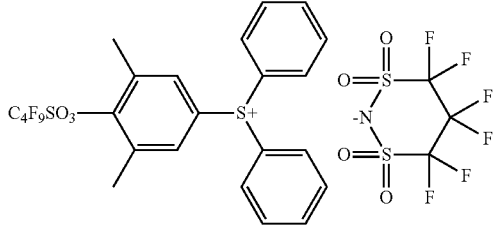
Bb-3
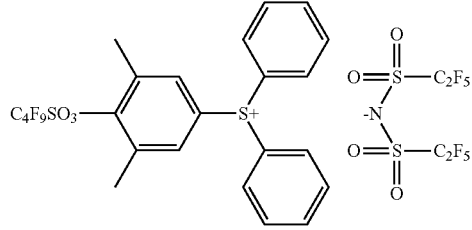
Bb-4
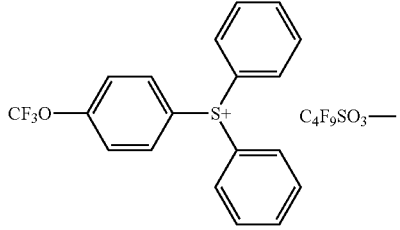
Bb-5
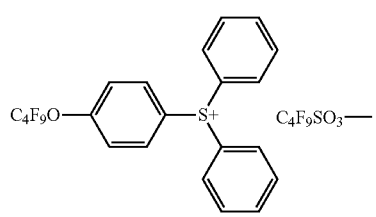
Bb-6
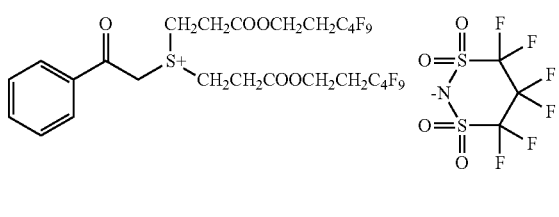
Bb-7
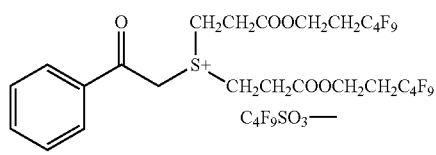
Bb-8
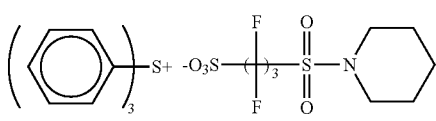
Bc-1

-continued
Bc-2
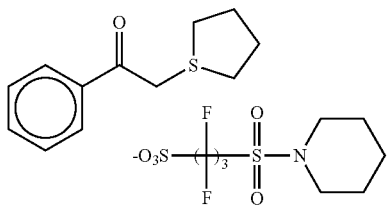
Bc-3
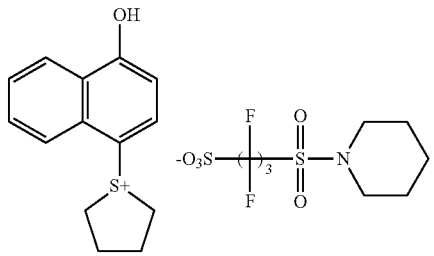
Bc-4
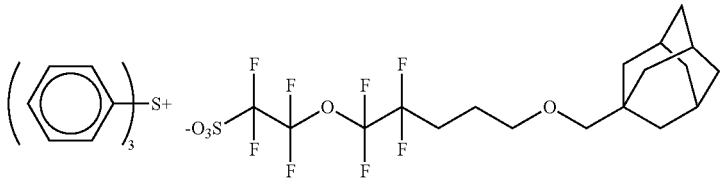
Bc-5
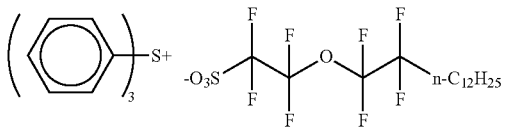
Bc-6
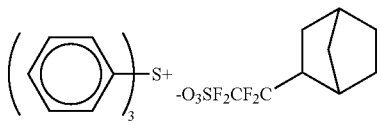
Bc7
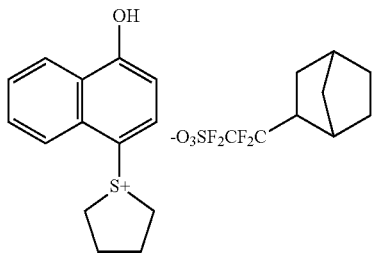
Bc-8
Bc-9
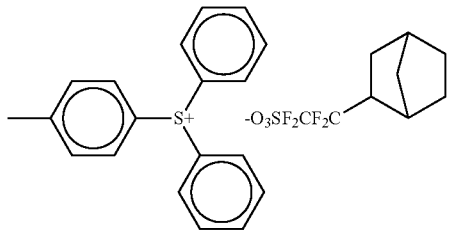
Bc-10
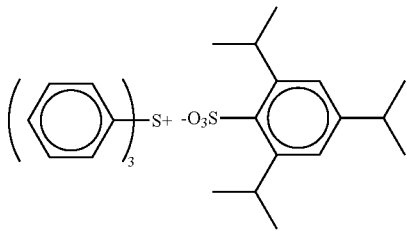
Bc-11
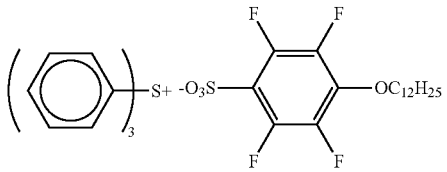
Bc-12
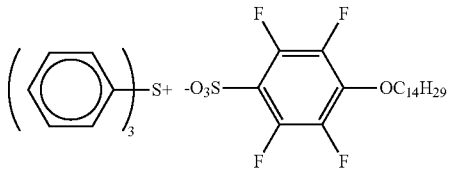
Bc-13
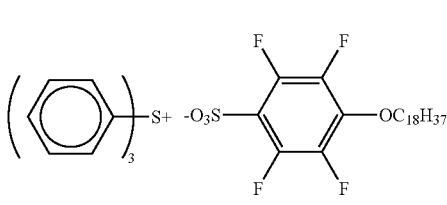
Bc-14
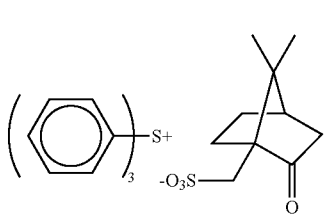

-continued
Bc-15
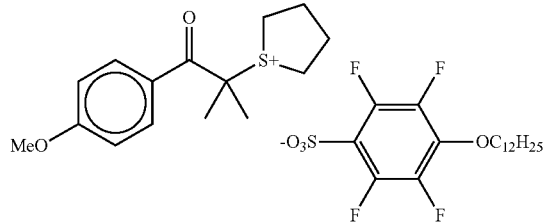
Bc-16
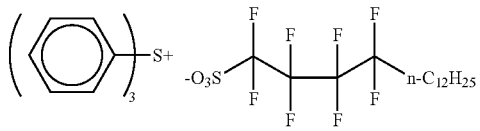
BaBc-1
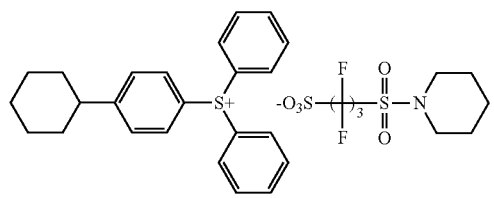
BaBc-2
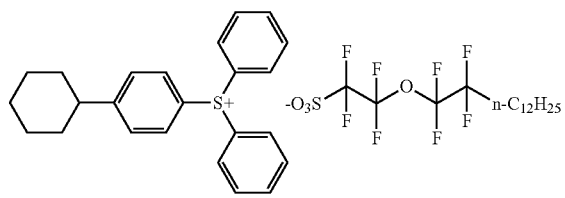
BaBc-3
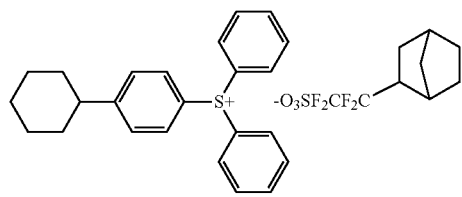
BaBc-4
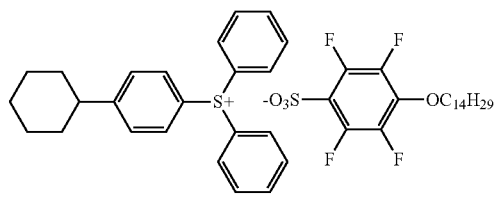
BaBc-5
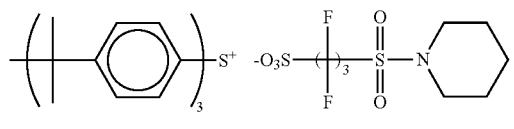
BaBc-6
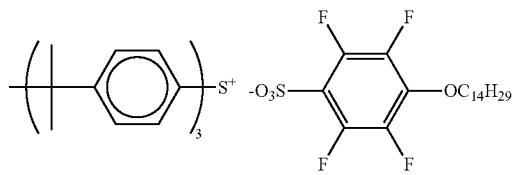
BaBc-7
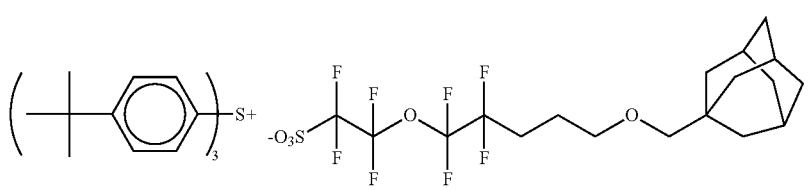
Babc-8
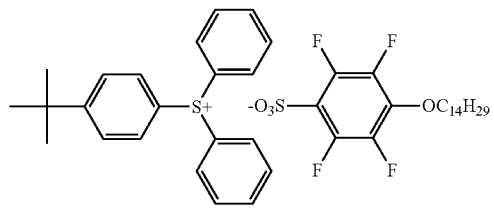
BaBc-9
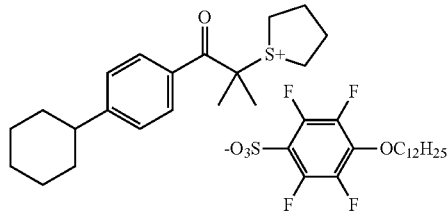
BaBc-10
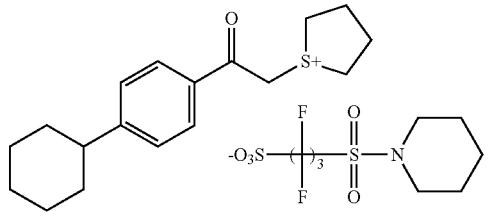

-continued
BaBc-11
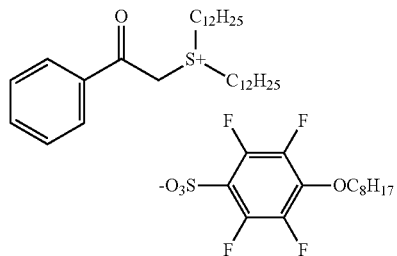
BaBc-12
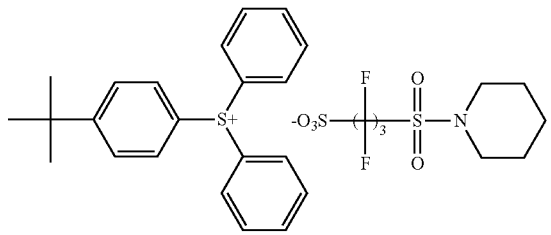
BaBc-13
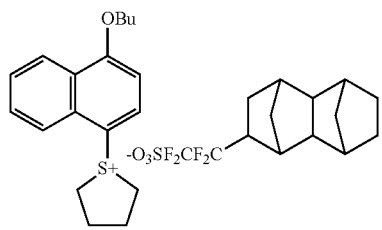
BbBc-1
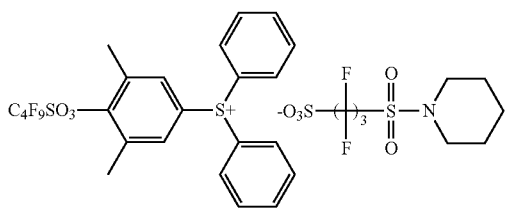
BbBc-2
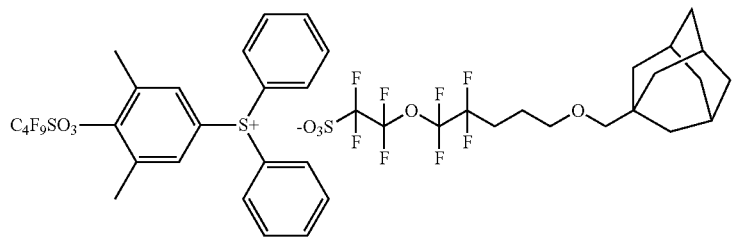
BbBc-3
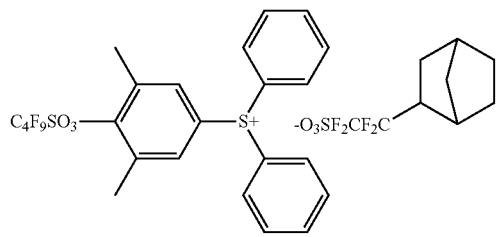
BbBc-4
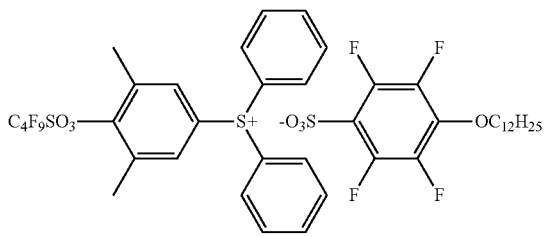
BbBc-5
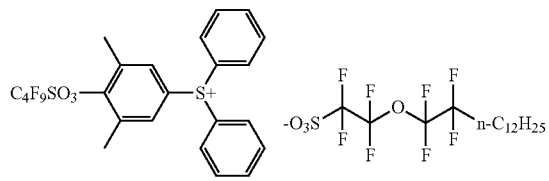
BbBc-6
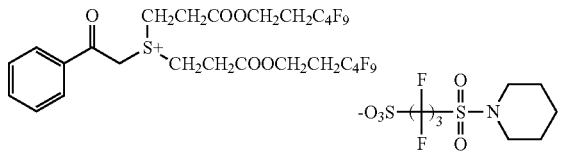
BbBc-7
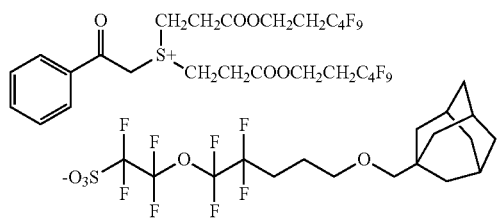
BbBc-8
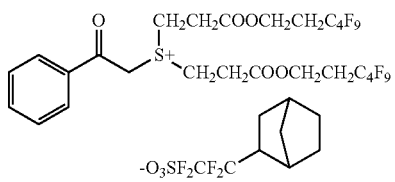

BbBc-9 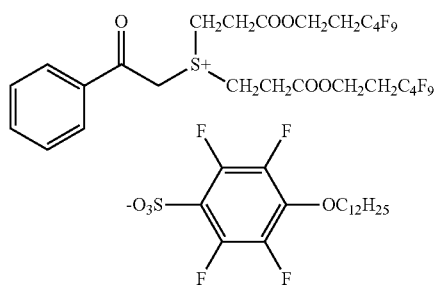 BbBc-10 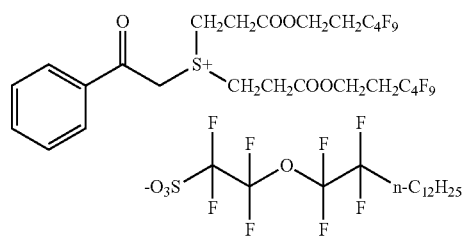
BbBc-11 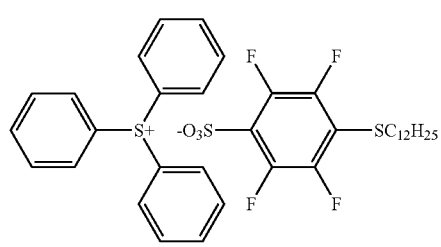 BbBc-12 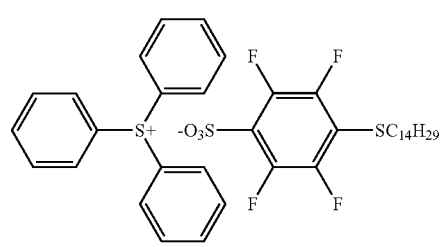
(PAG4-1) 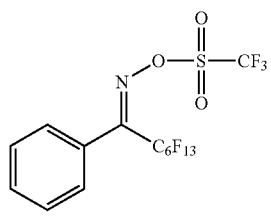 (PAG4-2) 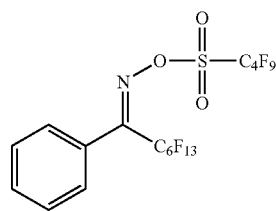
(PAG4-3) 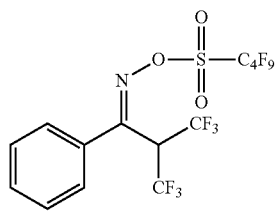 (PAG4-4) 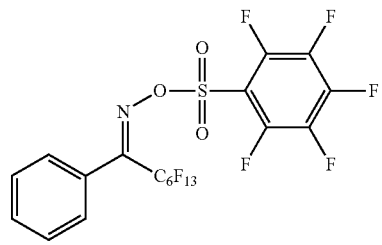
(PAG4-5) 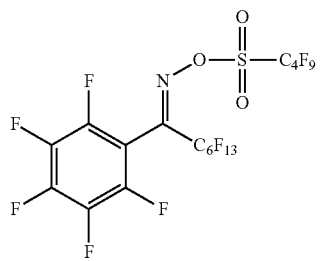 (PAG4-6) 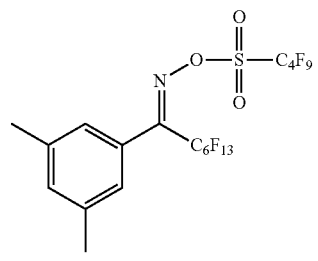
(PAG4-7) 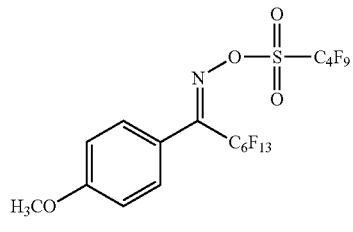 (PAG4-8) 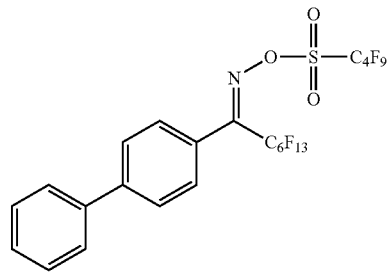

-continued
(PAG4-9)
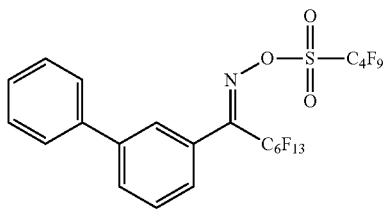
(PAG4-10)
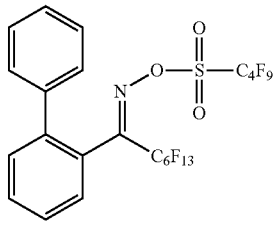
(PAG4-11)
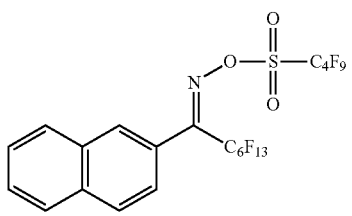
(PAG4-12)
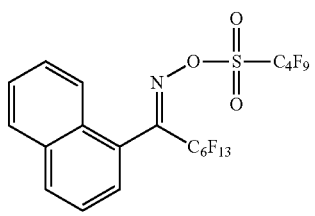
(PAG4-13)
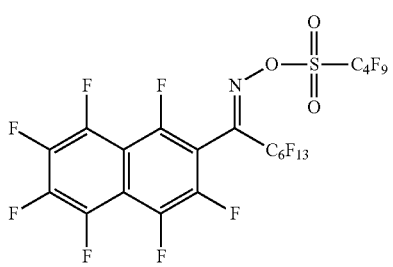
(PAG4-14)
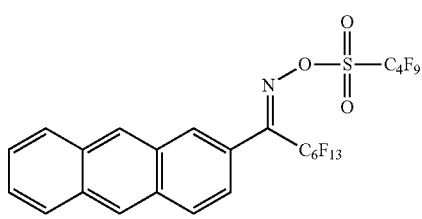
(PAG4-15)
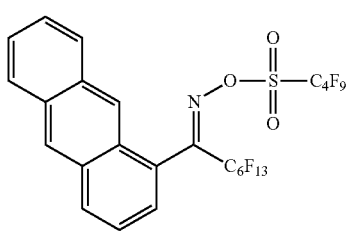
(PAG4-16)
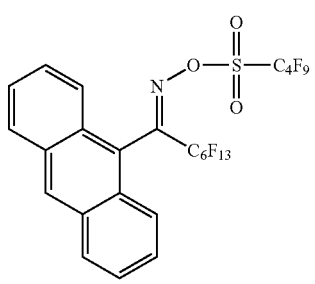
(PAG4-17)
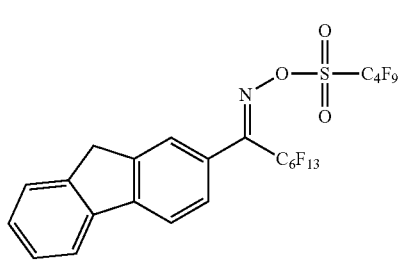
(PAG4-18)
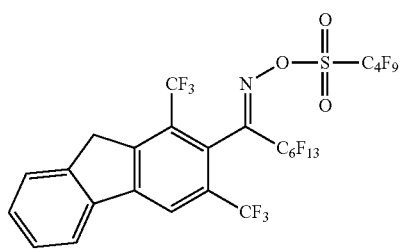
(PAG4-19)
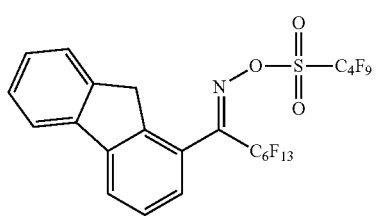
(PAG4-20)
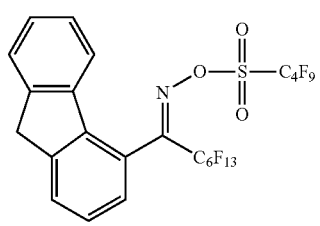

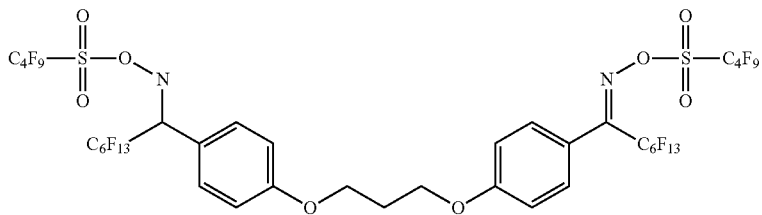
(PAG4-21)

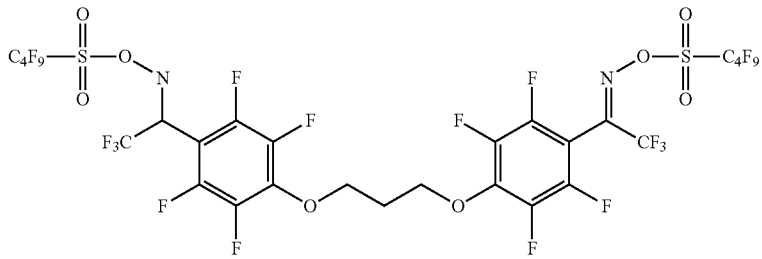
(PAG4-22)

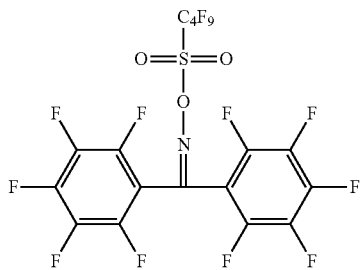
(PAG4-23)

An acid generator can be used alone, or two or more in combination.

The content of an acid generator in a resist composition for immersion exposure is preferably from 0.1 to 20 mass % based on the entire solids content of the resist composition, more preferably from 0.5 to 10 mass %, and still more preferably from 1 to 7 mass %.

(C) Compound having a Molecular Weight of 3,000 or Less which is Capable of Decomposing by the Action of an Acid to Increase the Solubility in an Alkali Developer (also Referred to as "Dissolution Inhibiting Compound"):

It is preferred for the resist composition for immersion exposure in the invention to contain a compound having a molecular weight of 3,000 or less which is capable of decomposing by the action of an acid to increase the solubility in an alkali developer (also referred to as "dissolution inhibiting compound").

As the dissolution inhibitor, not to reduce transmission to 220 nm or less, alicyclic or aliphatic compounds containing an acid-decomposable group, such as the cholic acid derivative containing an acid-decomposable group as described in *Proceeding of SPIE*, 2724, 355 (1996) are preferred. As the acid-decomposable groups and alicyclic structures, the same as those described in the resins in component (A) can be exemplified.

The molecular weight of the dissolution inhibitor in the invention is 3,000 or less, preferably from 300 to 3,000, and more preferably from 500 to 2,500.

The addition amount of the dissolution inhibitor is preferably from 1 to 30 mass % based on the entire solids content of the resist composition for immersion exposure, more preferably from 2 to 20 mass %.

The specific examples of dissolution inhibitors are shown below, but the invention is not limited thereto.

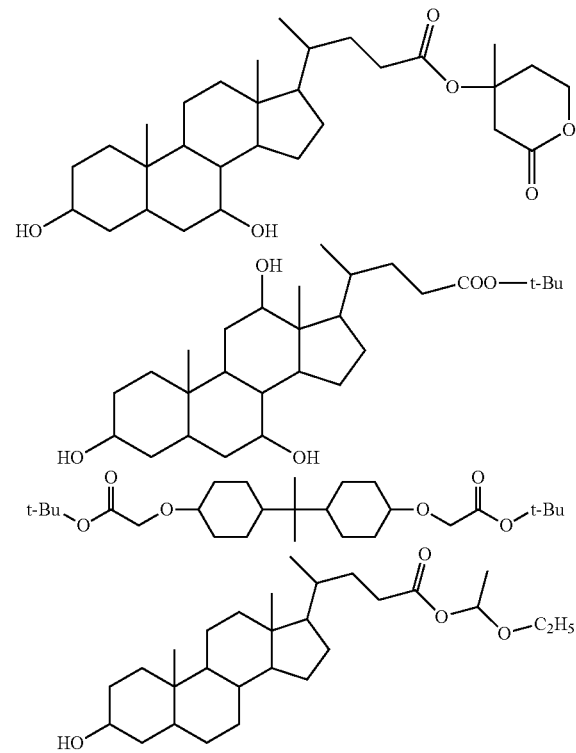

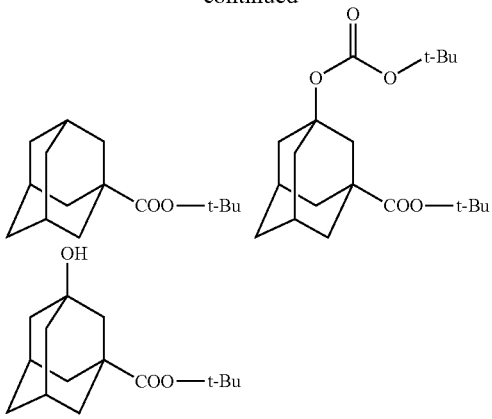

(D) Basic Compound:

It is preferred that the resist composition for immersion exposure in the invention further contains a basic compound. As the basic compounds, e.g., nitrogen-containing basic compounds, basic ammonium salts, basic sulfonium salts and basic iodonium salts are used. The basic compounds will do so long as they do not reduce sublimation and resist performances.

The basic compound is a component to control the diffusion of the acid generated from an acid generator by exposure in the resist film and having a function of suppressing undesired chemical reaction in the non-exposed area. By blending such a basic compound, the diffusion of the acid generated from an acid generator by exposure in the resist film can be controlled, the storage stability of a resist composition for immersion exposure to be obtained can be improved, the resolution of the resist is further improved, the line width change due to the fluctuation of post exposure time delay (PED) from exposure to development process can be prevented, so that a composition extremely excellent in process stability can be obtained.

As the nitrogen-containing basic compounds, e.g., primary, secondary and tertiary aliphatic amines, aromatic amines, heterocyclic amines, nitrogen-containing compounds having a carboxyl group, nitrogen-containing compounds having a sulfonyl group, nitrogen-containing compounds having a hydroxyl group, nitrogen-containing compounds having a hydroxyphenyl group, alcoholic nitrogen-containing compounds, amide derivatives, imide derivatives, and nitrogen-containing compounds having a cyano group can be exemplified.

As the aliphatic amines, e.g., methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, tetraethylenepentamine, dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, N,N-dimethyltetraethylenepentamine, trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, N,N,N',N'-tetramethyltetraethylenepentamine, dimethylethylamine, methylethylpropyl-amine, benzylamine, phenethylamine and benzyldimethylamine can be exemplified.

As the aromatic amines and the heterocyclic amines, e.g., aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline and N,N-dimethyltoluidine), diphenyl(p-tolyl) amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole and N-methylpyrrole), oxazole derivatives (e.g., oxazole and isooxazole), thiazole derivatives (e.g., thiazole and isothiazole), imidazole derivatives (e.g., imidazole, 4-methylimidazole and 4-methyl-2-phenylimidazole), pyrazole derivatives, furazane derivatives, pyrroline derivatives (e.g., pyrroline, and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline, and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives and uridine derivatives can be exemplified.

As the nitrogen-containing compounds having a carboxyl group, e.g., aminobenzoic acid, indolecarboxylic acid, amino acid derivatives (e.g., nicotinic acid, alanine, arginine, aspartic acid, glutamic acid, glycine, histidine, isoleucine, glycylleucine, leucine, methionine, phenylalanine, threonine, lysine, 3-aminopyrazine-2-carboxylic acid and methoxyalanine) can be exemplified.

As the nitrogen-containing compounds having a sulfonyl group, e.g., 3-pyridinesulfonic acid and pyridinium p-toluenesulfonate can be exemplified.

As the nitrogen-containing compounds having a hydroxyl group, e.g., 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidineethanol, 1-(2-hydroxyethyl)pyrrolidone, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidinethanol, 1-acridinethanol, N-(2-hydroxyethyl)phthalimide, and N-(2-hydroxyethyl)-isonicotinamide can be exemplified.

As the amide derivatives, e.g., formamide, N-methylformamide, N,N-dimethylformamide, acetamide, N-methylacetamide, N,N-dimethylacetamide, propionamide and benzamide can be exemplified.

As the imide derivatives, e.g., phthalimide, succinimide and maleimide can be exemplified.

As the nitrogen-containing compounds having a cyano group, e.g., 3-(diethylamino)propiononitrile, N,N-bis(2-hydroxyethyl)-3-aminopropionitrile, N,N-bis(2-acetoxyethyl)-3-aminopropionitrile, N,N-bis(2-formyloxyethyl)-3-aminopropionitrile, N,N-bis(2-methoxyethyl)-3-aminopropionitrile, N,N-bis[2-(methoxymethoxy)ethyl]-3-amino-propiononitrile, methyl N-(2-cyanoethyl)-N-(2-methoxy-ethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyano-ethyl)-N-(2-methoxyethyl)-3-aminopropiononitrile, N-(2-cyanoethyl)-N-[2-(methoxymethoxy)ethyl]-3-aminopropiono-nitrile, N-(2-cyanoethyl)-N-(3-hydroxy-1-propyl)-3-aminopropiononitrile, N-(3-acetoxy-1-propyl)-N-(2-cyanoethyl)-3-aminopropiononitrile, N-(2-cyanoethyl)-N-(3-formyloxy-1-propyl)-3-aminopropiononitrile, N-(2-cyanoethyl)-N-tetrahydrofurfuryl-3-aminopropiononitrile, N,N-bis(2-cyanoethyl)-3-aminopropiononitrile, diethylamino-acetonitrile, N,N-bis(2-hydroxyethyl)aminoacetonitrile, N,N-bis(2-acetoxyethyl)aminoacetonitrile, N,N-bis(2-foimyloxyethyl)aminoacetonitrile, N,N-bis)-2-methoxyethyl)-aminoacetonitrile, N,N-bis[2-(methoxymethoxy)ethyl]-aminoacetonitrile, methyl N-cyanomethyl-N-(2-methoxyethyl)-3-aminopropionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)-aminoacetonitrile, N-(2-acetoxyethyl)-N-(cyanomethyl)-aminoacetonitrile, N-cyanomethyl-N-(2-formyloxyethyl)-aminoacetonitrile, N-cyanomethyl-N-(2-methoxyethyl)-aminoacetonitrile, N-cyanomethyl-N-[2-(methoxymethoxy)-ethyl]aminoacetonitrile, N-(cyanomethyl)-N-(3-hydroxy-1-propyl)aminoacetonitrile, N-(3-acetoxy-1-propyl)-N-(cyanomethyl)aminoacetonitrile, N-cyanomethyl-N-(3-formyl-oxy-1-propyl)aminoacetonitrile, N,N-bis(cyanomethyl)amino-acetonitrile, 1-pyrrolidinepropiononitrile, 1-piperidine-propiononitrile, 4-morpholinepropiononitrile, 1-pyrrolidineacetonitrile, 1-piperidineacetonitrile, 4-morpholineacetonitrile, cyanomethyl 3-diethylamino-propionate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis(2-methoxyethyl)-3-aminopropionate, cyanomethyl N,N-bis[2-(methoxymethoxy)-ethyl]-3-aminopropionate, (2-cyanoethyl)-3-diethylamino-propionate, (2-cyanoethyl)-N,N-bis(2-hydroxyethyl)-3-aminopropionate, (2-cyanoethyl)-N,N-bis)-2-acetoxyethyl)-3-aminopropionate, (2-cyanoethyl)-N,N-bis(2-formyloxy-ethyl)-3-aminopropionate, (2-cyanoethyl)-N,N-bis(2-methoxyethyl)-3-aminopropionate, (2-cyanoethyl)-N,N-bis[2-(methoxymethoxy)ethyl]-3-aminopropionate, cyanomethyl 1-pyrrolidinepropionate, cyanomethyl 1-piperidinepropionate, cyanomethyl 4-morpholinepropionate, (2-cyanoethyl)-1-pyrrolidinepropionate, (2-cyanoethyl)-1-piperidine-propionate, and (2-cyanoethyl)-4-morpholinepropionate can be exemplified.

As preferred nitrogen-containing basic compounds, e.g., 1,5-diazabicyclo[4.3.0]-5-nonene, 1,8-diazabicyclo[5.4.0]-7-undecene, 1,4-diazabicyclo[2.2.2]octane, 4-dimethylamino-pyridine, 1-naphthylamine, piperidines, hexamethylene-tetramine, imidazoles, hydroxypyridines, pyridines, anilines, hydroxyalkylanilines, 4,4'-diaminodiphenyl ether, pyridinium p-toluenesulfonate, 2,4,6-trimethylpyridinium p-toluene-sulfonate, tetramethylammonium p-toluene-sulfonate, tetrabutylammonium lactate, tri(cyclo)alkylamines, e.g., triethylamine, tributylamine, tripentylamine, tri-n-octylamine, tri-i-octylamine, tris(ethylhexyl)amine, tridecylamine, tridodecylamine, tri-n-propylamine, tri-n-butylamine, tri-n-pentylamine, tri-n-hexylamine, tri-n-heptylamine, tri-n-octylamine, tri-n-nonylamine, tri-n-decylamine, cyclohexyldimethylamine, methyldicyclohexylamine, ethylenediamine, N,N,N',N'-tetramethylethylene-diamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2-bis(4-aminophenyl)propane, 2-(3-aminophenyl)-2-(4-aminophenyl)propane, 2-(4-aminophenyl)-2-(3-hydroxyphenyl)-propane, 2-(4-aminophenyl)-2-(4-hydroxyphenyl)propane, 1,4-bis[1-(4-aminophenyl)-1-methylethyl]benzene, 1,3-bis[1-(4-aminophenyl)-1-methylethyl]benzene, bis(2-dimethylaminoethyl) ether, bis(2-diethylaminoethyl)ether, N,N,N',N'-tetrakis(2-hydroxy-propyl)ethylenediamine, and tricyclohexylamine; aromatic amines, e.g., aniline, N-methylaniline, N,N-dimethylaniline, 2-methylaniline, 3-methylaniline, 4-methylaniline, 4-nitroaniline, diphenylamine, triphenylamine, naphthylamine, 2,6-diisopropylaniline, polyethyleneimine, polyallylamine, polymer of 2-dimethylaminoethylacrylamide N-t-butoxycarbonyldi-n-octylamine, N-t-butoxycarbonyldi-n-nonylamine, N-t-butoxycarbonyldi-n-decylamine, N-t-butoxycarbonyldicyclohexylamine, N-t-butoxycarbonyl-1-adamantylamine, N-t-butoxycarbonyl-N-methyl-1-adamantylamine, N,N-di-t-butoxycarbonyl-1-adamantylamine, N,N-di-t-butoxycarbonyl-N-methyl-1-adamantylamine, N-t-butoxycarbonyl-4,4'-diaminodiphenylmethane, N,N'-di-t-butoxycarbonylhexamethylenediamine, N,N,N',N'-tetra-t-butoxycarbonylhexamethylenediamine, N,N'-di-t-butoxycarbonyl-1,7-diaminoheptane, N,N'-di-t-butoxycarbonyl-1,8-diaminooctane, N,N'-di-t-butoxycarbonyl-1,9-diaminononane, N,N'-di-t-butoxycarbonyl-1,10-diaminodecane, N,N'-di-t-butoxycarbonyl-1,12-diaminododecane, N,N'-di-t-butoxycarbonyl-4,4'-diaminodiphenylmethane; imidazoles, e.g., N-t-butoxycarbonylbenzimidazole, N-t-butoxycarbonyl-2-methylbenzimidazole, N-t-butoxycarbonyl-2-phenyl-benzimidazole, formamide, N-methylformamide, N,N-dimethylformamide, acetamide, N-methylacetamide, N,N-dimethylacetamide, propionamide, benzamide, pyrrolidone, N-methylpyrrolidone, urea, methylurea, 1,1-dimethylurea, 1,3-dimethylurea, 1,1,3,3-tetramethylurea, 1,3-diphenylurea, tri-n-butylthiourea, imidazole, 4-methylimidazole, 4-methyl-2-phenylimidazole, benzimidazole, and 2-phenylbenzimidazole; pyridines, e.g., pyridine, 2-methylpyridine, 4-methylpyridine, 2-ethyl-pyridine, 4-ethylpyridine, 2-phenylpyridine, 4-phenyl-pyridine, 2-methyl-4-phenylpyridine, nicotine, nicotinic acid, nicotinic acid amine, quinoline, 4-hydroxyquinoline, 8-oxyquinoline, and acridine; piperazines, e.g., piperazine and 1-(2-hydroxyethyl)piperazine; pyrazine, pyrazole, pyridazine, quinozaline, pyrine, pyrrolidine, piperidine, 3-piperidino-1,2-propanediol, morpholine, 4-methylmorpholine and 1,4-dimethylpiperazine can be exemplified.

Of these compounds, nitrogen-containing basic compounds such as 1,5-diazabicyclo[4.3.0]-5-nonene, 1,8-diazabicyclo-[5.4.0]-7-undecene, 1,4-diazabicyclo-[2.2.2]octane, 4-dimethylaminopyridine, 1-naphthylamine, piperidine, 4-hydroxypiperidine, 2,2,6,6-tetramethyl-4-hydroxy-piperidine, hexamethylenetetramine, imidazoles, hydroxypyridines, pyridines, 4,4'-diaminodiphenyl ether, triethylamine, tributylamine, tripentylamine, tri-n-octylamine, tris(ethylhexyl)amine, tridodecylamine, N,N-dihydroxyethylaniline, N-hydroxyethyl-N-ethylaniline are particularly preferred.

The resist composition for immersion exposure can further contain basic ammonium salt as the basic compound. As the specific examples of basic ammonium salts, the compounds shown below can be exemplified, but the invention is not limited thereto.

Specifically, ammonium hydroxide, ammonium triflate, ammonium pentaflate, ammonium heptaflate, ammonium nonaflate, ammonium undecaflate, ammonium tridecaflate, ammonium pentadecaflate, ammonium methylcarboxylate, ammonium ethylcarboxylate, ammonium propylcarboxylate, ammonium butylcarboxylate, ammonium heptylcarboxylate, ammonium hexylcarboxylate, ammonium octylcarboxylate, ammonium nonylcarboxylate, ammonium decylcarboxylate, ammonium undecylcarboxylate, ammonium dodecadecylcarboxyl, ammonium tridecylcarboxylate, ammonium tetradecylcarboxylate, ammonium pentadecylcarboxylate, ammonium hexadecyl-carboxylate, ammonium heptadecylcarboxylate, and ammonium octadecylcarboxylate can be exemplified.

As the ammonium hydroxide, specifically tetramethyl-ammonium hydroxide, tetraethylammonium hydroxide, tetrapropylammonium hydroxide, tetrabutylammonium hydroxide, tetrapentylammonium hydroxide, tetrahexylammonium hydroxide, tetraheptylammonium hydroxide, methyltrioctylammonium hydroxide, tetraoctylammonium hydroxide, didecyldimethyl-ammonium hydroxide, tetrakisdecylammonium hydroxide, dodecyltrimethylammonium hydroxide, dodecylethyldimethyl-ammonium hydroxide, didodecyldimethylammonium hydroxide, tridodecylmethylammonium hydroxide, myristylmethylammonium hydroxide, dimethylditetradecylammonium hydroxide, hexadecyltrimethylammonium hydroxide, octadecyltrimethyl-ammonium hydroxide, dimethyldioctadecylammonium hydroxide, tetraoctadecylammonium hydroxide, diallyldimethylammonium hydroxide, (2-chloroethyl)trimethylammonium hydroxide, (2-bromoethyl)trimethylammonium hydroxide, (3-bromopropyl)-trimethylammonium hydroxide, (3-bromopropyl)triethyl-ammonium hydroxide, glycidyltrimethylammonium hydroxide, choline hydroxide, (R)-(+)-(3-chloro-2-hydroxypropyl)-trimethylammonium hydroxide, (S)-(−)-(3-chloro-2-hydroxy-propyl)trimethylammonium hydroxide, (3-chloro-2-hydroxy-propyl)trimethylammonium hydroxide, (2-aminoethyl)-trimethylammonium hydroxide, hexamethonium hydroxide, decamethonium hydroxide, 1-azoniaproperan hydroxide, petronium hydroxide, 2-chloro-1,3-dimethyl-2-imidazolinium hydroxide, and 3-ethyl-2-methyl-2-thiazolinium hydroxide can be exemplified.

The basic compound can be used alone or two or more can be used in combination, and it is preferred to use two or more.

The use amount of the basic compound is generally from 0.001 to 10 mass % as total amount based on the solids content of the resist composition for immersion exposure, preferably from 0.01 to 5 mass %.

(E) Surfactant:

It is preferred for the resist composition for immersion exposure in the invention to further contain (E) surfactant, and more preferred to contain either one or two or more of fluorine and/or silicon surfactants (a fluorine surfactant, a silicon surfactant, a surfactant containing both a fluorine atom and a silicon atom).

By containing (E) surfactant, it becomes possible for the resist composition for immersion exposure in the invention to provide a resist pattern excellent in sensitivity and resolution, and low in defects in adhesion and development in using an exposure light source of 250 nm or lower, in particular, 220 nm or lower.

These fluorine and/or silicon surfactants are disclosed, e.g., in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, U.S. Pat. Nos. 5,405,720, 5,360,692, 5,529,881, 5,296,330, 5,436,098, 5,576,143, 5,294,511 and 5,824,451. The following commercially available surfactants can also be used as they are.

As the fluorine or silicon surfactants usable in the invention, Eftop EF301 and EF303 (manufactured by Shin-Akita Kasei Co., Ltd.), Fluorad FC 430 and 431 (manufactured by Sumitomo 3M Limited), Megafac F171, F173, F176, F189 and R08 (manufactured by Dainippon Ink and Chemicals Inc.), Sarfron S-382, SC101, 102, 103, 104, 105 and 106 (manufactured by ASAHI GLASS CO., LTD.), and Troy Sol S-366 (Troy Chemical Co., Ltd.) are exemplified. In addition, polysiloxane polymer KP-341 (manufactured by Shin-Etsu Chemical Co., Ltd.) can also be used as a silicon surfactant.

As surfactants, in addition to the above-shown well-known surfactants, surfactants using polymers having fluoro-aliphatic groups derived from fluoro-aliphatic compounds manufactured by a telomerization method (also called a telomer method) or an oligomerization method (also called an oligomer method) can be used. Fluoro-aliphatic compounds can be synthesized by the method disclosed in JP-A-2002-90991.

As polymers having fluoro-aliphatic groups, copolymers of monomers having fluoro-aliphatic groups and (poly(oxyalkylene)) acrylate and/or (poly(oxyalkylene)) methacrylate are preferred, and these copolymers may be irregularly distributed or may be block copolymerized. As the poly-(oxyalkylene) groups, a poly(oxyethylene) group, a poly-(oxypropylene) group and poly(oxybutylene) group are exemplified. Further, the polymers may be units having alkylene different in a chain length in the same chain length, such as a block combination of poly(oxyethylene and oxypropylene and oxyethylene), and a block combination of poly(oxyethylene and oxypropylene). In addition, copolymers of monomers having fluoro-aliphatic groups and poly-(oxyalkylene) acrylate (or methacrylate) may be not only bipolymers but also terpolymers or higher polymers obtained by copolymerization of monomers having different two or more kinds of fluoro-aliphatic groups or different two or more kinds of poly(oxyalkylene) acrylates (or methacrylates) at the same time.

For example, as commercially available surfactants, Megafac F 178, F470, F473, F475, F476 and F472 (manufactured by Dainippon Ink and Chemicals Inc.) can be exemplified. Further, copolymers of acrylate (or methacrylate) having a $C_6F_{13}$ group and (poly(oxyalkylene)) acrylate (or methacrylate), copolymers of acrylate (or methacrylate) having a $C_6F_{13}$ group, (poly(oxyethylene)) acrylate (or methacrylate), and (poly-(oxypropylene)) acrylate (or methacrylate), copolymers of acrylate (or methacrylate) having a $C_8F_{17}$ group and (poly-(oxyethylene)) acrylate (or methacrylate), copolymers of acrylate (or methacrylate) having a $C_8F_{17}$ group, (poly(oxy-ethylene)) acrylate (or methacrylate), and poly(oxypropylene) acrylate (or methacrylate) are exemplified.

In the invention, surfactants other than fluorine and/or silicon surfactants can also be used. Specifically, nonionic surfactants, such as polyoxyethylene alkyl ethers, e.g., polyoxyethylene lauryl ether, polyoxyethylene stearyl ether, polyoxyethylene cetyl ether, and polyoxyethylene oleyl ether, polyoxyethylene alkylallyl ether, e.g., polyoxyethylene octylphenol ether and polyoxyethylene nonylphenol ether, polyoxyethylene-polyoxypropylene block copolymers, sorbitan fatty acid esters, e.g., sorbitan monolaurate, sorbitan monopalmitate, sorbitan monostearate, sorbitan monooleate, sorbitan trioleate, and sorbitan tristearate, and polyoxyethylene sorbitan fatty acid esters, e.g., polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate can be exemplified.

In the present invention, the surfactant represented by the following formula (W) can be used.

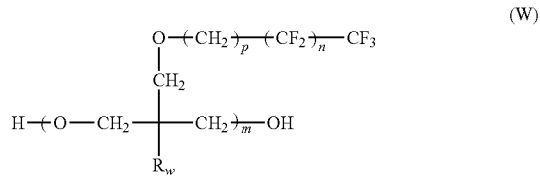

In formula (W), $R_W$ represents a hydrogen atom or an alkyl group; m represents an integer of 1 to 30; n represents an integer of 0 to 3; and p represents an integer of 0 to 5.

The alkyl group for $R_W$ is preferably a straight-chain or branched one with 1 to 5 carbon atoms, exemplified by methyl, ethyl, propyl, n-butyl, sec-butyl, t-butyl, etc. Among these, methyl group, ethyl group and propyl group are more preferred.

In formula (W), m is more preferably an integer of 1 to 25, n is an integer of 0 to 2, and p is an integer of 0 to 3.

Specific preferable examples of the surfactant represented by formula (W) include, for example, PF 636 (n=0, m=6, p=1, and $R_1$=methyl in formula (W)), PF 6320 (n=0, m=20, p=1, and $R_1$=methyl in formula (W)), PF 656 (n=1, m=6, p=1, and $R_1$=methyl in formula (W)), and PF 6520 (n=1, m=20, p=1, and $R_1$=methyl in formula (W)), all being commercial products available from OMNOVA Solutions Inc.

These surfactants may be used alone or some kinds may be used in combination.

The amount of (E) surfactants is preferably from 0.01 to 5 mass % to the total amount of the resist composition for immersion exposure (excluding solvents), more preferably from 0.1 to 3 mass %.

(F) Organic Solvent:

As the solvent for dissolving the above described each component to prepare a resist composition, e.g., alkylene glycol monoalkyl ether carboxylate, alkylene glycol monoalkyl ether, alkyl lactate, alkylalkoxypropionate, cyclic lactones having from 4 to 10 carbon atoms, monoketone compounds having from 4 to 10 carbon atoms which may contain a ring, alkylene carbonate, alkylalkoxy acetate, and alkyl pyruvate can be exemplified.

As the alkylene glycol monoalkyl ether carboxylate, e.g., propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate, ethylene glycol monoethyl ether acetate are preferably used.

As the alkylene glycol monoalkyl ether, e.g., propylene glycol monomethyl ether, propylene glycol monoethyl ether, propylene glycol monopropyl ether, propylene glycol monobutyl ether, ethylene glycol monomethyl ether, and ethylene glycol monoethyl ether are preferably used.

As the alkyl lactate, e.g., methyl lactate, ethyl lactate, propyl lactate, and butyl lactate can be preferably used.

As the alkylalkoxypropionate, e.g., ethyl 3-ethoxypropionate, methyl 3-methoxypropionate, methyl 3-ethoxypropionate, and ethyl 3-methoxypropionate are exemplified.

As the cyclic lactones having from 4 to 10 carbon atoms, e.g., β-propiolactone, β-butyrolactone, γ-butyrolactone, α-methyl-γ-butyrolactone, β-methyl-γ-butyrolactone, γ-valerolactone, γ-caprolactone, γ-octanoic lactone, α-hydroxy-γ-butyrolactone are preferably exemplified.

As the monoketone compounds having from 4 to 10 carbon atoms which may contain a ring, 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonane, 3-nonane, 5-nonane, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, and 3-methylcycloheptanone are preferably exemplified.

As the alkylene carbonate, e.g., propylene carbonate, vinylene carbonate, ethylene carbonate, and butylene carbonate are preferably exemplified.

As the alkylalkoxy acetate, e.g., 2-methoxyethyl acetate, 2-ethoxyethyl acetate, 2-(2-ethoxyethoxy)ethyl acetate, 3-methoxy-3-methylbutyl acetate and 1-methoxy-2-propyl acetate are preferably exemplified.

As the alkyl pyruvate, e.g., methyl pyruvate, ethyl pyruvate, and propyl pyruvate are preferably exemplified.

Solvents having a boiling point of 130° C. or more under room temperature and normal pressure are preferably used, specifically cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, 2-ethoxyethyl acetate, 2-(2-ethoxyethoxy)ethyl acetate, and propylene carbonate are exemplified.

In the invention solvents may be used alone or two or more may be used in combination.

In the invention, a mixed solvent comprising a solvent containing a hydroxyl group in the structure and a solvent not containing a hydroxyl group in the structure may be used as organic solvent.

As the solvent containing a hydroxyl group, ethylene glycol, ethylene glycol monomethyl ether, ethylene glycol monoethyl ether, propylene glycol, propylene glycol monomethyl ether, propylene glycol monoethyl ether, and ethyl lactate can be exemplified. Of these solvents, propylene glycol monomethyl ether and ethyl lactate are particularly preferred.

As the solvent not containing a hydroxyl group, e.g., propylene glycol monomethyl ether acetate, ethylethoxy propionate, 2-heptanone, γ-butyrolactone, cyclohexanone, butyl acetate, N-methylpyrrolidone, N,N-dimethylacetamide, and dimethyl sulfoxide can be exemplified. Of these solvents, propylene glycol monomethyl ether acetate, ethylethoxy propionate, 2-heptanone, γ-butyrolactone, cyclohexanone, and butyl acetate are particularly preferred, and propylene glycol monomethyl ether acetate, ethylethoxy propionate and 2-heptanone are most preferred.

The mixing ratio (by weight) of the solvent containing a hydroxyl group and the solvent not containing a hydroxyl group is from 1/99 to 99/1, preferably from 10/90 to 90/10, and more preferably from 20/80 to 60/40. A mixed solvent comprising 50 wt % or more of a solvent not containing a hydroxyl group is particularly preferred in the point of coating uniformity.

(G) Alkali-Soluble Resin:

The positive resist composition of the invention can further contain (G) water-insoluble and alkali-soluble and not containing an acid-decomposable group, by which sensitivity is improved.

Novolak resins having a molecular weight of from 1,000 to 20,000 or so, and polyhydroxystyrene derivatives having a molecular weight of from 3,000 to 50,000 or so can be used as such resins. Since these resins are great in absorption of rays of 250 nm or less, it is preferred to use them by partially hydrogenating or the amount of 30 wt % or less of the entire resin amount.

A resin containing a carboxyl group as alkali-soluble group can also be used. For the purpose of improving dry etching resistance, it is preferred for the resins containing a carboxyl group to have a monocyclic or polycyclic alicyclic hydrocarbon group. Specifically, copolymers of methacrylic ester having an alicyclic hydrocarbon structure not showing acid-decomposing property and (meth)acrylic acid, or resins of (meth)acrylic ester of alicyclic hydrocarbon group having carboxyl groups at terminals are exemplified.

(H) Carboxylic Acid Onium Salt:

As (H) carboxylic acid onium salt for use in the invention, carobxylic acid sulfonium salt, carobxylic acid iodonium salt, and carobxylic acid ammonium salt can be exemplified. As (H) carboxylic acid onium salt, iodonium salt and sulfonium salt are preferred. It is preferred that the carboxylate residue of (H) carboxylic acid onium salt does not contain an aromatic group and a carbon-carbon double bond. A particularly preferred anion moiety is a straight chain or branched, monocyclic or polycyclic alkylcarboxylic acid anion having from 1 to 30 carbon atoms, and the anion of carboxylic acid in which a part or all of the alkyl groups are substituted with a fluorine atom are more preferred. An oxygen atom may be contained in the alkyl chain, by which the transparency to the lights of 220 nm or less is ensured, sensitivity and resolution are increased, and compression dependency and exposure margin are improved.

As anions of fluorine-substituted carboxylic acid, anions of fluoroacetic acid, difluoroacetic acid, trifluoroacetic acid, pentafluoropropionic acid, heptafluorobutyric acid, nonafluoropentanoic acid, perfluorododecanoic acid, perfluorotridecanoic acid, perfluorocyclohexanecarboxylic acid, and 2,2-bistrifluoro-methylpropionic acid are exemplified.

These (H) carboxylic acid onium salts can be synthesized by reacting sulfonium hydroxide, iodonium hydroxide, or ammonium hydroxide and carboxylic acid with silver oxide in an appropriate solvent.

The content of (H) carboxylic acid onium salt in the resist composition is from 0.1 to 20 wt % to all the solids content of the composition, preferably from 0.5 to 10 wt %, more preferably from 1 to 7 wt %.

Other Additives:

If necessary, dyes, plasticizers, photosensitizers, and compounds for accelerating dissolution in a developing solution (e.g., phenolic compounds having a molecular weight of 1,000 or less, alicyclic or aliphatic compounds having a carboxyl group) may be further added to the photosensitive composition in the present invention.

Such phenolic compounds having a molecular weight of 1,000 or less can be easily synthesized with referring to the methods disclosed, e.g., in JP-A-4-122938, JP-A-2-28531, U.S. Pat. No. 4,916,210, and EP 219294.

As the specific examples of the alicyclic or aliphatic compounds having carboxyl groups, carboxylic acid derivatives having a steroid structure, e.g., cholic acid, deoxycholic acid, and lithocholic acid, adamantanecarboxylic acid derivatives, adamantanedicarboxylic acid, cyclohexanecarboxylic acid, and cyclohexanedicarboxylic acid are exemplified, but the invention is not limited to these compounds.

Use Method:

The resist composition for immersion exposure in the invention is used by dissolving each of the above components in a prescribed organic solvent, preferably dissolving in a mixed solvent as described above, and coating the solution on a prescribed support as follows.

That is, the resist composition for immersion exposure is coated on a substrate such as the one used in the production of precision integrated circuit elements (e.g., silicon/silicon dioxide coating) by an appropriate coating method with a spinner or a coater in an arbitrary thickness (generally from 50 to 500 nm). After drying, the resist film is washed with an immersion liquid, if necessary. The washing time is generally from 5 seconds to 5 minutes.

Subsequently, the coated resist is dried by spin or bake, after forming a resist film, the resist film is subjected to exposure (immersion exposure) for pattern formation through a mask via an immersion liquid. For example, in immersion exposure, the resist film is exposed through a mask with an immersion liquid between the resist film and the optical lens. The exposure dose can be optionally set, but generally from 1 to 100 mJ/cm$^2$. After exposure, if necessary, the resist film is washed with the immersion liquid. The washing time is generally from 5 seconds to 5 minutes. Thereafter, the resist film is preferably subjected to spin or/and bake, development and drying, whereby a good pattern can be obtained. The temperature of bake is generally from 30 to 300° C. From the viewpoint of the above-described PED, the time from exposure to bake process is preferably shorter.

As the exposure rays, far ultraviolet rays having the wavelength of preferably 250 nm or less, more preferably 220 nm or less are preferred. Specifically, a KrF excimer laser (248 nm), an ArF excimer laser (193 nm), an F$_2$ excimer laser (157 nm), and X-rays are exemplified.

The variation of performances of a resist at the time of the immersion exposure is thought to be resulting from the contact of the resist surface with an immersion liquid.

An immersion liquid for use in immersion exposure is described.

An immersion liquid for use in immersion exposure preferably has a temperature coefficient of refractive index as small as possible so as to be transparent to the exposure wavelength and to hold the distortion of optical image reflected on the resist to the minimum. In particular, when the exposure light source is an ArF excimer laser (wavelength: 193 nm), it is preferred to use water for easiness of availability and easy handling property, in addition to the above points.

When water is used as an immersion liquid, to reduce the surface tension of water and to increase the surface activity, a trace amount of additive (a liquid) that does not dissolve the resist layer on a wafer and has a negligible influence on the optical coating of the lower surface of a lens may be added. As such an additive, aliphatic alcohols having a refractive index almost equal to the refractive index of water is preferred, specifically methyl alcohol, ethyl alcohol and isopropyl alcohol are exemplified. By adding an alcohol having a refractive index almost equal to that of water, even if the alcohol component in water is evaporated and the concentration of the content is changed, the refractive index of the liquid as a whole can be made extremely small. On the other hand, when impurities opaque to the light of 193 nm or a substance largely different from water in a refractive index are mixed, these substances bring about the distortion of the optical image reflected on the resist. Accordingly water is preferably distilled water. Further, pure water filtered through an ion exchange filter may be used.

An immersion liquid-hardly-soluble film (hereinafter also referred to as "topcoat") may be provided between a resist film by the resist film for immersion exposure of the invention and an immersion liquid so as not to bring a resist film into direct contact with an immersion liquid. The necessary functions required of the topcoat are the aptitude for coating on the upper layer of the resist, the transparency to radiation, particularly the transparency to the light of 193 nm, and the immersion liquid-insolubility. It is preferred that the topcoat is not mixed with the resist and can be coated uniformly on the resist upper layer.

From the viewpoint of the transparency to 193 nm, polymers not containing aromatic compounds are preferred as the topcoat. Specifically, hydrocarbon polymers, acrylic ester polymers, polymethacrylic acid, polyacrylic acid, polyvinyl ether, silicon-containing polymers and fluorine-containing polymers are exemplified.

When the topcoat is peeled, a developing solution may be used, or a remover may be used separately. As the remover, solvents low in penetration into a resist are preferred. In view of capable of performing peeling process at the same time with the development process of the resist, peeling by an alkali developer is preferred. From the viewpoint of performing peeling by an alkali developer, the topcoat is preferably acidic, but from the viewpoint of non-intermixture with the resist, it may be neutral or alkaline.

Resolution increases when there is no difference in the refractive indexes between the topcoat and the immersion liquid. In the case where the exposure light source is an ArF excimer laser (wavelength: 193 nm), water is preferred as the immersion liquid, so that the refractive index of the topcoat for ArF immersion exposure is preferably near the refractive index of water (1.44). Further, from the viewpoint of the transparency and refractive index, a thin film is preferred.

In a development process, a developing solution is used as follows. As the developing solution of the resist composition for immersion exposure, alkaline aqueous solutions of inorganic alkalis, e.g., sodium hydroxide, potassium hydroxide, sodium carbonate, sodium silicate, sodium metasilicate and aqueous ammonia, primary amines, e.g., ethylamine and n-propylamine, secondary amines, e.g., diethylamine and di-n-butylamine, tertiary amines, e.g., triethylamine and methyldiethylamine, alcohol amines, e.g., dimethylethanolamine and triethanolamine, quaternary ammonium salts, e.g., tetramethylammonium hydroxide and tetraethylammonium hydroxide, and cyclic amines, e.g., pyrrole and piperidine, can be used.

An appropriate amount of alcohols and surfactants may be added to these alkali developers.

Pure water can be used as the rinsing liquid and an appropriate amount of surfactants may be added.

The alkali concentration of alkali developers is generally from 0.1 to 20 mass %.

The pH of alkali developers is generally from 10.0 to 15.0.

After development process or rinsing process, a process to remove the developing solution or rinsing liquid on the resist pattern can be performed by supercritical fluid.

EXAMPLE

The present invention is described in detail with reference to examples but the invention is not limited thereto.
1. Synthesis of Fluorine-Containing Resin (1)

Mevalonic lactone acrylate, {6-(3,3,3-trifluoro-2-hydroxy-2-trifluoromethylpropyl)bicyclo[2.2.1]hepto-2-yl}methacrylate, and 2-ethyl-2-adamantyl methacrylate in proportion of 40/20/40 were prepared and dissolved in tetrahydrofuran, whereby 100 ml of a solution having solid concentration of 20% was prepared. As a polymerization initiator, 2 mol % of V-65 (manufactured by Wako Pure Chemical Industries Ltd.) and 4 mol % of mercaptoethanol were added to the above solution, and the mixed solution was dripped to 10 ml of tetrahydrofuran heated at 60° C. for 2 hours in a nitrogen atmosphere. After completion of dripping, the reaction solution was stirred with heating for 6 hours. After termination of the reaction, the temperature of the reaction solution was lowered to room temperature, and the reaction product was crystallized in 3 liters of methanol, and the precipitated white powder was recovered. The polymer composition ratio found by $^{13}$C-NMR was 46/54. The weight average molecular weight calculated in terms of standard polystyrene by GPC measurement was 9,800, and the degree of dispersion was 2.53. Fluorine-containing resins (2) to (20) and comparative resin (C1) were synthesized in the same manner.

The structures and weight average molecular weights of fluorine-containing resins (1) to (20) and comparative resin (C1) are listed below.

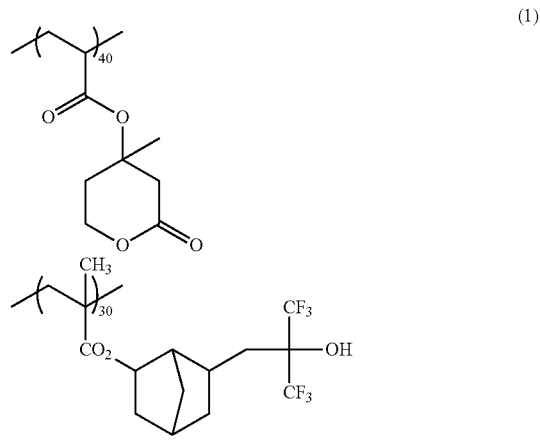

(1)

125
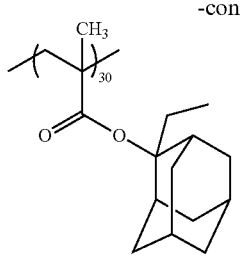
Mw = 9800
Mw/Mn = 2.53
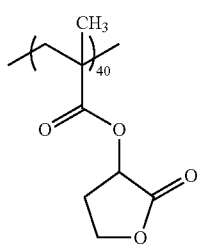
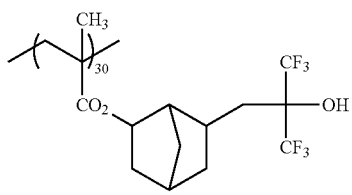
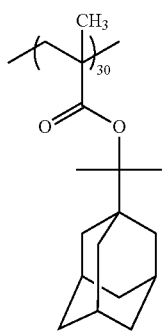
Mw = 8700
Mw/Mn = 1.99
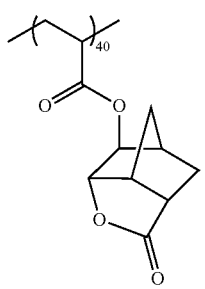
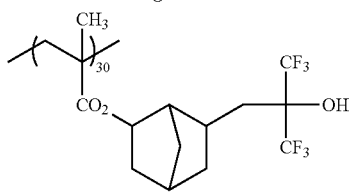
126
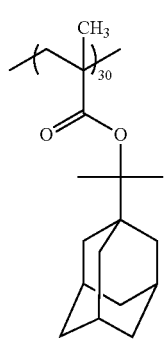
Mw = 9200
Mw/Mn = 2.04
(2)
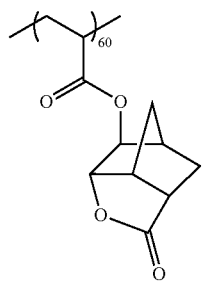
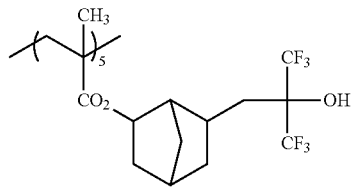
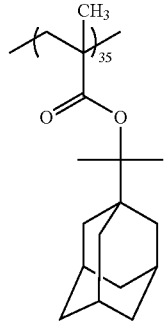
Mw = 10800
Mw/Mn = 2.32
(3)
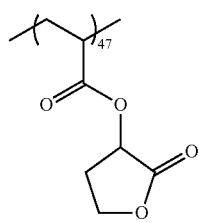 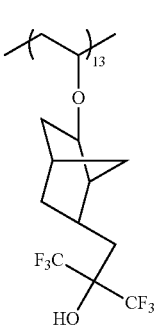
(4)
(5)

127
-continued
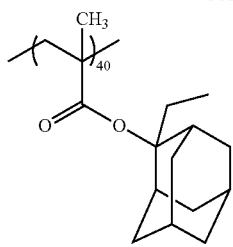
Mw = 8500
Mw/Mn = 2.41
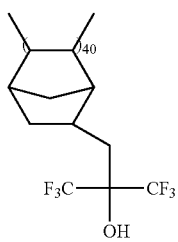
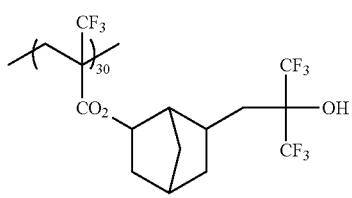
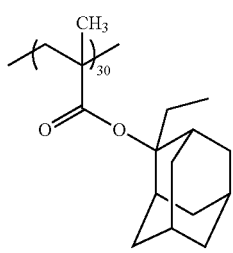
Mw = 11300
Mw/Mn = 3.11
(7)
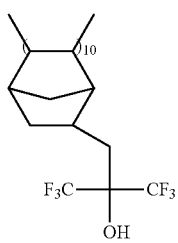 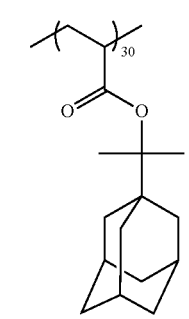
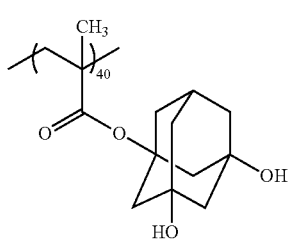
128
-continued
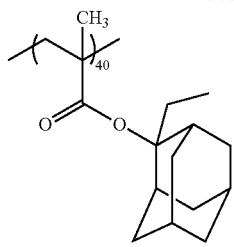
Mw = 7700
Mw/Mn = 2.79
(6)
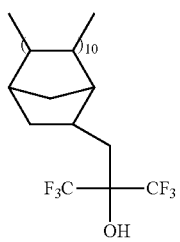
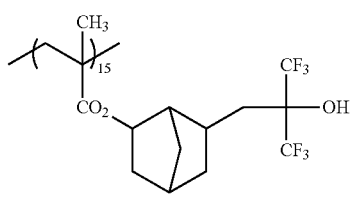
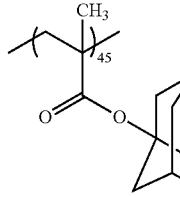
(8)
Mw = 10200
Mw/Mn = 2.14
(9)
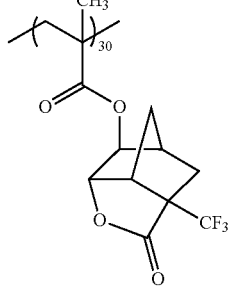

-continued
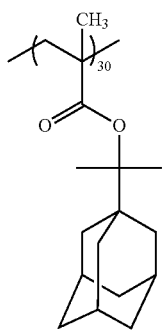
Mw = 9000
Mw/Mn = 1.93
(10)
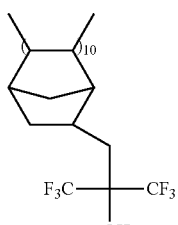
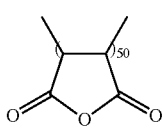
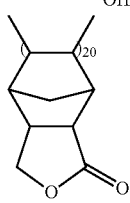
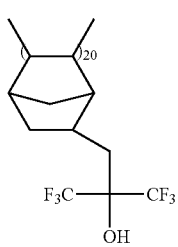
Mw = 6900
Mw/Mn = 2.52
(11)
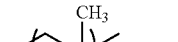
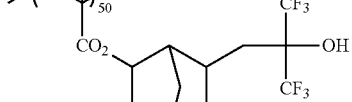
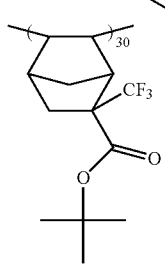
Mw = 10100
Mw/Mn = 1.98
-continued
(12)
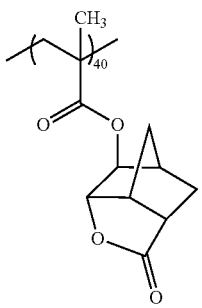
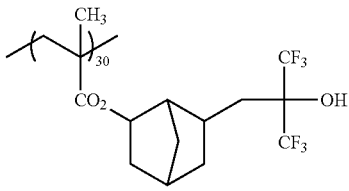
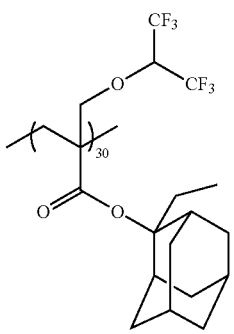
Mw = 8800
Mw/Mn = 2.58
(13)
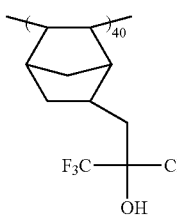
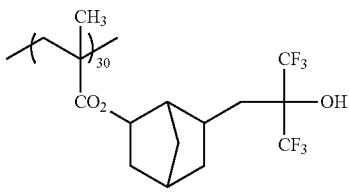
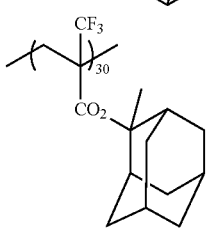
Mw = 11100
Mw/Mn = 2.45

(14)
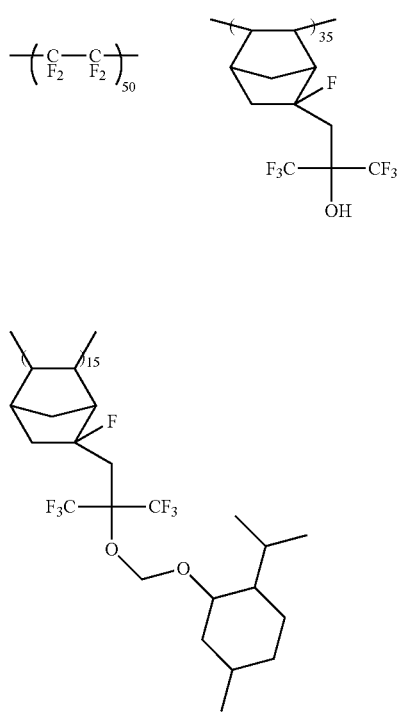
Mw = 6700
Mw/Mn = 2.12
(15)
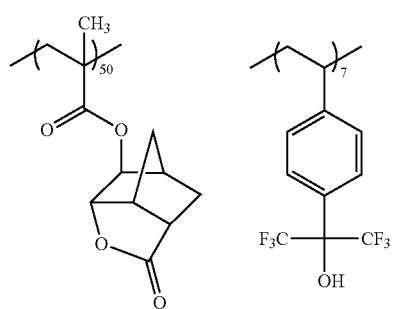
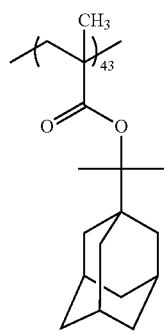
Mw = 10100
Mw/Mn = 2.31
(16)
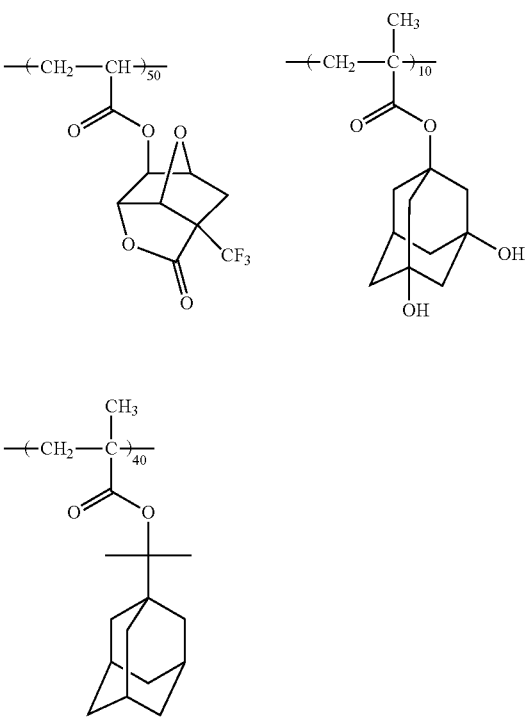
Mw = 15000
Mw/Mn = 1.88
(17)
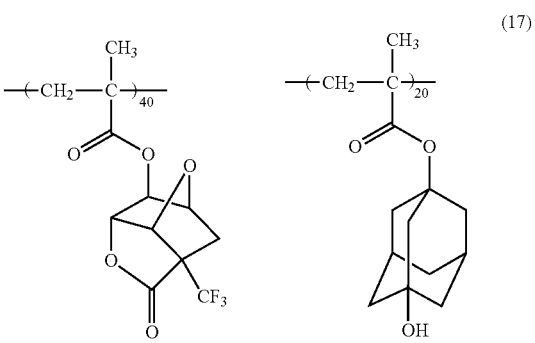
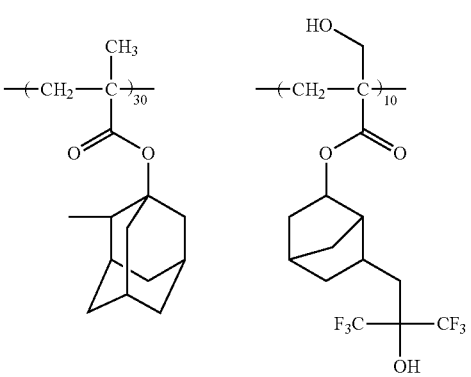
Mw = 10100
Mw/Mn = 2.05

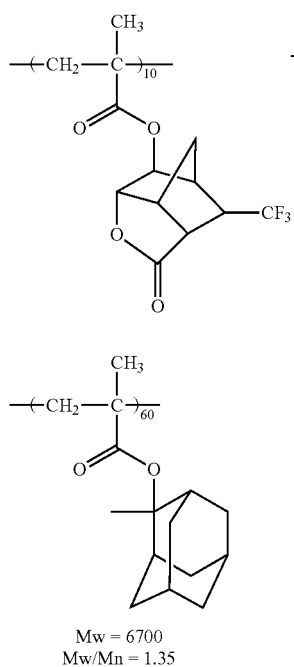
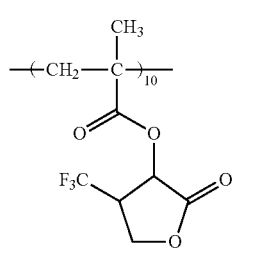
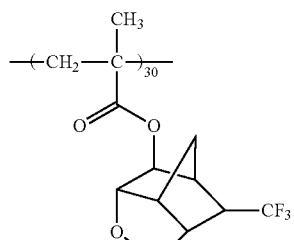
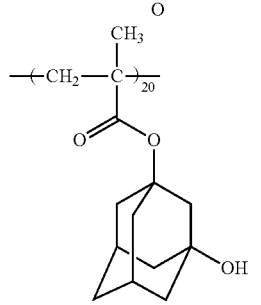
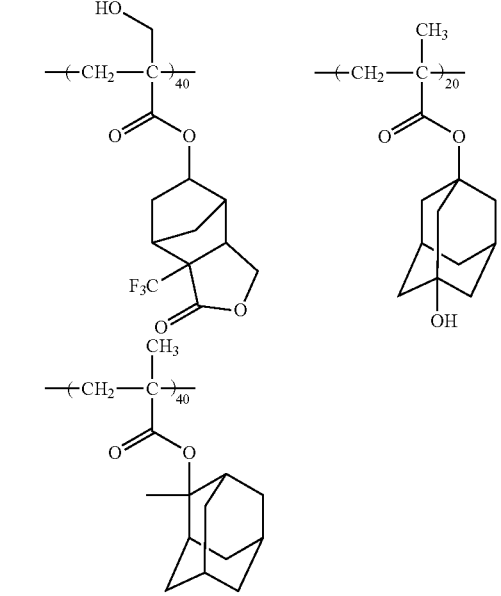
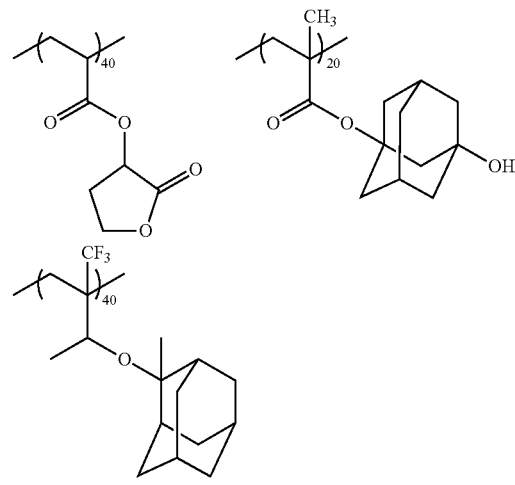

2. Preparation of Resist Compositions 1 to 41 and Comparative Resist

Preparation of Resist:

The components of each sample shown in Table 1 below were dissolved in a solvent and a solution of solid concentration of 6 mass % was prepared, and the obtained solution was filtered through a polyethylene filter having a pore diameter of 0.1 μm to obtain a positive resist solution.

3. Evaluation

Evaluation of Amount of Elution of Generated Acid:

The resist composition thus prepared was coated on an 8-inch silicon wafer. The coated wafer was baked at 115° C. for 60 seconds to give a 150 nm thick resist film. After the whole area of this resist film was subjected to exposure by means of an exposure device emitting 193 nm wavelength light with an exposure amount of 50 mJ/cm², 5 ml of pure water which had been subjected to deionizing treatment using an ultra pure water system (Milli-QJr., a product of Nippon Millipore Corp.) was dropped on the resist film. After left on the resist film for 50 seconds, the water was collected to quantitatively measure the elution concentration of the acid by using LC-MS.

LC apparatus: 2695, a product of Waters Corp.

MS apparatus: Esquire 3000 plus, a product of Bruker Daltonics, Inc.

By using the LC-MS apparatuses cited above, the MS detection intensity of the ionic species having the mass of 299 (corresponding to nonaflate anion), the amount of elution of nonafluorobutanesulfonic acid was calculated. In a similar manner, by measuring the MS detection intensity of the ionic species having the mass of 413 (corresponding to 4-dodecyloxy-2,3,5,6-tetrafluorobenzenesulfonate anion), the amount of elution of 4-dodecyloxy-2,3,5,6-tetrafluorobenzenesulfonic acid was calculated.

Evaluation of Sensitivity Fluctuation:

A reflection-preventing film (ARC25, manufactured by Brewer Science) was uniformly coated on a silicone substrate in a thickness of 600 Å with a spin coater and dried at 190° C. for 240 seconds.

In the next place, each positive resist solution was coated with a spin coater, and the wafer was dried by heating at 115° C. for 60 seconds to form a resist film having a thickness of 0.25 μm. The resist film was exposed with a laser of 193 nm, and the sensitivity by exposure of 193 nm of the resist film was evaluated with a laser exposure-dissolution behavior analyzer VUVES-4500 (manufactured by Litho Tech Japan Co., Ltd.) (dry sensitivity). In the next place, after forming a resist film on a silicone substrate in the same manner, the sensitivity by exposure of 193 nm was evaluated with an immersion exposure-dissolution behavior analyzer MODEL IMES-5500 (manufactured by Litho Tech Japan Co., Ltd.) (wet sensitivity).

The sensitivity used here is as follows: The exposed wafer is dried by heating at 120° C. for 60 seconds, developed with a 2.38 mass % tetramethylammonium hydroxide aqueous solution at 23° C. for 30 seconds, rinsed with pure water for 30 seconds and dried. The film thickness is measured after drying, and the minimum exposure amount required for the thickness to reach zero is taken as sensitivity.

The sensitivity fluctuation was obtained by the following equation and the value was taken as the criterion of the compatibility of dry exposure/wet exposure.

Sensitivity fluctuation(%)=(wet sensitivity−dry sensitivity)/dry sensitivity×100

The resist compositions used in the evaluation and the results of the evaluation are shown in Table 1 below.

TABLE 1

| | Resin (2 g) | Photo-Acid Generator | Solvent (mass Ratio) | Basic Compound | Surfactant (5 mg) | Dissolution Inhibitor (g) | Amount of Elution A | Amount of Elution B | Rate of Change of Sensitivity (%) |
|---|---|---|---|---|---|---|---|---|---|
| Ex. 1 | 1 | Z-1 (60) | SL-4/SL-6 (60/40) | N-3 (4 mg) | W-1 | — | 2 | — | 5 |
| Ex. 2 | 2 | Z-1 (60) | SL-4/SL-6 (60/40) | N-3 (4 mg) | W-1 | — | 2 | — | 4 |
| Ex. 3 | 3 | Z-1 (60) | SL-4/SL-6 (60/40) | N-3 (4 mg) | W-1 | — | 2 | — | 5 |
| Ex. 4 | 4 | Z-1 (60) | SL-4/SL-6 (60/40) | N-3 (4 mg) | W-1 | — | 12 | — | 18 |
| Ex. 5 | 5 | Z-1 (60) | SL-4/SL-6 (60/40) | N-3 (4 mg) | W-1 | — | 8 | — | 13 |
| Ex. 6 | 6 | Z-1 (60) | SL-4/SL-6 (60/40) | N-3 (4 mg) | W-1 | — | 10 | — | 15 |
| Ex. 7 | 7 | Z-1 (60) | SL-4/SL-6 (60/40) | N-3 (4 mg) | W-1 | — | 6 | — | 9 |
| Ex. 8 | 8 | Z-1 (60) | SL-4/SL-6 (60/40) | N-3 (4 mg) | W-1 | — | 4 | — | 6 |
| Ex. 9 | 9 | Z-1 (60) | SL-4/SL-6 (60/40) | N-3 (4 mg) | W-1 | — | 11 | — | 17 |
| Ex. 10 | 10 | Z-1 (60) | SL-4/SL-6 (60/40) | N-3 (4 mg) | W-1 | — | 8 | — | 13 |
| Ex. 11 | 11 | Z-1 (60) | SL-4/SL-6 (60/40) | N-3 (4 mg) | W-1 | — | 11 | — | 16 |
| Ex. 12 | 12 | Z-1 (60) | SL-4/SL-6 (60/40) | N-3 (4 mg) | W-1 | — | 10 | — | 14 |
| Ex. 13 | 13 | Z-1 (60) | SL-4/SL-6 (60/40) | N-3 (4 mg) | W-1 | — | 11 | — | 15 |
| Ex. 14 | 14 | Z-1 (60) | SL-4/SL-6 (60/40) | N-3 (4 mg) | W-1 | — | 12 | — | 18 |
| Ex. 15 | 15 | Z-1 (60) | SL-4/SL-6 (60/40) | N-3 (4 mg) | W-1 | — | 13 | — | 17 |
| Ex. 16 | 1 | Z-2 (70) | SL-2/SL-4 (40/60) | N-2 (4 mg) | W-3 | — | 2 | — | 5 |
| Ex. 17 | 1 | Z-2 (30) Z-3 (45) | SL-2/SL-4/SL-9 (40/59/1) | N-1 (4 mg) N-3 (2 mg) | W-4 | — | 2 | 1 | 4 |
| Ex. 18 | 1 | Z-1 (30) Z-4 (105) | SL-1/SL-4 (50/50) | N-1 (4 mg) | W-1 | — | 1 | — | 5 |
| Ex. 19 | 1 | Z-2 (35) Z-4 (120) | SL-2/SL-4 (50/50) | N-3 (2 mg) N-6 (2 mg) | W-1 | I-1 (0.20) | 2 | — | 4 |
| Ex. 20 | 1 | Z-2 (25) Z-3 (35) Z-4 (40) | SL-4/SL-5/SL-9 (59/40/1) | N-4 (4 mg) | W-1 | — | 2 | — | 5 |
| Ex. 21 | 1 | Z-1 (100) | SL-3/SL-4 (40/60) | N-5 (4 mg) | W-2 | I-2 (0.25) | 2 | — | 2 |
| Ex. 22 | 5 | Z-2 (70) | SL-2/SL-4 (40/60) | N-2 (4 mg) | W-3 | — | 8 | — | 13 |
| Ex. 23 | 5 | Z-2 (30) Z-3 (45) | SL-2/SL-4/SL-9 (40/59/1) | N-1 (2 mg) N-3 (2 mg) | W-4 | — | 7 | 2 | 11 |
| Ex. 24 | 5 | Z-1 (30) Z-4 (105) | SL-1/SL-4 (50/50) | N-1 (4 mg) | W-1 | — | 8 | — | 11 |
| Ex. 25 | 5 | Z-2 (35) Z-4 (120) | SL-2/SL-4 (50/50) | N-3 (2 mg) N-6 (2 mg) | W-1 | I-1 (0.20) | 7 | — | 13 |
| Ex. 26 | 5 | Z-2 (25) Z-3 (35) Z-4 (40) | SL-4/SL-5/SL-9 (59/40/1) | N-4 (4 mg) | W-1 | — | 7 | 1 | 12 |
| Ex. 27 | 5 | Z-1 (100) | SL-3/SL-4 (40/60) | N-5 (4 mg) | W-2 | I-2 (0.25) | 9 | — | 11 |
| Ex. 28 | 8 | Z-2 (70) | SL-2/SL-4 (40/60) | N-2 (4 mg) | W-3 | — | 4 | — | 6 |
| Ex. 29 | 8 | Z-2 (30) Z-3 (45) | SL-2/SL-4/SL-9 (40/59/1) | N-1 (4 mg) N-3 (4 mg) | W-4 | — | 3 | 1 | 5 |
| Ex. 30 | 8 | Z-1 (30) Z-4 (105) | SL-1/SL-4 (50/50) | N-1 (4 mg) | W-1 | — | 4 | — | 6 |

TABLE 1-continued

| | Resin (2 g) | Photo-Acid Generator | Solvent (mass Ratio) | Basic Compound | Surfactant (5 mg) | Dissolution Inhibitor (g) | Amount of Elution A | Amount of Elution B | Rate of Change of Sensitivity (%) |
|---|---|---|---|---|---|---|---|---|---|
| Ex. 31 | 8 | Z-2 (35) Z-4 (120) | SL-2/SL-4 (50/50) | N-3 (2 mg) N-6 (2 mg) | W-1 | I-1 (0.20) | 4 | — | 7 |
| Ex. 32 | 8 | Z-2 (25) Z-3 (35) Z-4 (40) | SL-4/SL-5/SL-9 (59/40/1) | N-4 (4 mg) | W-1 | — | 4 | 1 | 6 |
| Ex. 33 | 8 | Z-1 (100) | SL-3/SL-4 (40/60) | N-5 (4 mg) | W-2 | I-2 (0.25) | 4 | — | 7 |
| Ex. 34 | 16 | Z-1 (60) | SL-4/SL-6 (60/40) | N-3 (4 mg) | W-1 | — | 3 | — | 6 |
| Ex. 35 | 17 | Z-1 (60) | SL-4/SL-6 (60/40) | N-3 (4 mg) | W-1 | — | 2 | — | 5 |
| Ex. 36 | 18 | Z-1 (60) | SL-4/SL-6 (60/40) | N-3 (4 mg) | W-1 | — | 2 | — | 7 |
| Ex. 37 | 19 | Z-1 (60) | SL-4/SL-6 (60/40) | N-3 (4 mg) | W-1 | — | 2 | — | 8 |
| Ex. 38 | 20 | Z-1 (60) | SL-4/SL-6 (60/40) | N-3 (4 mg) | W-1 | — | 3 | — | 5 |
| Ex. 39 | 16 | Z-1 (30) Z-5 (20) | SL-4/SL-6/SL-9 (59/40/1) | N-5 (4 mg) | W-1 | — | 2 | 1 | 5 |
| Ex. 40 | 18 | Z-1 (25) Z-3 (35) | SL-4/SL-6 (60/40) | N-2 (4 mg) | None | — | 2 | — | 7 |
| Ex. 41 | 19 | Z-2 (70) | SL-4/SL-6 (60/40) | N-5 (2 mg) N-6 (2 mg) | W-1 | — | 2 | — | 6 |
| Ex. 42 | 1 | Z-1 (60) | SL-4/SL-6(60/40) | N-3 (4 mg) | W-5 | — | 4 | — | 6 |
| Ex. 43 | 1 | Z-3 (80) | SL-4/SL-6(60/40) | N-1 (4 mg) | W-5 | — | — | 1 | 5 |
| Ex. 44 | 5 | Z-1 (60) | SL-4/SL-6(60/40) | N-2 (3 mg) | W-5 | — | 3 | — | 5 |
| Ex. 45 | 5 | Z-3 (80) | SL-4/SL-6(60/40) | N-4 (5 mg) | W-5 | — | — | 1 | 6 |
| Ex. 46 | 8 | Z-1 (60) | SL-2/SL-4 (40/60) | N-3 (4 mg) | W-5 | I-1 (0.20) | 3 | — | 8 |
| Ex. 47 | 8 | Z-3 (80) | SL-2/SL-4 (40/60) | N-1 (4 mg) | W-5 | — | — | 1 | 7 |
| Ex. 48 | 16 | Z-1 (60) | SL-4/SL-6 (60/40) | N-3 (4 mg) | W-5 | — | 3 | — | 6 |
| Ex. 49 | 16 | Z-3 (80) | SL-4/SL-6 (60/40) | N-1 (4 mg) | W-5 | — | — | 0 | 5 |
| Comp. Ex. | C1 | Z-1 (60) | SL-4/SL-6 (60/40) | N-3 (4 mg) | W-1 | — | 81 | — | 100 |

Amount of elution A: The eluted amount of nonafluorobutanesulfonic acid ($\times 10^{-13}$ mol/cm$^2$)
Amount of elution B: The eluted amount of 4-dodecyloxy-2,3,5,6-tetrafluorobenzenesulfonic acid ($\times 10^{-13}$ mol/cm$^2$)
The abbreviations in Table 1 are as follows.

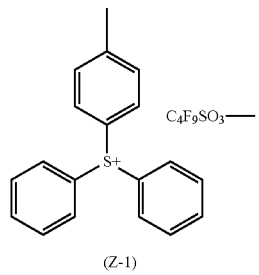

(Z-1)

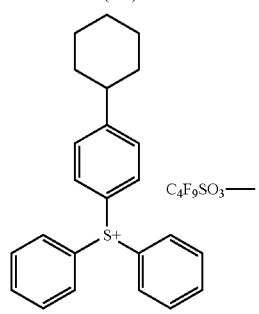

(Z-2)

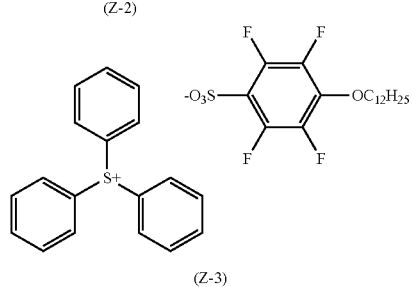

(Z-3)

TABLE 1-continued

| Resin (2 g) | Photo-Acid Generator | Solvent (mass Ratio) | Basic Compound | Surfactant (5 mg) | Dissolution Inhibitor (g) | Amount of Elution A | Amount of Elution B | Rate of Change of Sensitivity (%) |
|---|---|---|---|---|---|---|---|---|

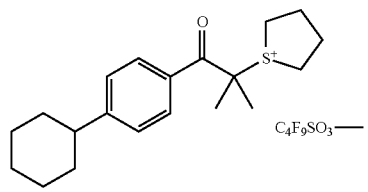

(Z-4)

N-1: N,N-Dibutylaniline
N-2: N,N-Dipropylaniline
N-3: N,N-Dihydroxyethylaniline
N-4: 2,4,5-Triphenylimidazole
N-5: 2,6-Diisopropylaniline
N-6: Hydroxyantipyrine
W-1: Megafac F176 (fluorine surfactant, manufactured by Dainippon Ink and Chemicals Inc.)
W-2: Megafac R08 (fluorine and silicon surfactant, manufactured by Dainippon Ink and Chemicals Inc.)
W-3: Polysiloxane polymer KP-341 (silicon surfactant, manufactured by Shin-Etsu Chemical Co., Ltd.)
W-4: Troy Sol S-366 (manufactured by Troy Chemical Co., Ltd.)
W-5: PF-6520 (OMNOVA Solutions Inc.)
SL-1: Cyclopentanone
SL-2: Cyclohexanone
SL-3: 2-Methylcyclohexanone
SL-4: Propylene glycol monomethyl ether acetate
SL-5: Ethyl lactate
SL-6: Propylene glycol monomethyl ether
SL-7: 2-Heptanone
SL-8: γ-Butyrolactone
SL-9: Propylene carbonate
I-1: t-Butyl lithocholate
I-2: t-Butyl adamantanecarboxylate When two or more resins or solvents were used, the ratio shown in Table 1 was mass ratio.

From the above results in Table 1, it can be seen that the resist compositions 1 to 49 in the invention are little in elution of acid into the immersion liquid, and sensitivity variation from dry exposure is small. That is, in the comparative example, elution of nonafluorobutanesulfonic acid to the immersion liquid is great, and sensitivity variation from dry exposure is high. As shown in Example 1, by using the resist composition according to the invention, elution of acid into immersion liquid at the time immersion exposure is little and sensitivity fluctuation is also small as compared with the comparative example.

The present invention can provide a resist suitable for immersion exposure little in the deterioration of sensitivity as compared with dry exposure and hardly accompanied with the elution of an acid to an immersion liquid.

The entire disclosure of each and every foreign patent application from which the benefit of foreign priority has been claimed in the present application is incorporated herein by reference, as if fully set forth.

What is claimed is:

1. A pattern-forming method comprising:
forming a resist film with a resist composition comprising:
(A) a resin containing at least one repeating unit having a fluorine atom and increasing a solubility of the resin in an alkali developer by an action of an acid; and
(B) a compound capable of generating an acid upon irradiation with one of an actinic ray and radiation,
wherein the repeating unit having a fluorine atom contained in resin (A) is at least one repeating unit of Formula (II):

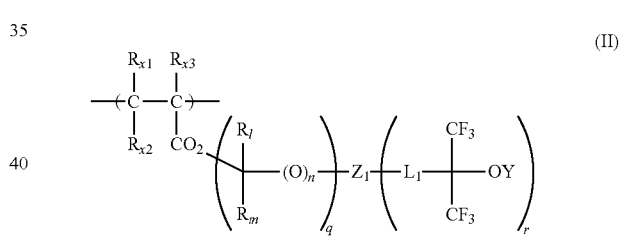

in formula (II), $R_{x1}$, $R_{x2}$ and $R_{x3}$ each independently represents a hydrogen atom, a fluorine atom, a chlorine atom, a cyano group, an alkyl group, or $-L_3-C(R_{f1})(R_{f2})$ Ra; $R_{f1}$ and $R_{f2}$ each independently represents a hydrogen atom, a fluorine atom or an alkyl group, provided that at least one of $R_{f1}$ and $R_{f2}$ represents a fluorine atom or a fluoroalkyl group; Ra represents a hydrogen atom or a hydroxyl group; $L_3$ represents a single bond, an alkylene group, $-CH_2-O-$, or $-CH_2-COO-$; $R_1$ and $R_m$ each independently represents a hydrogen atom or an alkyl group; $Z_1$ represents a monocyclic cycloalkylene group; $L_1$ represents a single bond or a divalent linking group; n and q each independently represents 0 or 1; r represents an integer of from 1 to 6; and Y represents a hydrogen atom or an acid-undecomposable organic group;
wherein the repeating unit having a fluorine atom contained in resin (A) further includes a repeating unit represented by formula (AI):

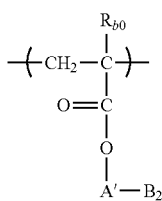
(AI)

wherein $R_{b0}$ represents a hydrogen atom or an unsubstituted alkyl group having from 1 to 4 carbon atoms: A' represents a single bond, an ether group, an ester group, a carbonyl group, an alkylene group, or a divalent linking group obtained by combining these groups; and $B_2$ represents a group represented by formulae (V-1) to (V-5):

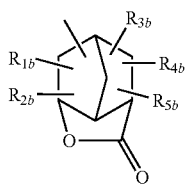
(V-1)

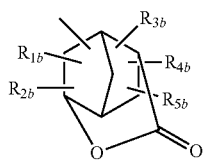
(V-2)

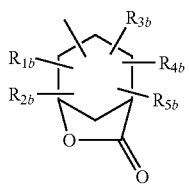
(V-3)

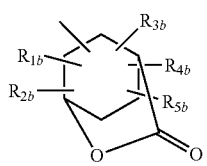
(V-4)

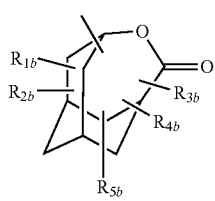
(V-5)

in formulae (V-1) to (V-5), $R_{1b}$, $R_{2b}$, $R_{3b}$, $R_{4b}$ and $R_{5b}$ each independently represents a hydrogen atom, an alkyl group, a cycloalkyl group, an alkoxyl group, an alkoxycarbonyl group, an alkylsulfonyl-imino group or an alkenyl group each of which may have a substituent; and two of $R_{1b}$ to $R_{5b}$ may be bonded to form a ring; and further wherein compound (B) is represented by the following formula (ZI):

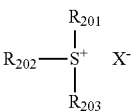
ZI wherein $R_{201}$, $R_{202}$ and $R_{203}$ each independently represents an organic group provided that at least one of $R_{201}$, $R_{202}$ and $R_{203}$ represents a phenyl group, and $X^-$ represents an aliphatic sulfonate anion in which the α-position of the sulfonic acid is substituted with a fluorine atom and which has an alicyclic group;

exposing the resist film by immersion exposure, so as to form an exposed resist film; and developing the exposed resist film.

2. The pattern-forming method as claimed in claim 1, wherein the fluorine atom number contained in the repeating unit having a fluorine atom is 6 or more per one repeating unit.

3. The pattern-forming method as claimed in claim 1, wherein the repeating unit having a fluorine atom is contained in the resin (A) in an amount of 10 mol % to 30 mol %.

4. The pattern-forming method as claimed in claim 1, wherein $L_1$ in the formula (II) represents an alkylene group.

5. The pattern-forming method as claimed in claim 1, wherein the resist composition further comprises alkylene glycol monoalkyl ether as a solvent.

6. The pattern-forming method as claimed in claim 1, wherein the resist composition further comprises alkyl lactate as a solvent.

7. The pattern-forming method as claimed in claim 1, wherein the resist composition further comprises cyclic lactone as a solvent.

8. The pattern-forming method as claimed in claim 1, wherein the resist composition further comprises a monoketone compound which may have a ring, as a solvent.

9. The pattern-forming method as claimed in claim 1, wherein the resist composition further comprises two or more solvents.

10. The pattern-forming method as claimed in claim 1, wherein the resist composition further comprises at least one of a fluorine surfactant and a silicon surfactant.

11. The pattern-forming method as claimed in claim 1, wherein the resist composition comprises at least two of the compound (B).

12. The pattern-forming method as claimed in claim 1, wherein the resist composition further comprises at least two basic compounds.

13. The pattern-forming method as claimed in claim 1, wherein the resin (A) further contains a repeating unit having a group represented by formula (VII):

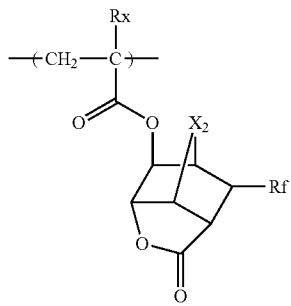
(VII)

wherein X₂ represents a methylene group, an oxygen atom or a sulfur atom; Rx represents a hydrogen atom, a fluorine atom, a chlorine atom, a cyano group, an alkyl group, or -L₃-CRa; L₃ represents an alkylene group, —CH₂O— or —CH₂O(C=O)—; Ra represents a hydroxyl group, a lactone group or a fluoroalkyl group; and Rf represents a group having at least one or more fluorine atoms.

14. The pattern-forming method as claimed in claim 1, wherein Z₁ in formula (II) is a cyclohexylene group.

15. The pattern-forming method as claimed in claim 1, wherein r in formula (II) is 2.

16. The pattern-forming method as claimed in claim 1, wherein q in formula (II) is 0.

17. The pattern-forming method as claimed in claim 1, wherein the resin (A) contains a repeating unit having a partial structure represented by formula (pVI):

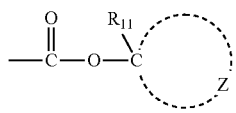

(pVI)

wherein R₁₁ represents a methyl group, an ethyl group, an n-propyl group, an isopropyl group, an n-butyl group, an isobutyl group, or a sec-butyl group, and Z represents an atomic group necessary to form an alicyclic hydrocarbon group together with carbon atoms.

18. The pattern-forming method as claimed in claim 17, wherein in formula (pVI), the alicyclic hydrocarbon group formed by Z and carbon is a monocyclic hydrocarbon group.

19. The pattern-forming method as claimed in claim 1, wherein the resin (A) contains a repeating unit having a group represented by formula (VII):

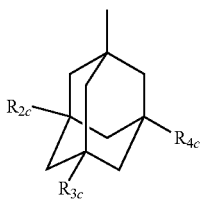

(VII)

wherein R₂c, R₃c and R₄c each independently represents a hydrogen atom or a hydroxyl group, provided that at least one of R₂c, R₃c and R₄c represents a hydroxyl group.

20. The pattern-forming method as claimed in claim 1, wherein the alicyclic group in the aliphatic sulfonate anion represented by X⁻ in formula (ZI) is a polycyclic alicyclic group.

21. The pattern-forming method as claimed in claim 1, wherein the alicyclic group in the aliphatic sulfonate anion represented by X⁻ in formula (ZI) is an adamantyl group.

22. The pattern-forming method as claimed in claim 1, wherein the β-position of the sulfonate anion represented by X⁻ in formula (ZI) is substituted by a fluorine atom.

23. The pattern-forming method as claimed in claim 1, wherein the resist composition is a resist composition for immersion exposure.

24. A resist film comprising:
(A) a resin containing at least one repeating unit having a fluorine atom and increasing the solubility of the resin in an alkali developer by an action of an acid; and
(B) a compound capable of generating an acid upon irradiation with one of an actinic ray and radiation,
wherein the repeating unit having a fluorine atom contained in resin (A) is at least one repeating unit of Formula (II):

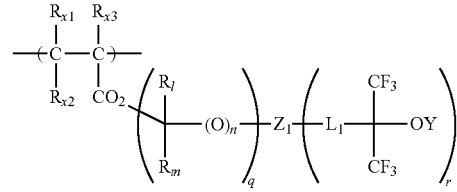

(II)

in formula (II), $R_{x1}$, $R_{x2}$ and $R_{x3}$ each independently represents a hydrogen atom, a fluorine atom, a chlorine atom, a cyano group, an alkyl group, or -L₃-C($R_{f1}$)($R_{f2}$) Ra; $R_{f1}$ and $R_{f2}$ each independently represents a hydrogen atom, a fluorine atom or an alkyl group, provided that at least one of $R_{f1}$ and $R_{f2}$ represents a fluorine atom or a fluoroalkyl group; Ra represents a hydrogen atom or a hydroxyl group; L₃ represents a single bond, an alkylene group, —CH₂—O—, or —CH₂—COO—; R₁ and R_m each independently represents a hydrogen atom or an alkyl group; Z₁ represents a monocyclic cycloalkylene group; L₁ represents a single bond or a divalent linking group; n and q each independently represents 0 or 1; r represents an integer of from 1 to 6; and Y represents a hydrogen atom or an acid-undecomposable organic group;

wherein the repeating unit having a fluorine atom contained in resin (A) further includes a repeating unit represented by formula (AI):

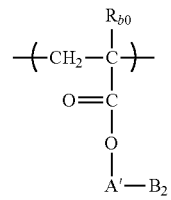

(AI)

wherein $R_{b0}$ represents a hydrogen atom or an unsubstituted alkyl group having from 1 to 4 carbon atoms; A' represents a single bond, an ether group, an ester group, a carbonyl group, an alkylene group, or a divalent linking group obtained by combining these groups; and B₂ represents a group represented by formulae (V-1) to (V-5):

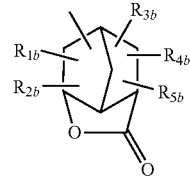

(V-1)

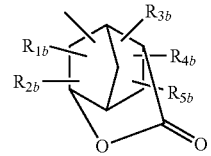

(V-2)

(V-3)

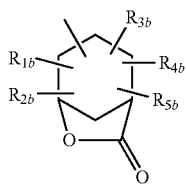

(V-4)

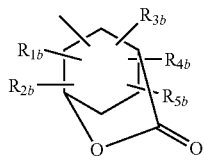

(V-5)

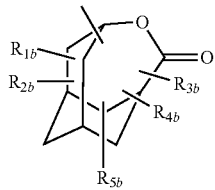

in formulae (V-1) to (V-5), $R_{1b}$, $R_{2b}$, $R_{3b}$, $R_{4b}$ and $R_{5b}$ each independently represents a hydrogen atom, an alkyl group, a cycloalkyl group, an alkoxyl group, an alkoxycarbonyl group, an alkylsulfonyl-imino group or an alkenyl group each of which may have a substituent; and two of $R_{1b}$ to $R_{5b}$ may be bonded to form a ring; and further wherein compound (B) is represented by the following formula (ZI):

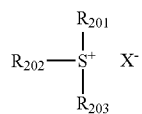

ZI wherein $R_{201}$, $R_{202}$ and $R_{203}$ each independently represents an organic group provided that at least one of $R_{201}$, $R_{202}$ and $R_{203}$ represents a phenyl group, and $X^-$ represents an aliphatic sulfonate anion in which the α-position of the sulfonic acid is substituted with a fluorine atom and which has an alicyclic group.

\* \* \* \* \*